United States Patent
Arai et al.

(10) Patent No.: US 9,778,567 B2
(45) Date of Patent: Oct. 3, 2017

(54) RESIST COMPOSITION, METHOD OF FORMING RESIST PATTERN, POLYMERIC COMPOUND, COMPOUND

(71) Applicant: Tokyo Ohka Kogyo Co., Ltd., Kawasaki-shi (JP)

(72) Inventors: Masatoshi Arai, Kawasaki (JP); Yoshiyuki Utsumi, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/540,239

(22) Filed: Nov. 13, 2014

(65) Prior Publication Data
US 2015/0140497 A1 May 21, 2015

(30) Foreign Application Priority Data
Nov. 15, 2013 (JP) .................................. 2013-236868

(51) Int. Cl.
| | | |
|---|---|---|
| G03F 7/004 | (2006.01) | |
| C08F 220/36 | (2006.01) | |
| C08F 220/38 | (2006.01) | |
| G03F 7/039 | (2006.01) | |
| C08F 220/28 | (2006.01) | |

(52) U.S. Cl.
CPC .......... G03F 7/0397 (2013.01); C08F 220/28 (2013.01); C08F 220/36 (2013.01); C08F 220/38 (2013.01); C08F 2220/387 (2013.01)

(58) Field of Classification Search
CPC ...................................................... G03F 7/004
See application file for complete search history.

(56) References Cited

U.S. PATENT DOCUMENTS

| | | | |
|---|---|---|---|
| 6,949,325 B2 | 9/2005 | Li et al. | |
| 2001/0049073 A1 | 12/2001 | Hada et al. | |
| 2004/0110085 A1 | 6/2004 | Iwai et al. | |
| 2006/0199100 A1 | 9/2006 | Kanda | |
| 2006/0263719 A1* | 11/2006 | Endo ..................... | G03F 7/0392 430/270.1 |
| 2009/0197204 A1 | 8/2009 | Shiono et al. | |
| 2009/0317743 A1 | 12/2009 | Shiono et al. | |
| 2010/0310985 A1 | 12/2010 | Mori et al. | |
| 2011/0117499 A1 | 5/2011 | Matsumiya et al. | |
| 2012/0009519 A1 | 1/2012 | Kim et al. | |

FOREIGN PATENT DOCUMENTS

| | | | |
|---|---|---|---|
| JP | A-2000-206694 | | 7/2000 |
| JP | A-2003-241385 | | 8/2003 |
| JP | 2005326609 A | * | 11/2005 |
| JP | A-2005-336452 | | 12/2005 |
| JP | A-2006-259582 | | 9/2006 |
| JP | A-2006-276851 | | 10/2006 |
| JP | A-2006-317803 | | 11/2006 |
| JP | A-2007-093910 | | 4/2007 |
| JP | A-2009-025723 | | 2/2009 |
| JP | A-2010-002870 | | 1/2010 |
| JP | A-2010-032994 | | 2/2010 |
| JP | A-2010-150447 | | 7/2010 |
| JP | A-2010-150448 | | 7/2010 |
| JP | A-2010-277043 | | 12/2010 |
| JP | A-2011-013569 | | 1/2011 |
| JP | 2011053567 A | * | 3/2011 |
| JP | A-2011-128226 | | 6/2011 |
| JP | A-2011-191731 | | 9/2011 |
| JP | A-2012-017264 | | 1/2012 |

(Continued)

OTHER PUBLICATIONS

Machine translation JP 2005-326609. Nov. 24, 2005.*
Machine translation JP 2011-052567. Mar. 17, 2011.*
Machine translation JP 2012-078510. Apr. 19, 2012.*
Machine translation JP 2012-197382. Oct. 18, 2012.*
Machine translation JP 2014-085472. May 12, 2014.*
Office Action in Japanese Patent Application No. 2013-236868, dated Jul. 11, 2017.

*Primary Examiner* — Cynthia H Kelly
*Assistant Examiner* — Alyssa L Cepluch
(74) *Attorney, Agent, or Firm* — Knobbe Martens Olson & Bear LLP

(57) ABSTRACT

A resist composition which generates acid upon exposure and exhibits changed solubility in a developing solution under action of acid, and which includes a base component (A) which exhibits changed solubility in a developing solution under action of acid, the base component (A) including a polymeric compound (A1) having a structural unit (a0) represented by general formula (a0-0) shown below (wherein $V^{11}$ represents an aliphatic cyclic group with or without a substituent; $R^1$ represents a lactam-containing cyclic group or a sultam-containing cyclic group; $Y^1$ represents an oxygen atom (—O—), an ester bond (—C(=O)—O—) or a single bond; and $W^2$ represents a group formed by a polymerization reaction of a polymerizable group-containing group).

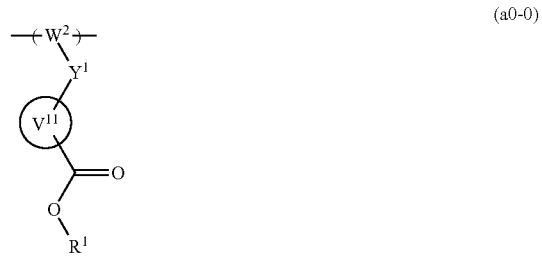

(a0-0)

4 Claims, No Drawings

(56) References Cited

FOREIGN PATENT DOCUMENTS

| JP | 2012078510 A | * | 4/2012 |
| JP | 2012197382 A | * | 10/2012 |
| JP | 2014085472 A | * | 5/2014 |
| JP | A-2015-043079 | | 3/2015 |
| WO | WO 2011/034213 A1 | | 3/2011 |

* cited by examiner

RESIST COMPOSITION, METHOD OF FORMING RESIST PATTERN, POLYMERIC COMPOUND, COMPOUND

TECHNICAL FIELD

The present invention relates to a resist composition, a method of forming a resist pattern using the same, a polymeric compound useful for the resist composition, and a compound useful as a raw material for the polymeric compound.

Priority is claimed on Japanese Patent Application No. 2013-236868, filed Nov. 15, 2013, the content of which is incorporated herein by reference.

DESCRIPTION OF RELATED ART

In lithography techniques, for example, a resist film composed of a resist material is formed on a substrate, and the resist film is subjected to selective exposure, followed by development, thereby forming a resist pattern having a predetermined shape on the resist film. A resist material in which the exposed portions of the resist film become soluble in a developing solution is called a positive-type, and a resist material in which the exposed portions of the resist film become insoluble in a developing solution is called a negative-type.

In recent years, in the production of semiconductor elements and liquid crystal display elements, advances in lithography techniques have led to rapid progress in the field of pattern miniaturization. Typically, these miniaturization techniques involve shortening the wavelength (increasing the energy) of the exposure light source. Conventionally, ultraviolet radiation typified by g-line and i-line radiation has been used, but nowadays KrF excimer lasers and ArF excimer lasers are starting to be introduced in mass production. Furthermore, research is also being conducted into lithography techniques that use an exposure light source having a wavelength shorter (energy higher) than these excimer lasers, such as electron beam (EB), extreme ultraviolet radiation (EUV), and X ray.

Resist materials for use with these types of exposure light sources require lithography properties such as a high resolution capable of reproducing patterns of minute dimensions, and a high level of sensitivity to these types of exposure light sources.

As a resist material that satisfies these conditions, a chemically amplified composition is used, which includes a base material component that exhibits a changed solubility in a developing solution under the action of acid and an acid-generator component that generates acid upon exposure. For example, in the case where the developing solution is an alkali developing solution (alkali developing process), a chemically amplified positive resist which contains, as a base component (base resin), a resin which exhibits increased solubility in an alkali developing solution under action of acid, and an acid generator is typically used. If a resist film formed using such a resist composition is selectively exposed at the time of forming a resist pattern, in exposed areas, an acid is generated from the acid generator component, and the polarity of the base resin increases by the action of the generated acid, thereby making the exposed areas soluble in the alkali developing solution. Thus, by conducting alkali developing, the unexposed portions remain to form a positive resist pattern. On the other hand, when such a base resin is applied to a solvent developing process using a developing solution containing an organic solvent (organic developing solution), the solubility of the exposed portions in an organic developing solution is decreased. As a result, the unexposed portions of the resist film are dissolved and removed by the organic developing solution, and a negative resist pattern in which the exposed portions are remaining is formed. Such a solvent developing process for forming a negative-tone resist composition is sometimes referred to as "negative-tone developing process" (for example, see Patent Document 1).

In general, the base resin for a chemically amplified resist composition contains a plurality of structural units for improving lithography properties and the like. For example, in the case of a resin composition which exhibits increased solubility in an alkali developing solution by the action of acid, a structural unit containing an acid decomposable group which is decomposed by the action of acid generated from an acid generator component and exhibits increased polarity. Further, a structural unit containing a lactone-containing cyclic group or a structural unit containing a polar group such as a hydroxy group is used (for example, see Patent Document 2).

Recently, as progress is made in development of new lithography techniques such as immersion exposure, various studies on a base resin have been conducted. For example, in Patent Documents 3 and 4, a polymeric compound containing a monomer unit having a lactone skeleton represented by a specific general formula is disclosed, which is used for a chemically amplified resist composition, in particular, for a polymeric compound used in immersion exposure.

DOCUMENTS OF RELATED ART

Patent Literature

[Patent Literature 1] Japanese Unexamined Patent Application, First Publication No. 2009-025723
[Patent Document 2] Japanese Unexamined Patent Application, First Publication No. 2003-241385
[Patent Document 3] Japanese Unexamined Patent Application, First Publication No. 2010-150447
[Patent Document 4] Japanese Unexamined Patent Application, First Publication No. 2010-150448

SUMMARY OF THE INVENTION

As further progress is made in lithography techniques and miniaturization of resist patterns, further improvement in resist materials has been demanded in terms of various lithography properties.

For example, improvement in exposure latitude (EL), line width roughness (LWR) and mask reproducibility are also required, as well as improvement in sensitivity and resolution.

The present invention takes the above circumstances into consideration, with an object of providing a resist composition exhibiting excellent lithography properties, a method of forming a resist pattern using the resist composition, a polymer compound useful for the resist composition, and a compound useful as a raw material for the polymeric compound.

A first aspect of the present invention is a resist composition which generates acid upon exposure and exhibits changed solubility in a developing solution under action of acid, and which includes a base component (A) which exhibits changed solubility in a developing solution under action of acid, the base component (A) including a polymeric compound (A1) having a structural unit (a0) represented by general formula (a0-0) shown below.

[Chemical Formula 1]

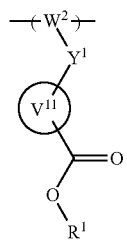

(a0-0)

In the formula, $V^{11}$ represents an aliphatic cyclic group with or without a substituent; $R^1$ represents a lactam-containing cyclic group or a sultam-containing cyclic group; $Y^1$ represents an oxygen atom (—O—), an ester bond (—C(=O)—O—) or a single bond; and $W^2$ represents a group formed by a polymerization reaction of a polymerizable group-containing group.

A second aspect of the present invention is a method of forming a resist pattern, including: using a resist composition of the first aspect to form a resist film; exposing the resist film; and developing the resist film to form a resist pattern.

A third aspect of the present invention is a polymeric compound having a structural unit (a0) represented by general formula (a0-0) shown below.

[Chemical Formula 2]

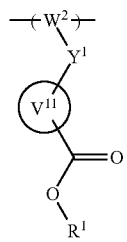

(a0-0)

In the formula, $V^{11}$ represents an aliphatic cyclic group with or without a substituent; $R^1$ represents a lactam-containing cyclic group or a sultam-containing cyclic group; $Y^1$ represents an oxygen atom (—O—), an ester bond (—C(=O)—O—) or a single bond; and $W^2$ represents a group formed by a polymerization reaction of a polymerizable group-containing group.

A fourth aspect of the present invention is a compound represented by general formula (I-0) shown below.

[Chemical Formula 3]

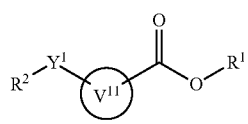

(I-0)

In the formula, $V^{11}$ represents an aliphatic cyclic group with or without a substituent; $R^1$ represents a lactam-containing cyclic group or a sultam-containing cyclic group; $Y^1$ represents an oxygen atom (—O—), an ester bond (—C(=O)—O—) or a single bond; and $R^2$ represents a polymerizable group-containing group.

A fifth aspect of the present invention is a compound represented by general formula (I) shown below.

[Chemical Formula 4]

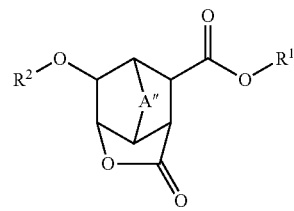

(I)

In the formula, A" represents an oxygen atom, a sulfur atom or an alkylene group of 1 to 5 carbon atoms with or without an oxygen atom or a sulfur atom; $R^1$ represents a lactam-containing cyclic group or a sultam-containing cyclic group; and $R^2$ represents a polymerizable group-containing group.

A sixth aspect of the present invention is a compound represented by general formula (II) shown below.

[Chemical Formula 5]

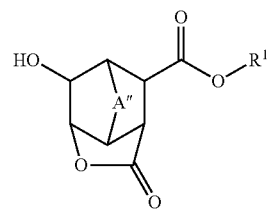

(II)

In the formula, A" represents an oxygen atom, a sulfur atom or an alkylene group of 1 to 5 carbon atoms with or without an oxygen atom or a sulfur atom; and $R^1$ represents a lactam-containing cyclic group or a sultam-containing cyclic group.

A seventh aspect of the present invention is a compound represented by general formula (III) shown below.

[Chemical Formula 6]

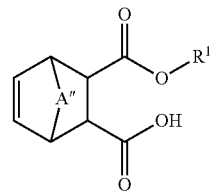

(III)

In the formula, A" represents an oxygen atom, a sulfur atom or an alkylene group of 1 to 5 carbon atoms with or without an oxygen atom or a sulfur atom; and $R^1$ represents a lactam-containing cyclic group or a sultam-containing cyclic group.

According to the present invention, there are provided a resist composition exhibiting excellent lithography properties, a method of forming a resist pattern using the resist composition, a polymer compound useful for the resist composition, and a compound useful as a raw material for the polymeric compound.

DETAILED DESCRIPTION OF THE INVENTION

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified.

The term "alkylene group" includes linear, branched or cyclic, divalent saturated hydrocarbon, unless otherwise specified. The same applies for the alkyl group within an alkoxy group.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

A "fluorinated alkyl group" or a "fluorinated alkylene group" is a group in which part or all of the hydrogen atoms of an alkyl group or an alkylene group have been substituted with a fluorine atom.

The term "structural unit" refers to a monomer unit that contributes to the formation of a polymeric compound (resin, polymer, copolymer).

A "structural unit derived from an acrylate ester" refers to a structural unit that is formed by the cleavage of the ethylenic double bond of an acrylate ester.

An "acrylate ester" refers to a compound in which the terminal hydrogen atom of the carboxy group of acrylic acid ($CH_2=CH-COOH$) has been substituted with an organic group.

The acrylate ester may have the hydrogen atom bonded to the carbon atom on the α-position substituted with a substituent. The substituent ($R^\alpha$) that substitutes the hydrogen atom bonded to the carbon atom on the α-position is an atom other than hydrogen or a group, and examples thereof include an alkyl group of 1 to 5 carbon atoms and a halogenated alkyl group of 1 to 5 carbon atoms. Further, an acrylate ester having the hydrogen atom bonded to the carbon atom on the α-position substituted with a substituent ($R^\alpha$) in which the substituent has been substituted with a substituent containing an ester bond (e.g., an itaconic acid diester), or an acrylic acid having the hydrogen atom bonded to the carbon atom on the α-position substituted with a substituent ($R^\alpha$) in which the substituent has been substituted with a hydroxyalkyl group or a group in which the hydroxy group within a hydroxyalkyl group has been modified (e.g., α-hydroxyalkyl acrylate ester) can be mentioned as an acrylate ester having the hydrogen atom bonded to the carbon atom on the α-position substituted with a substituent. A carbon atom on the α-position of an acrylate ester refers to the carbon atom bonded to the carbonyl group, unless specified otherwise.

Hereafter, an acrylate ester having the hydrogen atom bonded to the carbon atom on the α-position substituted with a substituent is sometimes referred to as "α-substituted acrylate ester". Further, acrylate esters and α-substituted acrylate esters are collectively referred to as "(α-substituted) acrylate ester".

A "structural unit derived from acrylaminde" refers to a structural unit that is formed by the cleavage of the ethylenic double bond of acrylaminde.

The acrylamide may have the hydrogen atom bonded to the carbon atom on the α-position substituted with a substituent, and may have either or both terminal hydrogen atoms on the amino group of acrylamide substituted with a substituent. A carbon atom on the α-position of an acrylamide refers to the carbon atom bonded to the carbonyl group, unless specified otherwise.

As the substituent which substitutes the hydrogen atom on the α-position of acrylamide, the same substituents as those described above for the substituent ($R^\alpha$) on the α-position of the aforementioned α-substituted acrylate ester can be mentioned.

A "structural unit derived from hydroxystyrene or a hydroxystyrene derivative" refers to a structural unit that is formed by the cleavage of the ethylenic double bond of hydroxystyrene or a hydroxystyrene derivative.

The term "hydroxystyrene derivative" includes compounds in which the hydrogen atom at the α-position of hydroxystyrene has been substituted with another substituent such as an alkyl group or a halogenated alkyl group; and derivatives thereof. Examples of the derivatives thereof include hydroxystyrene in which the hydrogen atom of the hydroxy group has been substituted with an organic group and may have the hydrogen atom on the α-position substituted with a substituent; and hydroxystyrene which has a substituent other than a hydroxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

As the substituent which substitutes the hydrogen atom on the α-position of hydroxystyrene, the same substituents as those described above for the substituent on the α-position of the aforementioned α-substituted acrylate ester can be mentioned.

A "structural unit derived from vinylbenzoic acid or a vinylbenzoic acid derivative" refers to a structural unit that is formed by the cleavage of the ethylenic double bond of vinylbenzoic acid or a vinylbenzoic acid derivative.

The term "vinylbenzoic acid derivative" includes compounds in which the hydrogen atom at the α-position of vinylbenzoic acid has been substituted with another substituent such as an alkyl group or a halogenated alkyl group; and derivatives thereof. Examples of the derivatives thereof include benzoic acid in which the hydrogen atom of the carboxy group has been substituted with an organic group and may have the hydrogen atom on the α-position substituted with a substituent; and benzoic acid which has a substituent other than a hydroxy group and a carboxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

The term "styrene" is a concept including styrene and compounds in which the hydrogen atom at the α-position of styrene is substituted with other substituent such as an alkyl group and a halogenated alkyl group.

A "structural unit derived from styrene" or "structural unit derived from a styrene derivative" refers to a structural unit that is formed by the cleavage of the ethylenic double bond of styrene or a styrene derivative.

As the alkyl group as a substituent on the α-position, a linear or branched alkyl group is preferable, and specific examples include alkyl groups of 1 to 5 carbon atoms, such as a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group as the substituent on the α-position include groups in which part or all of the hydrogen atoms of the aforementioned "alkyl group as the substituent on the α-position" are substituted with halogen atoms. Examples of the halogen atom include a fluorine atom, a chlorine atom, a bromine atom and an iodine atom, and a fluorine atom is particularly desirable.

Specific examples of the hydroxyalkyl group as the substituent on the α-position include groups in which part or all of the hydrogen atoms of the aforementioned "alkyl group as the substituent on the α-position" are substituted with a hydroxy group. The number of hydroxy groups within the hydroxyalkyl group is preferably 1 to 5, and most preferably 1.

The expression "may have a substituent" means that a case where a hydrogen atom (—H) is substituted with a monovalent group, or a case where a methylene (—$CH_2$—) group is substituted with a divalent group.

The term "exposure" is used as a general concept that includes irradiation with any form of radiation.

<<Resist Composition>>

The resist composition according to a first aspect of the present invention is a resist composition which generates acid upon exposure and exhibits changed solubility in a developing solution under action of acid, and which includes a base component (A) which exhibits changed solubility in a developing solution under action of acid (hereafter, referred to as "component (A)").

When a resist film is formed using the resist composition and the formed resist film is subjected to a selective exposure, acid is generated at exposed portions, and the generated acid acts on the component (A) to change the solubility of the component (A) in a developing solution, whereas the solubility of the component (A) in a developing solution is not changed at unexposed portions, thereby generating difference in solubility in a developing solution between exposed portions and unexposed portions. Therefore, by subjecting the resist film to development, the exposed portions are dissolved and removed to form a positive-tone resist pattern in the case of a positive resist, whereas the unexposed portions are dissolved and removed to form a negative-tone resist pattern in the case of a negative resist.

In the present specification, a resist composition which forms a positive resist pattern by dissolving and removing the exposed portions is called a positive resist composition, and a resist composition which forms a negative resist pattern by dissolving and removing the unexposed portions is called a negative resist composition.

The resist composition of the present invention may be either a positive resist composition or a negative resist composition.

Further, in the formation of a resist pattern, the resist composition of the present invention can be applied to an alkali developing process using an alkali developing solution in the developing treatment, or a solvent developing process using a developing solution containing an organic solvent (organic developing solution) in the developing treatment.

The resist composition of the present invention has a function of generating acid upon exposure, and in the resist composition, the component (A) may generate acid upon exposure, or an additive component other than the component (A) may generate acid upon exposure.

More specifically, the resist composition of the present invention may be a resist composition (1) containing an acid generator component (B) which generates acid upon exposure (hereafter, referred to as "component (B)");

a resist composition (2) in which the component (A) is a component which generates acid upon exposure; or a resist composition (3) in which the component (A) is a component which generates acid upon exposure, and further containing an acid generator component (B).

That is, when the resist composition of the present invention is the aforementioned resist composition (2) or (3), the component (A) is a "base component which generates acid upon exposure and exhibits changed solubility in a developing solution under action of acid". In the case where the component (A) is a base component which generates acid upon exposure and exhibits changed solubility in a developing solution under action of acid, the component (A1) described later is preferably a polymeric compound which generates acid upon exposure and exhibits changed solubility in a developing solution under action of acid. As the polymeric compound, a resin having a structural unit which generates acid upon exposure can be used. As the structural unit which generates acid upon exposure, a conventional structural unit can be used.

The resist composition of the present invention is particularly preferably the aforementioned resist composition (1).

<Component (A)>

In the present invention, the term "base component" refers to an organic compound capable of forming a film, and is preferably an organic compound having a molecular weight of 500 or more. When the organic compound has a molecular weight of 500 or more, the film-forming ability is improved, and a resist pattern of nano level can be easily formed.

The organic compound used as the base component is broadly classified into non-polymers and polymers.

In general, as a non-polymer, any of those which have a molecular weight in the range of 500 to less than 4,000 is used. Hereafter, a "low molecular weight compound" refers to a non-polymer having a molecular weight in the range of 500 to less than 4,000.

As a polymer, any of those which have a molecular weight of 1,000 or more is generally used. Hereafter, a "resin" refers to a polymer having a molecular weight of 1,000 or more.

As the molecular weight of the polymer, the weight average molecular weight in terms of the polystyrene equivalent value determined by gel permeation chromatography (GPC) is used.

As the component (A'), a resin, a low molecular weight compound, or a combination thereof may be used.

The component (A) may be a resin that exhibits increased solubility in a developing solution under action of acid or a resin that exhibits decreased solubility in a developing solution under action of acid.

In the present invention, the component (A) may be a component that generates acid upon exposure.

When the resist composition of the present invention is a "negative resist composition for alkali developing process" that forms a negative-tone resist pattern in an alkali developing process (or a "positive resist composition for solvent developing process" that forms a positive-tone resist pattern in a solvent developing process), as the component (A), a base component (A-2) that is soluble in an alkali developing solution (hereafter, this base component is sometimes referred to as "component (A-2)") is preferably used, and a cross-linking component is further added. In such a resist composition, when acid is generated upon exposure, the action of the acid causes cross-linking between the component (A-2) and the cross-linking component. As a result, the solubility of the resist composition in an alkali developing solution is decreased (the solubility of the resist composition in an organic developing solution is increased). Therefore, in the formation of a resist pattern, by conducting selective exposure of a resist film formed by applying the resist composition to a substrate, the exposed portions become insoluble in an alkali developing solution (soluble in an organic developing solution), whereas the unexposed portions remain soluble in an alkali developing solution (insoluble in an organic developing solution), and hence, a negative resist pattern can be formed by conducting development using an alkali developing solution. On the other hand, when an organic developing solution is used as the developing solution, a positive resist pattern can be formed.

As the component (A-2), a resin that is soluble in an alkali developing solution (hereafter, referred to as "alkali-soluble resin") is used.

Examples of the alkali soluble resin include a resin having a structural unit derived from at least one of α-(hydroxyalkyl)acrylic acid and an alkyl ester of α-(hydroxyalkyl)acrylic acid (preferably an alkyl ester having 1 to 5 carbon atoms), as disclosed in Japanese Unexamined Patent Application, First Publication No. 2000-206694; an acrylic resin which has a sulfonamide group and may have the hydrogen atom bonded to the carbon atom on the α-position substituted with a substituent or polycycloolefin resin having a sulfoneamide group, as disclosed in U.S. Pat. No. 6,949,325; an acrylic resin which may have the hydrogen atom bonded to the carbon atom on the α-position substituted with a substituent and having a fluorinated alcohol, as disclosed in U.S. Pat. No. 6,949,325, Japanese Unexamined Patent Application, First Publication No. 2005-336452 or Japanese Unexamined Patent Application, First Publication No. 2006-317803; and a polycyclolefin resin having a fluorinated alcohol, as disclosed in Japanese Unexamined Patent Application, First Publication No. 2006-259582. These resins are preferable in that a resist pattern can be formed with minimal swelling.

Here, the term "α-(hydroxyalkyl)acrylic acid" refers to one or both of acrylic acid in which a hydrogen atom is bonded to the carbon atom on the α-position having the carboxyl group bonded thereto, and α-hydroxyalkylacrylic acid in which a hydroxyalkyl group (preferably a hydroxyalkyl group of 1 to 5 carbon atoms) is bonded to the carbon atom on the α-position.

As the cross-linking agent, typically, an amino-based cross-linking agent such as a glycoluril having a methylol group or alkoxymethyl group, or a melamine-based cross-linking agent is preferable, as it enables formation of a resist pattern with minimal swelling. The amount of the cross-linker added is preferably within a range from 1 to 50 parts by weight, relative to 100 parts by weight of the alkali-soluble resin.

In the case where the resist composition of the present invention is a resist composition which forms a positive pattern in an alkali developing process and a negative pattern in a solvent developing process (i.e, a positive type resist compound for alkali developing process) or a resist composition which forms a negative pattern in a solvent developing process (i.e., a negative type resist composition for solvent developing process), as a component (A), it is preferable to use a base component (A-1) (hereafter, referred to as "component (A-1)") which exhibits increased polarity by the action of acid. By using the component (A-1), since the polarity of the base component changes prior to and after exposure, an excellent development contrast can be obtained not only in an alkali developing process, but also in a solvent developing process.

More specifically, in the case of applying an alkali developing process, the component (A-1) is substantially insoluble in an alkali developing solution prior to exposure, but when acid is generated upon exposure, the action of this acid causes an increase in the polarity of the base component, thereby increasing the solubility of the component (A-1) in an alkali developing solution. Therefore, in the formation of a resist pattern, by conducting selective exposure of a resist film formed by applying the resist composition to a substrate, the exposed portions change from an insoluble state to a soluble state in an alkali developing solution, whereas the unexposed portions remain insoluble in an alkali developing solution, and hence, a positive resist pattern can be formed by alkali developing.

On the other hand, in the case of a solvent developing process, the component (A-1) exhibits high solubility in an organic developing solution prior to exposure, and when acid is generated upon exposure, the polarity of the component (A-1) is increased by the action of the generated acid, thereby decreasing the solubility of the component (A-1) in an organic developing solution. Therefore, in the formation of a resist pattern, by conducting selective exposure of a resist film formed by applying the resist composition to a substrate, the exposed portions changes from an soluble state to an insoluble state in an organic developing solution, whereas the unexposed portions remain soluble in an organic developing solution. As a result, by conducting development using an organic developing solution, a contrast can be made between the exposed portions and unexposed portions, thereby enabling the formation of a negative resist pattern.

In the present invention, the component (A) is preferably a component (A-1).

[Polymeric Compound (A1)]

The component (A) includes a polymeric compound (A1) (hereafter, referred to as "component (A1)") including a structural unit (a0) described later.

As the component (A1), the component (A-1) is preferable.

(Structural Unit (a0))

The structural unit (a0) is represented by general formula (a0-0) shown below.

The structural unit (a0) has $R^1$ (a lactam-containing cyclic group or a sultam-containing cyclic group) on the terminal, and an aliphatic cyclic group (with or without a substituent) between $W^2$ and $R^1$. Therefore, the structural unit (a0) has a steric bulkiness and high polarity. As a result, the adhesion between the resist film and the substrate, and the compatibility with a developing solution containing water, such as an alkali developing solution is enhanced, and the lithographic properties are improved. Further, the problem of the decrease in film thickness (i.e., film shrinkage) after post exposure bake (PEB) or after development is improved, and for example, in a solvent developing process, a negative-tone pattern can be formed with a high residual film ratio.

[Chemical Formula 7]

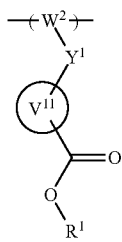
(a0-0)

In the formula, $V^{11}$ represents an aliphatic cyclic group with or without a substituent; $R^1$ represents a lactam-containing cyclic group or a sultam-containing cyclic group; $Y^1$ represents an oxygen atom (—O—), an ester bond (—C(=O)—O—) or a single bond; and $W^2$ represents a group formed by a polymerization reaction of a polymerizable group-containing group.

In formula (a0-0), $V^{11}$ represents an aliphatic cyclic group with or without a substituent. Examples of aliphatic cyclic group (with or without a substituent) for $V^{11}$ include alicyclic hydrocarbon rings which may be monocyclic or polycyclic (such as condensed ring or bridged ring). Representative examples of alicyclic hydrocarbon ring include a cyclopentane ring, a cyclopentene ring, a cyclohexane ring, a chlorocyclohexane ring, a methylcyclohexane ring, a cyclohexene ring, a cyclooctane ring, a cyclodecane ring, an adamantane ring, a norbornane ring, a norbornene ring, a bornane ring, an isobornane ring, a bicyclo[2.2.2]octane ring, a bicyclo[2.2.2]octene ring, a 7-oxabicyclo[2.2.1]heptane ring, a 7-oxabicyclo[2.2.1]heptene ring, a perhydroindene ring, a decalin ring, a perhydrofluorene ring (tricyclo[7.4.0.0³,⁸]tridecane ring), a perhydroanthracene ring, a tricyclo[5.2.1.0²,⁶]decane ring, a tricyclo[4.2.2.1²,⁵]undecane ring and a tetracyclo[4.4.0.1²,⁵.1⁷,¹⁰]dodecane ring. The alicyclic hydrocarbon ring may have a substituent such as an alkyl group (e.g., a C1-C4 alkyl group, such as a methyl group), a halogen atom (e.g., a chlorine atom), a hydroxy group which may be protected with a protecting group, an oxo group, or a carboxy group which may be protected with a protecting group.

Alternatively, in formula (a0-0), $V^{11}$ may be a linking group represented by any one of general formulae (a0-r-1) to (a0-r-7) shown below.

[Chemical Formula 8]

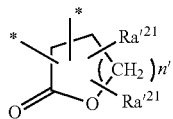
(a0-r-1)

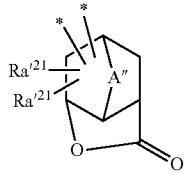
(a0-r-2)

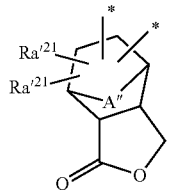
(a0-r-3)

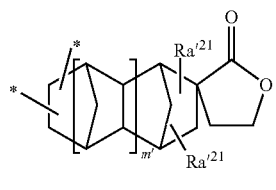
(a0-r-4)

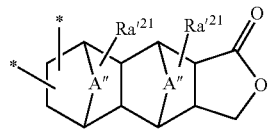
(a0-r-5)

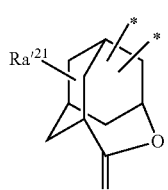
(a0-r-6)

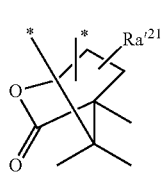
(a0-r-7)

In the formulae, each $Ra'^{21}$ independently represents a hydrogen atom, an alkyl group, an alkoxy group, a halogen atom, a halogenated alkyl group, a hydroxy group, —COOR″, —OC(=O)R″, a hydroxyalkyl group or a cyano group; R″ represents a hydrogen atom or an alkyl group; A″ represents an oxygen atom, a sulfur atom or an alkylene group of 1 to 5 carbon atoms with or without an oxygen atom or a sulfur atom; n' represents an integer of 0 to 2; and m' represents 0 or 1. * represents a valence bond (the same applies throughout the present specification).

In general formulae (a0-r-1) to (a0-r-7), $Ra'^{21}$, R″, A″, n' and m' are respectively the same as defined for $Ra'^{21}$, R″, A″, n' and m' in general formulae (a2-r-1) to (a2-r-7) described later.

In formula (a0-0), as $V^{11}$, a group represented by general formula (a0-r-1) or (a0-r-2) is preferable, and a group represented by general formula (a0-r-2) is more preferable.

In formula (a0-0), $R^1$ represents a lactam-containing cyclic group or a sultam-containing cyclic group.

A "lactam ring" refers to a cyclic group containing a ring containing —NH—C(=O)— in the ring skeleton thereof, i.e., a cyclic group in which the nitrogen atom (N) and the carbon atom (C) within —NH—C(=O)— forms part of the ring skeleton of the cyclic group. The ring containing —NH—C(=O)— within the ring skeleton thereof is counted as the first ring. A cyclic group in which the only ring structure is the ring that contains —NH—C(=O)— in the ring skeleton thereof is referred to as a monocyclic group, and a group containing other ring structures is described as a polycyclic group regardless of the structure of the other rings. The —NH—C(=O)— containing cyclic group may be either a monocyclic group or a polycyclic group.

A "sultam ring" refers to a cyclic group containing a ring containing —NH—SO$_2$— in the ring skeleton thereof, i.e., a cyclic group in which the nitrogen atom (N) and the sulfur atom (S) within —NH—SO$_2$— forms part of the ring skeleton of the cyclic group. The ring containing —NH—SO$_2$— within the ring skeleton thereof is counted as the first ring. A cyclic group in which the only ring structure is the ring that contains —NH—SO$_2$— in the ring skeleton thereof is referred to as a monocyclic group, and a group containing other ring structures is described as a polycyclic group regardless of the structure of the other rings. The —NH—SO$_2$— containing cyclic group may be either a monocyclic group or a polycyclic group.

In formula (a0-0), examples of the lactam-containing cyclic group or the sultam-containing cyclic group for $R^1$ include groups represented by general formulae (a0-R-1) to (a0-R-6) shown below.

[Chemical Formula 9]

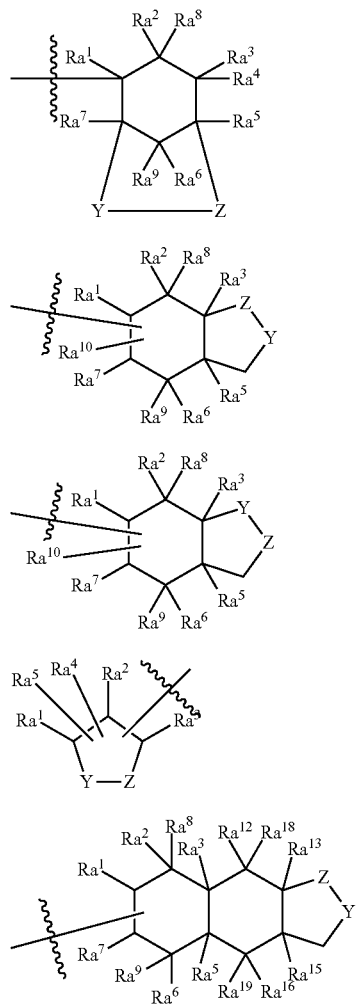

In the formulae, $Ra^1$, $Ra^2$, $Ra^3$, $Ra^4$, $Ra^5$, $Ra^6$, $Ra^7$, $Ra^8$, $Ra^9$, $Ra^{10}$, $Ra^{12}$, $Ra^{13}$, $Ra^{15}$, $Ra^{16}$, $Ra^{18}$ and $Ra^{19}$ each independently represents a hydrogen atom, an alkyl group, a cyclic hydrocarbon group of 3 to 10 carbon atoms, an alkoxy group, a halogen atom, a halogenated alkyl group, a hydroxy group, —COOR$^{11}$, —OC(=O)R$^{11}$, a hydroxyalkyl group or a cyano group; $R^{11}$ represents a hydrogen atom, an alkyl group or a cyclic hydrocarbon group of 3 to 10 carbon atoms with or without a substituent; provided that $Ra^8$ and $Ra^9$ or $Ra^{18}$ and $Ra^{19}$ may be mutually bonded to represent an alkylene group of 1 to 5 carbon atoms, —O— or —S—; Y represents >NRb (wherein Rb represents a hydrogen atom or a hydrocarbon group); Z represents >C=O or >SO$_2$; and m represents 0 or 1.

$Ra^1$, $Ra^2$, $Ra^3$, $Ra^4$, $Ra^5$, $Ra^6$, $Ra^7$, $Ra^8$, $Ra^9$, $Ra^{10}$, $Ra^{12}$, $Ra^{13}$, $Ra^{15}$, $Ra^{16}$, $Ra^{18}$ and $Ra^{19}$ each independently represents a hydrogen atom, an alkyl group, a cyclic hydrocarbon group of 3 to 10 carbon atoms, an alkoxy group, a halogen atom, a halogenated alkyl group, a hydroxy group, —COOR$^{11}$, —OC(=O)R$^{11}$, hydroxyalkyl group or a cyano group; $R^{11}$ represents a hydrogen atom, an alkyl group or a cyclic hydrocarbon group of 3 to 10 carbon atoms with or without a substituent.

The alkyl group, alkoxy group, halogen atom, halogenated alkyl group, hydroxy group, hydroxyalkyl group or cyano group for $Ra^1$, $Ra^2$, $Ra^3$, $Ra^4$, $Ra^5$, $Ra^6$, $Ra^7$, $Ra^8$, $Ra^9$, $Ra^{10}$, $Ra^{12}$, $Ra^{13}$, $Ra^{15}$, $Ra^{16}$, $Ra^{18}$ and $Ra^{19}$ are the same as defined for $Ra'^{21}$ in general formulae (a2-r-1) to (a2-r-7) described later.

Examples of the cyclic hydrocarbon group of 3 to 10 carbon atoms for $Ra^1$, $Ra^2$, $Ra^3$, $Ra^4$, $Ra^5$, $Ra^6$, $Ra^7$, $Ra^8$, $Ra^9$, $Ra^{10}$, $Ra^{12}$, $Ra^{13}$, $Ra^{15}$, $Ra^{16}$, $Ra^{18}$ and $Ra^{19}$ or the cyclic hydrocarbon group of 3 to 10 carbon atoms for $R^{11}$ include monocyclic or bicyclic hydrocarbon atom of 3 to 10 carbon atoms, such as a C3-C10 saturated cyclic hydrocarbon group (C3-C10 cycloalkyl group), a partially unsaturated C3-C10 cyclic hydrocarbon group and a C6-C10 aromatic hydrocarbon group (C6-C10 aryl group).

Examples of the C3-C10 saturated cyclic hydrocarbon group include a cyclopropyl group, a cyclobutyl group, a cyclopentyl group, a cyclohexyl group, a cycloheptyl group, a cyclooctyl group, a cyclononyl group, a cyclodecyl group, a bicyclo[2,2,1]heptyl group (a norbornyl group), a bicyclo[4,2,0]octyl group, a bicyclo[3,2,1]octyl group, a bicyclo[4,3,0]nonyl group, a bicyclo[4,2,1]nonyl group, a bicyclo[3,3,1]nonyl group (an adamantyl group), a bicyclo[5,3,0]octyl group and a bicyclo[4,4,0]octyl group (a perhydronaphthyl group). The partially unsaturated C3-C10 cyclic hydrocarbon group is a group in which the above C3-C10 saturated cyclic hydrocarbon group has been partially oxidized, and examples thereof include a cyclopropenyl group, a cyclobutenyl group, a cyclopentenyl group, a cyclopentadienyl group, a cyclohexenyl group, a cyclohexanedienyl group, a cycloheptenyl group, a cycloheptanedienyl group, a cyclooctenyl group, a cyclooctanedienyl group, a dicyclooctanetrienyl group, a cyclononenyl group, a cyclodecenyl group, an indanyl group and an indenyl group. Examples of the C6-C10 aromatic hydrocarbon group include a phenyl group and a naphthyl group. The "cyclic hydrocarbon group" for $Ra^1$, $Ra^2$, $Ra^3$, $Ra^4$, $Ra^5$, $Ra^6$, $Ra^7$, $Ra^8$, $Ra^9$, $Ra^{10}$, $Ra^{12}$, $Ra^{13}$, $Ra^{15}$, $Ra^{16}$, $Ra^{18}$ and $Ra^{19}$ is preferably a C3-C8 cyclic hydrocarbon group, more preferably a C3-C8 cycloalkyl group or a phenyl group, still more preferably a C4-C7 cycloalkyl group, and still more preferably a C5-C6 cycloalkyl group. The "C3-C10 cyclic hydrocarbon group" for $Ra^{11}$ is preferably a C3-C10 cycloalkyl group or a C6-C10 aryl group, more preferably a C6-C10 aryl group, and most preferably a phenyl group.

Further $Ra^1$, $Ra^2$, $Ra^3$, $Ra^4$, $Ra^5$, $Ra^6$, $Ra^7$, $Ra^8$, $Ra^9$, $Ra^{10}$, $Ra^{12}$, $Ra^{13}$, $Ra^{15}$, $Ra^{16}$, $Ra^{18}$ and $Ra^{19}$ may be —$COOR^{11}$ or —$OC(=O)R^{11}$, wherein $R^{11}$ represents a hydrogen atom or an alkyl group with or without a substituent.

$Ra^8$ and $Ra^9$ or $Ra^{18}$ and $Ra^{19}$ may be mutually bonded to represent an alkylene group of 1 to 5 carbon atoms, —O— or —S—. Y represents >NRb (wherein Rb represents a hydrogen atom or a hydrocarbon group). The hydrocarbon group for Rb preferably has 1 to 6 carbon atoms, and more preferably 1 to 4 carbon atoms. As the hydrocarbon group for Rb, a linear or branched alkyl group is preferable, and examples thereof include a methyl group, an ethyl group, a propyl group, an isopropyl group and a t-butyl group. Z represents >C=O or >$SO_2$. m represents 0 or 1.

As the lactam-containing cyclic group or sultam-containing cyclic group for $R^1$, a group represented by any one of general formulae (a0-r0-1) to (a0-r0-4) is preferable.

[Chemical Formula 10]

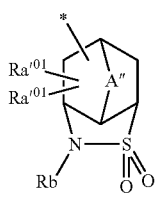
(a0-r0-1)

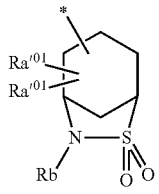
(a0-r0-2)

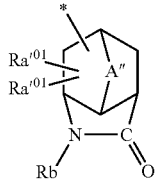
(a0-r0-3)

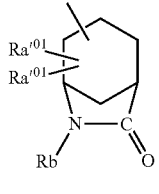
(a0-r0-4)

In the formulae, each $Ra'^{01}$ independently represents a hydrogen atom, an alkyl group, an alkoxy group, a halogen atom, a halogenated alkyl group, —COOR", —OC(=O)R", a hydroxyalkyl group or a cyano group; R" represents a hydrogen atom or an alkyl group; A" represents an oxygen atom, a sulfur atom, or an alkylene group of 1 to 5 carbon atoms with or without an oxygen atom or a sulfur atom; Rb represents a hydrogen atom or a hydrocarbon group; and * represents a valence bond.

In formulae (a0-r0-1) to (a0-r0-4), the alkyl group for $Ra'^{01}$ is preferably an alkyl group of 1 to 6 carbon atoms. Further, the alkyl group is preferably a linear alkyl group or a branched alkyl group. Specific examples include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly desirable.

The alkoxy group for $Ra'^{01}$ is preferably an alkoxy group of 1 to 6 carbon atoms.

Further, the alkoxy group is preferably a linear or branched alkoxy group. Specific examples of the alkoxy groups include the aforementioned alkyl groups for $Ra'^{01}$ having an oxygen atom (—O—) bonded thereto.

As examples of the halogen atom for $Ra'^{01}$, a fluorine atom, chlorine atom, bromine atom and iodine atom can be given. Among these, a fluorine atom is preferable.

Examples of the halogenated alkyl group for $Ra'^{01}$ include groups in which part or all of the hydrogen atoms within the aforementioned alkyl groups has been substituted with the aforementioned halogen atoms. As the halogenated alkyl group, a fluorinated alkyl group is preferable, and a perfluoroalkyl group is particularly desirable.

With respect to —COOR" and —OC(=O)R" for $Ra'^{01}$, R" represents a hydrogen atom or an alkyl group.

The alkyl group for R" may be linear, branched or cyclic, and preferably has 1 to 15 carbon atoms.

When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

The hydroxyalkyl group for $Ra'^{01}$ preferably has 1 to 6 carbon atoms, and specific examples thereof include the aforementioned alkyl groups for the substituent in which at least one hydrogen atom has been substituted with a hydroxy group.

In formulae (a0-r0-1) and (a0-r0-3), as the alkylene group of 1 to 5 carbon atoms represented by A", a linear or branched alkylene group is preferable, and examples thereof include a methylene group, an ethylene group, an n-propylene group and an isopropylene group. Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—CH$_2$—, —CH$_2$—O—CH$_2$—, —S—CH$_2$— and —CH$_2$—S—CH$_2$—. As A", an alkylene group of 1 to 5 carbon atoms or —O— is preferable, more preferably an alkylene group of 1 to 5 carbon atoms, and most preferably a methylene group.

In formulae (a0-r0-1) to (a0-r0-4), the hydrocarbon group for Rb preferably has 1 to 6 carbon atoms, and more preferably 1 to 4 carbon atoms. As the hydrocarbon group for Rb, a linear or branched alkyl group is preferable, and examples thereof include a methyl group, an ethyl group, a propyl group, an isopropyl group and a t-butyl group.

Specific examples of the group represented by general formula (a0-r0-1) are shown below. In the formulae shown below, "Ac" represents an acetyl group.

[Chemical Formula 11]

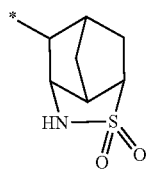
(r-st-1-1)

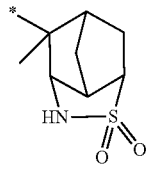
(r-st-1-2)

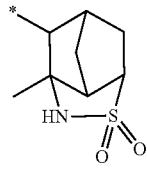
(r-st-1-3)

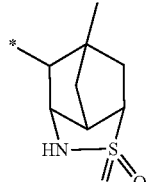
(r-st-1-4)

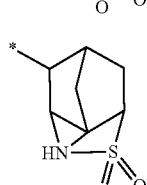
(r-st-1-5)

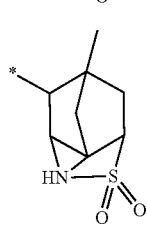
(r-st-1-6)

-continued

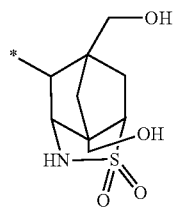
(r-st-1-7)

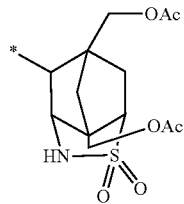
(r-st-1-8)

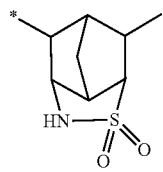
(r-st-1-9)

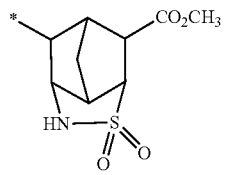
(r-st-1-10)

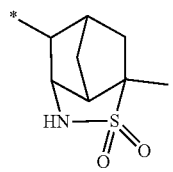
(r-st-1-11)

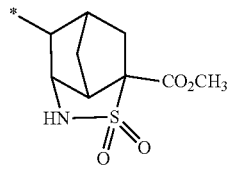
(r-st-1-12)

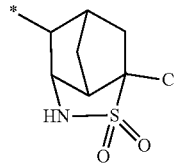
(r-st-1-13)

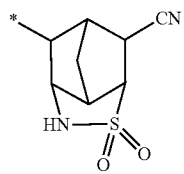
(r-st-1-14)

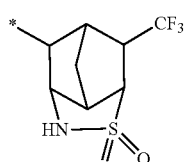 (r-st-1-15)
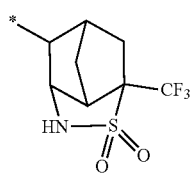 (r-st-1-16)
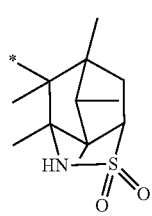 (r-st-1-17)
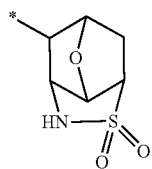 (r-st-1-18)
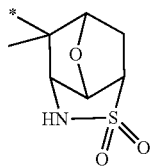 (r-st-1-19)
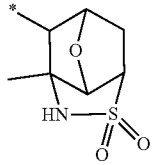 (r-st-1-20)
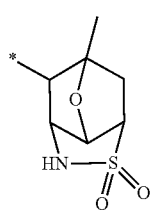 (r-st-1-21)
[Chemical Formula 12]
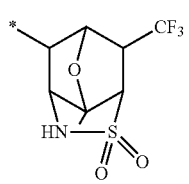 (r-st-1-22)
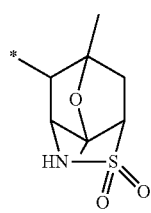 (r-st-1-23)
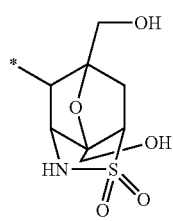 (r-st-1-24)
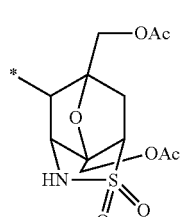 (r-st-1-25)
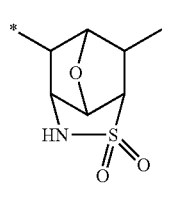 (r-st-1-26)
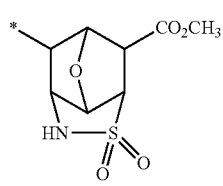 (r-st-1-27)
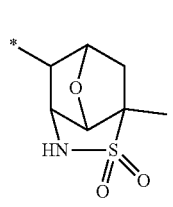 (r-st-1-28)
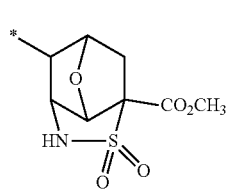 (r-st-1-29)
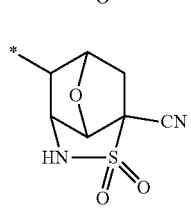 (r-st-1-30)

(r-st-1-31) 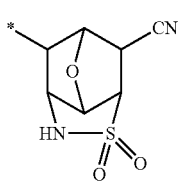
(r-st-1-32) 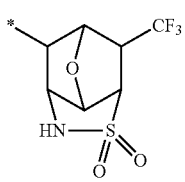
(r-st-1-33) 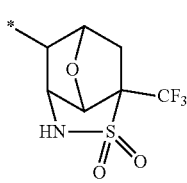
[Chemical Formula 13]
(A0-st-1-1) 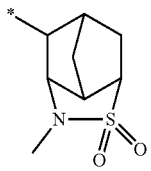
(A0-st-1-2) 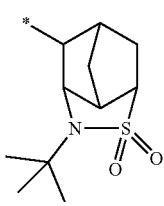
(A0-st-1-3) 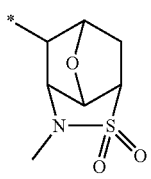
(A0-st-1-4) 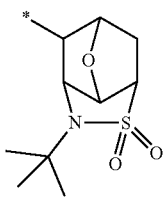
(A0-st-1-5) 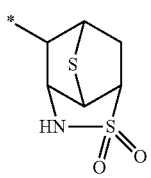
(A0-st-1-6) 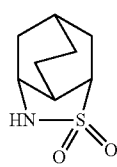
(A0-st-1-7) 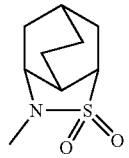
(A0-st-1-8) 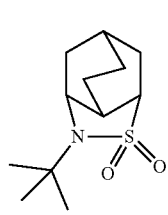
Specific examples of the group represented by general formula (a0-r0-2) are shown below.
[Chemical Formula 14]
(a0-st-2-1) 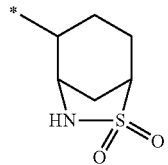
(a0-st-2-2) 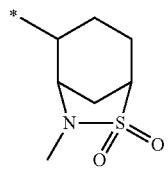
(a0-st-2-3) 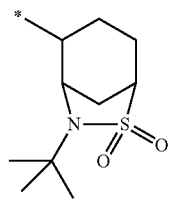
Specific examples of the group represented by general formula (a0-r0-3) are shown below. In the formulae shown below, "Ac" represents an acetyl group.

[Chemical Formula 15]
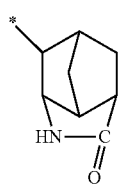 (r-lt-1-1)
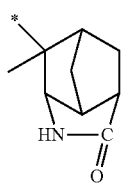 (r-lt-1-2)
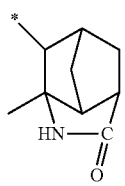 (r-lt-1-3)
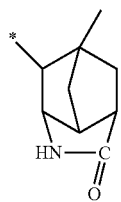 (r-lt-1-4)
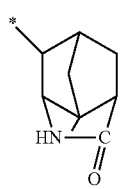 (r-lt-1-5)
 (r-lt-1-6)
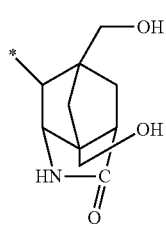 (r-lt-1-7)
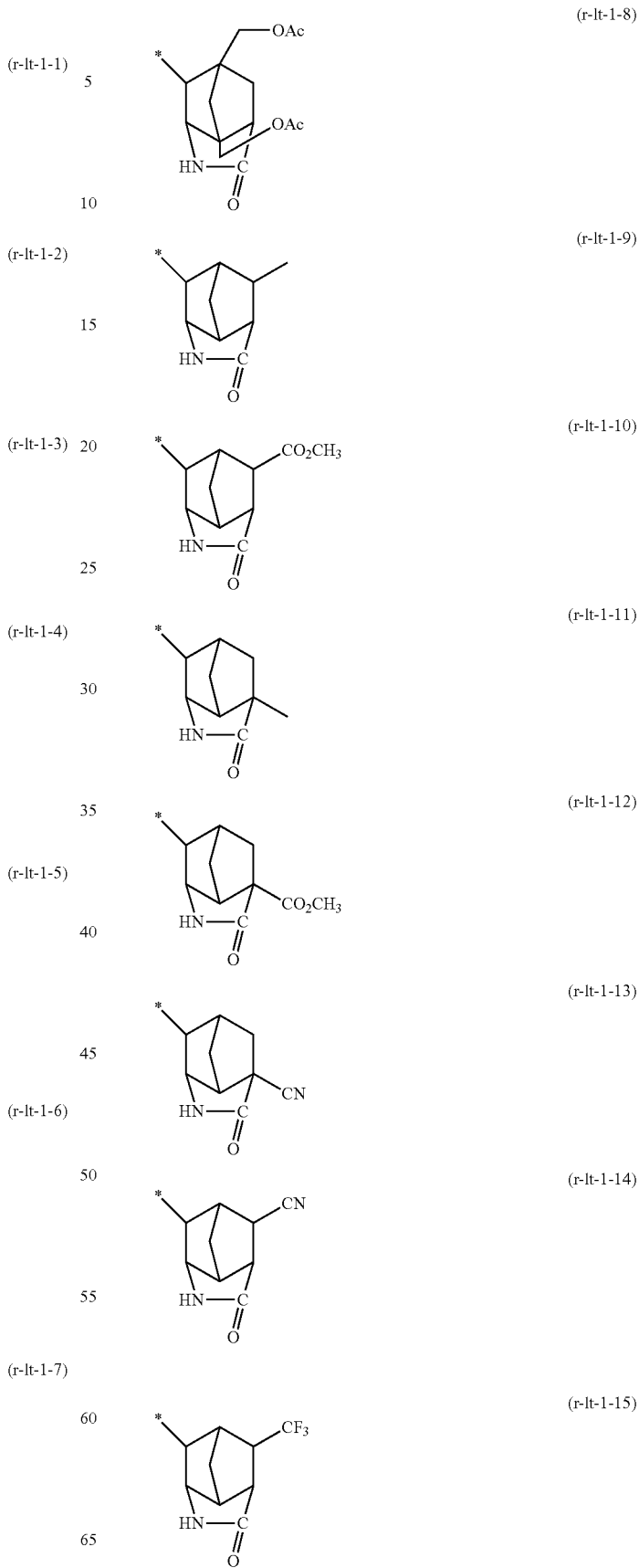

(r-lt-1-16)
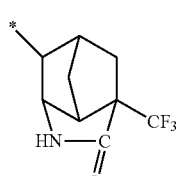
(r-lt-1-17)
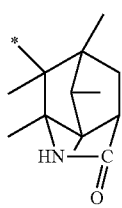
(r-lt-1-18)
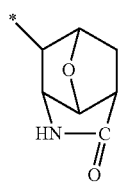
(r-lt-1-19)
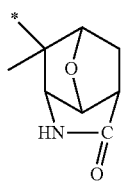
(r-lt-1-20)
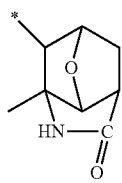
(r-lt-1-21)
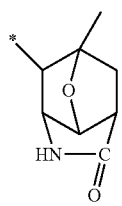
[Chemical Formula 16]
(r-lt-1-22)
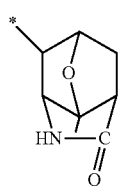
(r-lt-1-23)
(r-lt-1-24)
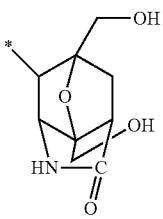
(r-lt-1-25)
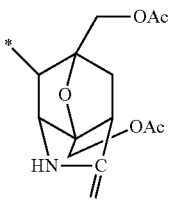
(r-lt-1-26)
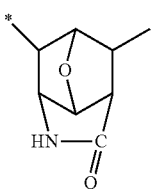
(r-lt-1-27)
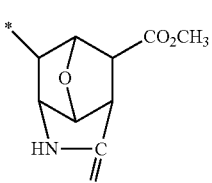
(r-lt-1-28)
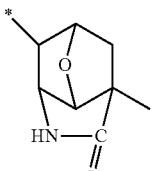
(r-lt-1-29)
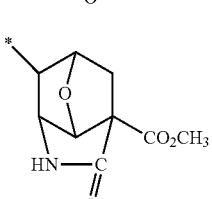
(r-lt-1-30)
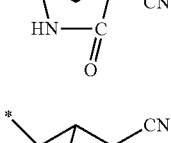
(r-lt-1-31)

(r-lt-1-32) 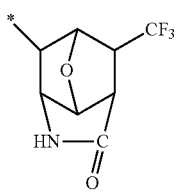

(r-lt-1-33) 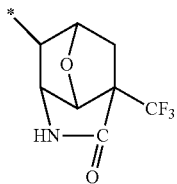

[Chemcial Formula 17]

(a0-lt-1-1) 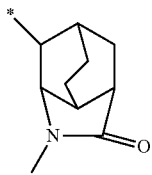

(a0-lt-1-2) 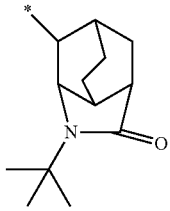

(a0-lt-1-3)

(a0-lt-1-4)

(a0-lt-1-5) 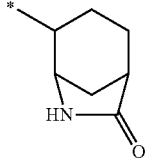

(a0-lt-1-6) 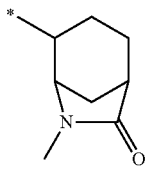

(a0-lt-1-7)

(a0-lt-1-8) 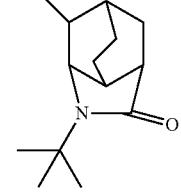

Specific examples of the group represented by general formula (a0-r0-4) are shown below.

[Chemical Formula 18]

(a0-lt-2-1) 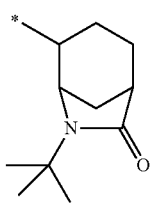

(a0-lt-2-2) 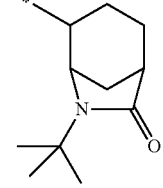

(a0-lt-2-3)

In the formula (a0-0), $W^2$ represents a group which is formed by polymerization reaction of a group containing a polymerizable group.

A "polymerizable group" refers to a group that renders a compound containing the group polymerizable by a radical polymerization or the like, for example, a group having a carbon-carbon multiple bond such as an ethylenic double bond.

Examples of the polymerizable group include a vinyl group, an allyl group, an acryloyl group, a methacryloyl group, a fluorovinyl group, a difluorovinyl group, a trifluorovinyl group, a difluorotrifluoromethylvinyl group, a trifluoroallyl group, a perfluoroallyl group, a trifluoromethylacryloyl group, a nonylfluorobutylacryloyl group, a vinyl ether group, a fluorine-containing vinyl ether group, an allyl ether group, a fluorine-containing allyl ether group, a styryl group, a vinylnaphthyl group, a fluorine-containing styryl group, a fluorine-containing vinylnaphthyl group, a norbornyl group, a fluorine-containing norbornyl group, and a silyl group.

The group for $W^2$ containing a polymerizable group may be a group constituted of only a polymerizable group, or constituted of a polymerizable group and a group other than a polymerizable group.

As the group containing a polymerizable group, a group represented by $R^2$-$L^1$- [in the formula, $R^2$ represents a hydrocarbon group which contains an ethylenic double bond and which optionally a substituent, and $L^1$ represents a divalent linking group containing a hetero atom or a single bond] is preferably used.

The hydrocarbon group for $R^2$ is not particularly limited, as long as it contains an ethylenic double bond, and may be a chain-like hydrocarbon group, or a hydrocarbon group containing a ring in the structure thereof.

As the chain-like hydrocarbon group for $R^2$, a chain-like alkenyl group is preferable. The chain-like alkenyl group may be linear or branched, and preferably has 2 to 10 carbon atoms, more preferably 2 to 5 carbon atoms, still more preferably 2 to 4 carbon atoms, and particularly preferably 2 or 3 carbon atoms.

Examples of linear alkenyl groups include a vinyl group, a propenyl group (an allyl group) and a butynyl group. Examples of branched alkenyl groups include a 1-methylpropenyl group and a 2-methylpropenyl group. Of these, a vinyl group or a propenyl group is preferable.

As examples of the hydrocarbon group for $R^2$ containing a ring in the structure thereof, an unsaturated aliphatic hydrocarbon cyclic group which contains an ethylenic double bond in the ring structure thereof, a group in which the unsaturated aliphatic hydrocarbon cyclic group is bonded to the terminal of the aforementioned linear or branched aliphatic hydrocarbon group, and a group in which a chain-like alkenyl group is bonded to the terminal of the a cyclic hydrocarbon group, can be given.

As the unsaturated aliphatic hydrocarbon cyclic group which contains an ethylenic double bond in the ring structure thereof, for example, a group in which one hydrogen atom has been removed from a monocyclic or polycyclc cycloolefine can be mentioned. The cycloolefine preferably has 3 to 20 carbon atoms, and more preferably 3 to 12 carbon atoms. Examples of the cycloolefine include cyclopropene, cyclobutene, cyclopentene, cyclohexene, cycloheptene, cyclooctene, norbornene, 7-oxanorbornene, tetracyclododecene. Among these examples, norbornene is preferable.

With respect to the group in which the unsaturated aliphatic hydrocarbon cyclic group is bonded to the terminal of the aforementioned linear or branched aliphatic hydrocarbon group, the linear or branched aliphatic hydrocarbon group to which the unsaturated aliphatic hydrocarbon cyclic group is to be bonded may be saturated or unsaturated. In general, the linear or branched aliphatic hydrocarbon group is preferably saturated.

The linear or branched aliphatic hydrocarbon group preferably has 1 to 10 carbon atoms, more preferably 1 to 6, still more preferably 1 to 4, and most preferably 1 to 3.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

With respect to the group in which a chain-like alkenyl group is bonded to the terminal of the a cyclic hydrocarbon group, as the chain-like alkenyl group, the same groups as those described above can be mentioned.

The cyclic hydrocarbon group to which the chain-like alkenyl group is to be bonded may be a cyclic aliphatic hydrocarbon group (aliphatic cyclic group) or a cyclic aromatic hydrocarbon group (aromatic cyclic group).

The cyclic aliphatic hydrocarbon group may be either saturated or unsaturated. In general, the cyclic aliphatic hydrocarbon group is preferably saturated.

The aliphatic cyclic group preferably has 3 to 20 carbon atoms, and more preferably 3 to 12 carbon atoms.

The aliphatic cyclic group may be either a monocyclic group or a polycyclic group. As the monocyclic aliphatic hydrocarbon group, a group in which one hydrogen atoms have been removed from a monocycloalkane is preferable. The monocycloalkane preferably has 3 to 6 carbon atoms, and specific examples thereof include cyclopentane and cyclohexane. As the polycyclic aliphatic cyclic group, a group in which 2 hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The aromatic cyclic group is a group in which one hydrogen atom has been removed from an aromatic ring.

The aromatic hydrocarbon ring preferably has 3 to 30 carbon atoms, more preferably 5 to 30, still more preferably 5 to 20, still more preferably 6 to 15, and most preferably 6 to 10. Here, the number of carbon atoms within a substituent (s) is not included in the number of carbon atoms of the aromatic hydrocarbon group.

Examples of the aromatic ring include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

The hydrocarbon group for $R^2$ may have a hydrogen atom substituted with a substituent. Examples of substituents include a halogen atom, a hydroxy group, a hydroxyalkyl group, an alkoxy group, —$V^{21}$—$COOR^{0\prime\prime}$, and —$V^{21}$—$OC(=O)R^{0\prime\prime}$. $V^{21}$ represents a single bond or an alkylene group, and $R^{0\prime\prime}$ represents a hydrogen atom, a hydrocarbon group which may have a substituent, or an anion group.

Examples of the halogen atom for the substituent include a fluorine atom, a chlorine atom, a bromine atom and an iodine atom, and a fluorine atom is preferable.

The hydroxyalkyl group and the alkoxy group as the substituent are the same groups as defined for those described in the explanation for $Ra^{\prime 21}$.

As the alkylene group for $V^{21}$ within —$V^{21}$—$COOR^{0\prime\prime}$ and —$V^{21}$—$OC(=O)R^{0\prime\prime}$ as a substituent, a linear or branched alkylene group is preferable. Examples of the linear alkylene group or branched alkylene group include the same groups as those described above in the explanation of the linear or branched aliphatic hydrocarbon group. The alkylene group preferably has 1 to 5 carbon atoms, more preferably 1 to 3 carbon atoms, and most preferably 1 carbon atom.

Examples of the hydrocarbon group for $R^{0'''}$ which may have a substituent include a cyclic group which may have a substituent, a chain-like alkyl group which may have a substituent, and a chain-like alkenyl group which may have a substituent. These groups are the same groups as those described later for $R^{101}$ in general formula (b-1) in the explanation of the component (B).

Preferable examples of the hydrocarbon group for $R^{0'''}$ which may have a substituent include: an acid dissociable group represented by general formulas (a1-r-1) to (a1-r-2) described later;

an alkyl group same as those described later for $Ra'^{21}$; and the groups represented by the general formulae (a2-r-1) to (a2-r-7), (a5-r-1) to (a5-r-4), and (ax3-r-1) to (ax3-r-3) described later.

As an example of the anion group for $R^{0'''}$, a group represented by any one of general formulae (r-an-1) to (r-an-4) can be given.

[Chemical Formula 19]

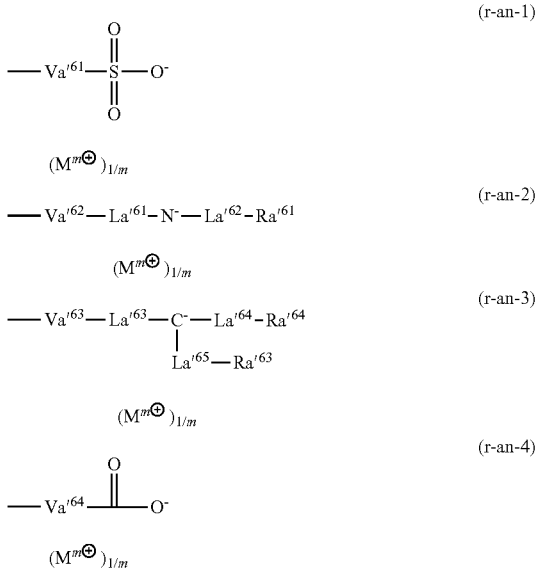

In the formulae, $Va'^{61}$ to $Va'^{64}$ represents a single bond or a divalent hydrocarbon group which may have a substituent; $La'^{61}$ and $La'^{62}$ each independently represents $-SO_2-$, $-CO-$ or a single bond; $La'^{63}$ to $La'^{65}$ each independently represents $-SO_2-$, $-CO-$ or a single bond; $Ra'^{61}$ to $Ra'^{63}$ each independently represents a hydrocarbon group which may have a substituent; and $M^{m+}$ represents an organic cation having a valency of m.

The divalent hydrocarbon group for $Va'^{61}$ to $Va'^{64}$ which may have a substituent is the same groups as those described later for the divalent hydrocarbon group in the explanation of the formula (a2-1). Among these, an alkylene group of 1 to 15 carbon atoms, an arylene group of 1 to 15 carbon atoms, or a fluorinated arylene group of 1 to 15 carbon atoms is preferable.

Examples of the hydrocarbon group for $Ra'^{61}$ to $Ra'^{63}$ which may have a substituent include the same groups as those described above for $R^{0'''}$ which may have a substituent.

Examples of the group for $R^2$ include a vinyl group, an allyl group, a fluorovinyl group, a difluorovinyl group, a trifluorovinyl group, a difluorotrifluoromethylvinyl group, a trifluoroallyl group, a perfluoroallyl group, a styryl group, a vinylnaphthyl group, a fluorine-containing styryl group, a fluorine-containing vinylnaphthyl group, a norbornyl group, a fluorine-containing norbornyl group, and a vinyl group or allyl group substituted with a hydroxy group, hydroxyalkyl group, alkoxy group, $-V^{21}-COOR^{0'''}$ or $-V^{21}-OC(=O)R^{0'''}$.

With respect to a "divalent linking group containing a hetero atom" for $L^1$, a hetero atom is an atom other than carbon and hydrogen, and examples thereof include an oxygen atom, a nitrogen atom, a sulfur atom and a halogen atom.

When $L^1$ is a divalent linking group containing a hetero atom, the linking group preferably contains at least one atom selected from the group consisting of an oxygen atom, a sulfur atom and a nitrogen atom, and examples thereof include $-C(=O)-O-V^1-C(=O)-$, $-C(=O)-O-V^2-O-V^1-C(=O)-$, $-C(=O)-O-V^3-C(=O)-O-V^1-C(=O)-$, $-C(=O)-O-$, $-C(=O)-O-Ar-O-R^{11}-C(=O)-$, $-C(=O)-NH-V^1-C(=O)-$, $-C(=O)-NH-Ar-C(=O)-$, $-C(=O)-O-V^4-NH-C(=O)-$, $-C(=O)-$, $-S(=O)_2-$, $-C(=O)-O-V^5-$, $-O-V^5-$, and $-O-V^1-C(=O)-$.

In the formulae, $V^1$ to $V^5$ each independently represents an alkylene group, and Ar represents an arylene group.

The alkylene group for $V^1$ to $V^5$ may be chain-like or cyclic. The chain-like alkylene group may be linear or branched, and examples thereof include the same linear alkylene groups and branched alkylene groups as those described above for the linear or branched aliphatic hydrocarbon group. As the cyclic alkylene group, a group in which one hydrogen atom has been removed from the aforementioned aliphatic cyclic group can be mentioned.

As the alkylene group for $V^1$, $V^3$ and $V^5$, a linear or branched alkylene group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

As the alkylene group for $V^2$ and $V^4$, a linear or branched alkylene group is preferable, more preferably a linear alkylene group, still more preferably a linear alkylene group of 1 to 5 carbon atoms, and most preferably an ethylene group.

As the arylene group for Ar, a group in which one hydrogen atom has been removed from the aforementioned aromatic cyclic group can be mentioned. As the arylene group, a phenylene group or a naphthylene group is particularly desirable.

Among these examples, as the divalent linking group containing a hetero atom for $L^1$, a group in which the terminal structure at the side of the oxygen atom adjacent to $W^2$ (i.e., oxygen atom ($-O-$) bonded to $R^1$) has $-C(=O)-$ or an alkylene group (e.g., $V^5$) is preferable, and a group in which the terminal structure at the side of the oxygen atom adjacent to $W^2$ has $-C(=O)-$ is more preferable in terms of ease in synthesis.

As the group for $W^2$ containing a polymerizable group, a group represented by $CH_2=C(R)-V^{10}-L^1-$ [in the formula, R represents a hydrogen atom, an alkyl group of 1 to 5 carbon atoms, a halogenated alkyl group of 1 to 5 carbon atoms, a hydroxyalkyl group, an alkoxy group, —$V^{21}$—COOR$^{0''}$ or —$V^{21}$—OC(=O)R$^{0''}$, wherein $V^{10}$ represents an arylene group, an alkylene group or a single bond, and $L^1$ represents a divalent linking group containing a hetero atom or a single bond] is particularly preferable.

In the formula, A'', $R^1$ and $L^1$ are the same as defined above.

R represents a hydrogen atom, an alkyl group of 1 to 5 carbon atoms, a halogenated alkyl group of 1 to 5 carbon atoms, a hydroxyalkyl group, an alkoxy group, —$V^{21}$—COOR$^{0''}$ or —$V^{21}$—OC(=O)R$^{0''}$.

As the alkyl group of 1 to 5 carbon atoms for R, a linear or branched alkyl group is preferable, and specific examples thereof include a methyl group, an ethyl group, a propyl group, an isopropyl group, an n-butyl group, an isobutyl group, a tert-butyl group, a pentyl group, an isopentyl group and a neopentyl group.

Examples of the halogenated alkyl group of 1 to 5 carbon atoms for R include groups in which part or all of the hydrogen atoms within the aforementioned alkyl groups of 1 to 5 carbon atoms has been substituted with a halogen atom. Examples of the halogen atom include a fluorine atom, a chlorine atom, a bromine atom and an iodine atom, and a fluorine atom is particularly desirable.

The hydroxyalkyl group, alkoxy group, —$V^{21}$—COOR$^{0''}$ and —$V^{21}$—OC(=O)R$^{0''}$ for R are the same groups as defined for those described in the explanation for $R^2$.

As R, a hydrogen atom or a methyl group is particularly desirable in terms of industrial availability.

As the arylene group for $V^{10}$, a group in which one hydrogen atom has been removed from the aforementioned aromatic cyclic group can be mentioned. As the arylene group, a phenylene group or a naphthylene group is particularly desirable.

The alkylene group for $V^{10}$ may be chain-like or cyclic. The chain-like alkylene group may be linear or branched, and examples thereof include the same linear alkylene groups and branched alkylene groups as those described above for the linear or branched aliphatic hydrocarbon group. As the cyclic alkylene group, a group in which one hydrogen atom has been removed from the aforementioned aliphatic cyclic group can be mentioned.

As the group for $Y^{10}$, an arylene group or a single bond is preferable, and a phenylene group, a naphthylene group or a single bond is particularly preferable.

In the case where the group for $W^2$ containing a polymerizable group is $CH_2$=C(R)—$V^{10}$-$L^1$-, $W^2$ represents a structure formed by the cleavage of the ethylenic double bond.

That is, in the case where the group containing a polymerizable group is $CH_2$=C(R)—$V^{10}$-$L^1$-, the structural unit (a0) is a structural unit represented by general formula (a0-1) shown below.

In the formula (a0-1), R, $V^{10}$, $L^1$, A'' and $R^1$ are the same as defined above.

[Chemical Formula 20]

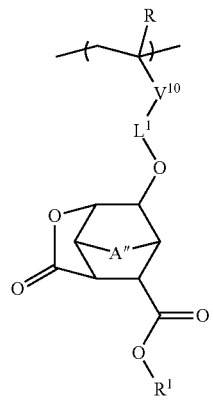

(a0-1)

In the formula, R represents a hydrogen atom, an alkyl group of 1 to 5 carbon atoms, a halogenated alkyl group of 1 to 5 carbon atoms, a hydroxyalkyl group, an alkoxy group, —$V^{21}$—COOR$^{0''}$ or —$V^{21}$—OC(=O)R$^{0''}$; A'' represents an oxygen atom, a sulfur atom or an alkylene group of 1 to 5 carbon atoms with or without an oxygen atom or a sulfur atom; $R^1$ represents a lactam-containing cyclic group or a sultam-containing cyclic group; $V^{10}$ represents an arylene group, an alkylene group or a single bond; $L^1$ represents a divalent linking group containing a hetero atom or a single bond; $V^{21}$ represents a single bond or an alkylene group; and $R^{0''}$ represents a hydrogen atom, a hydrocarbon group with or without a substituent, or an anion group.

In formula (a0-0), $Y^1$ represents an oxygen atom (—O—), an ester bond (—C(=O)—O—) or a single bond.

In the present embodiment, the structural unit (a0) is preferably represented by general formula (a0-1-1) shown below.

[Chemical Formula 21]

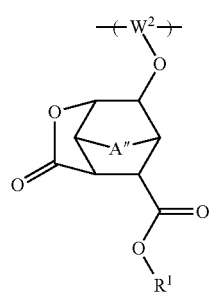

(a0-1-1)

In the formula, A'' represents an oxygen atom, a sulfur atom or an alkylene group of 1 to 5 carbon atoms with or without an oxygen atom or a sulfur atom; $R^1$ represents a lactam-containing cyclic group or a sultam-containing cyclic group; and $W^2$ represents a group which is formed by polymerization reaction of a group containing a polymerizable group.

In formula (a0), A'', $R^1$ and $W^2$ are the same as defined above.

Specific examples of monomers which derive the structural unit (a0), that is, specific examples of compounds represented by formula (a0), provided that $W^2$ represents a group containing a polymerizable group, are shown below. In the formulae, R is the same as defined above.

These compounds can be classified as compounds of the fourth aspect of the present invention. The structural units derived from these compound have a structure in which the ethylenic double bond portion ($CH_2=C(R)$) is converted into $—(CH_2—C(R))—$.
[Chemical Formula 22]
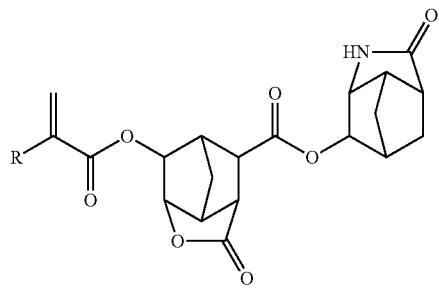
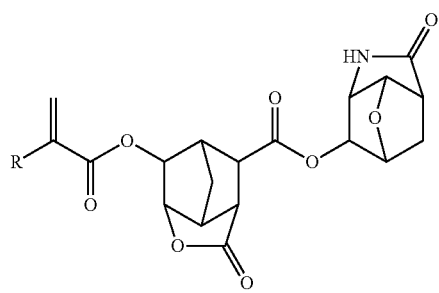
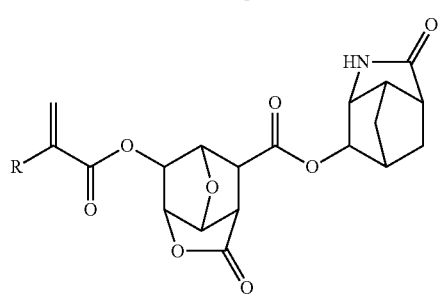
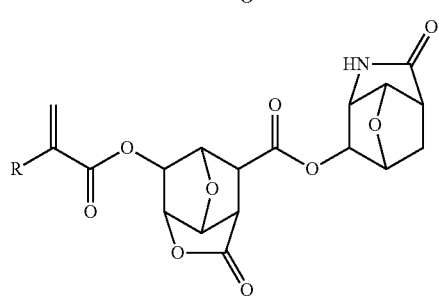
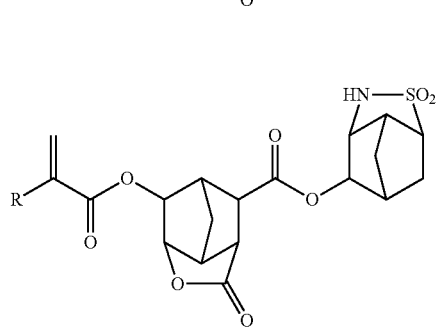
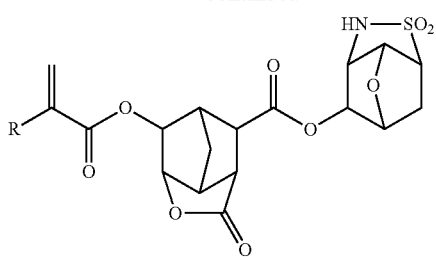
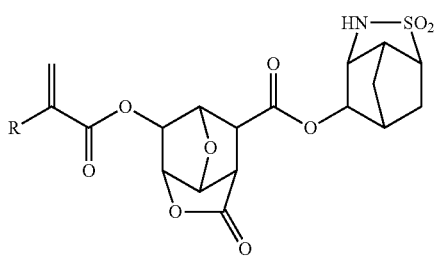
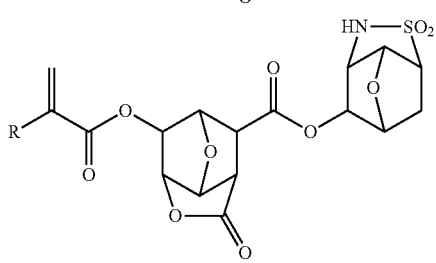
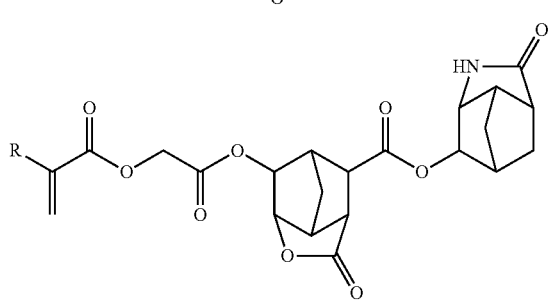
[Chemical Formula 23]
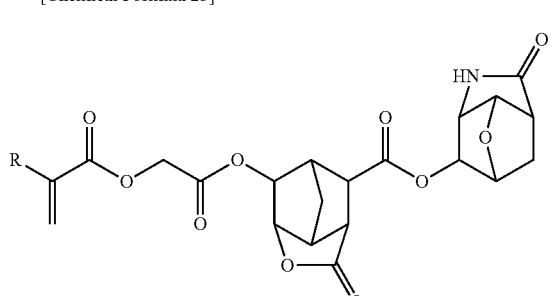
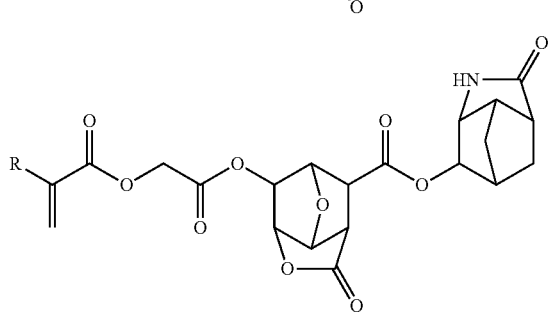

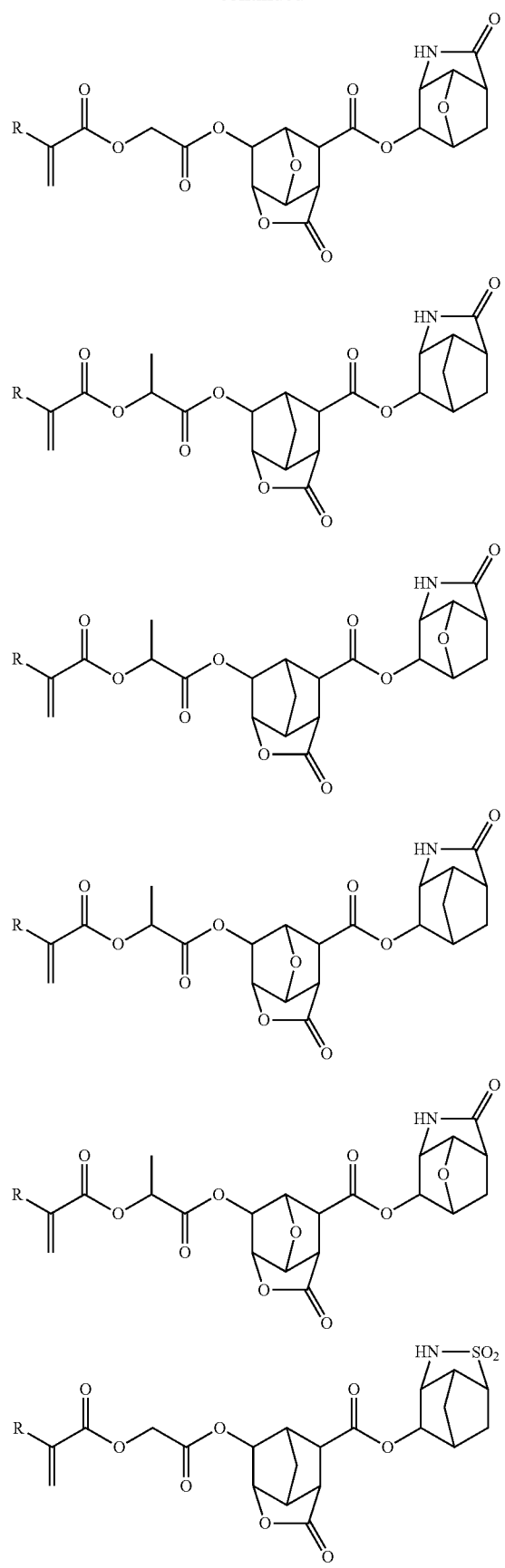
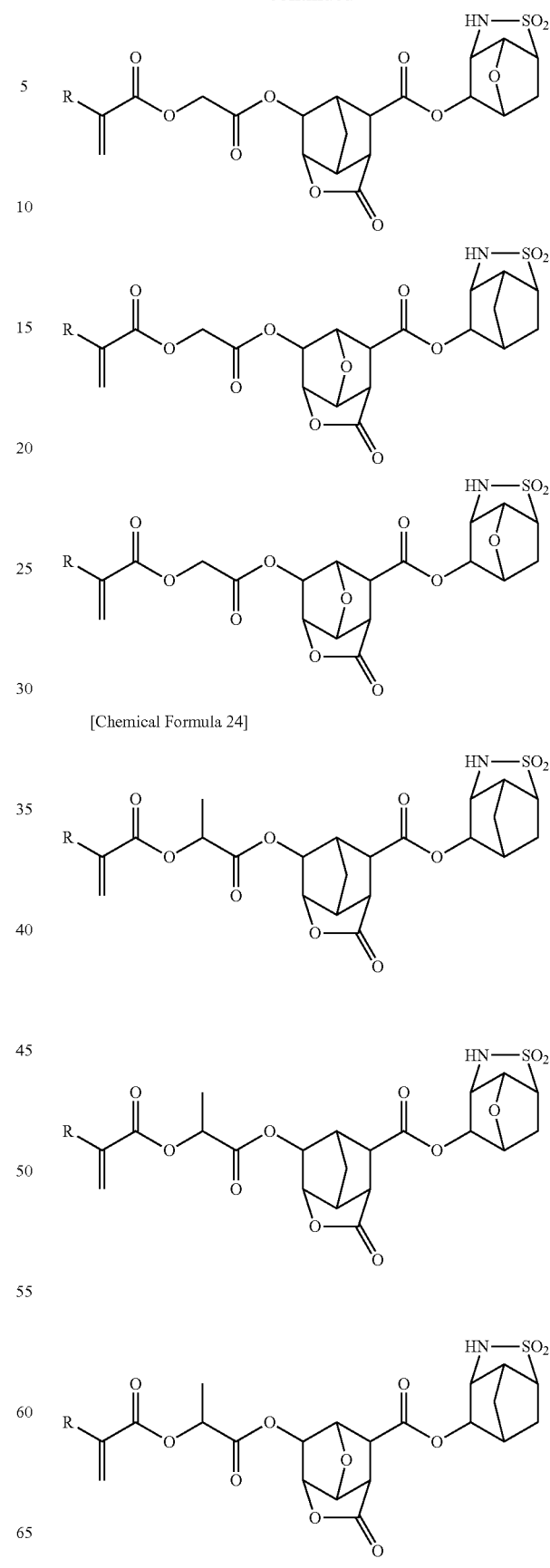
[Chemical Formula 24]

39
-continued
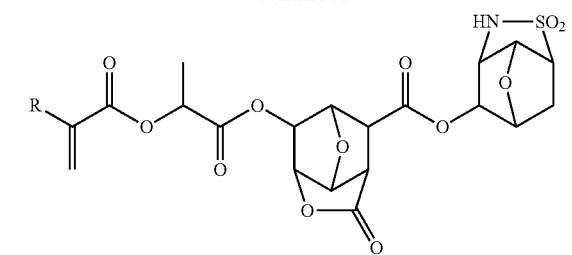
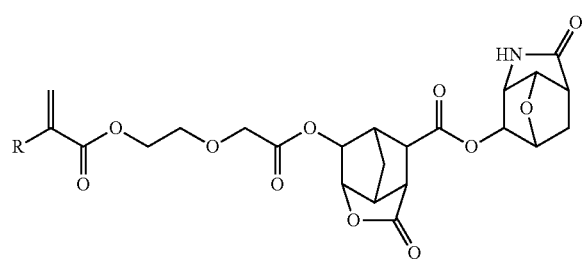
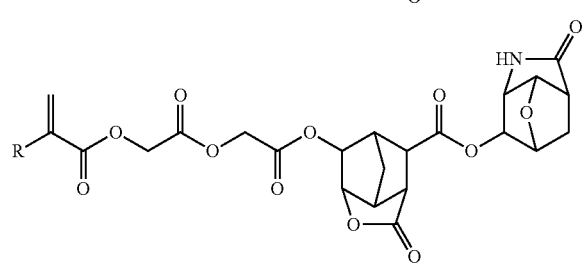
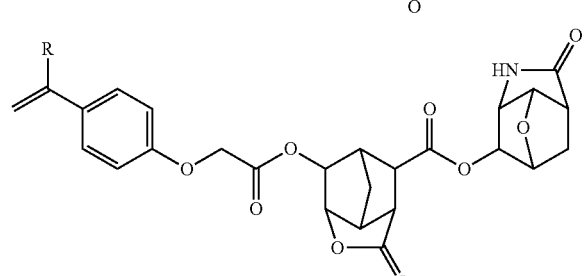
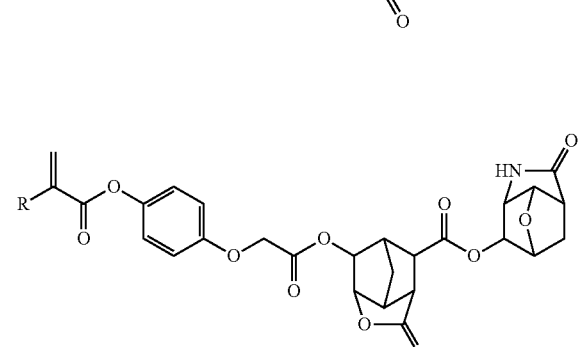
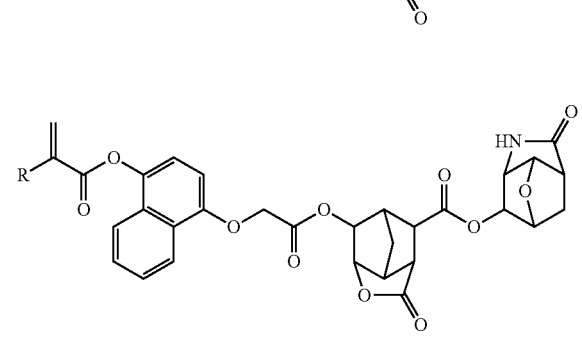
40
-continued
[Chemical Formula 25]
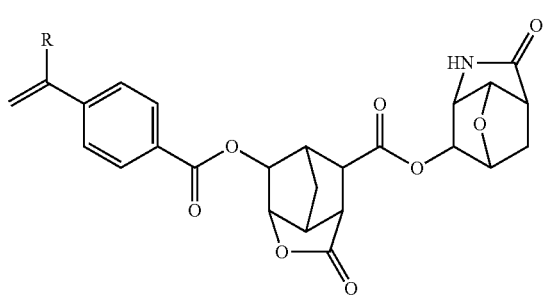
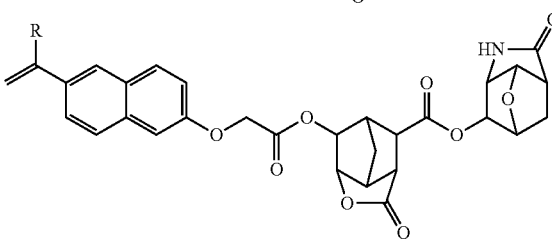
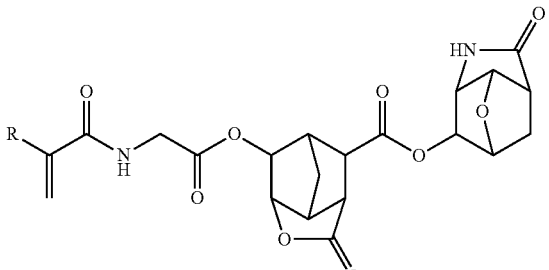
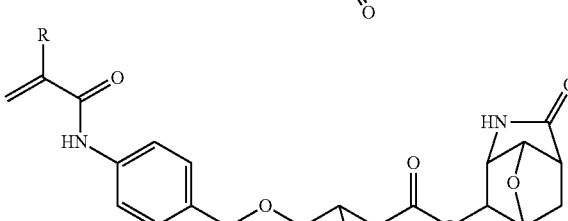
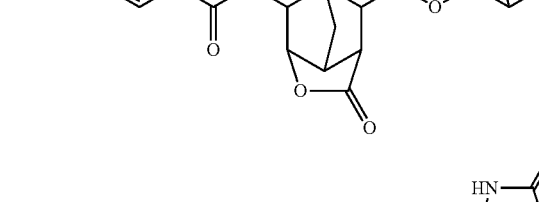
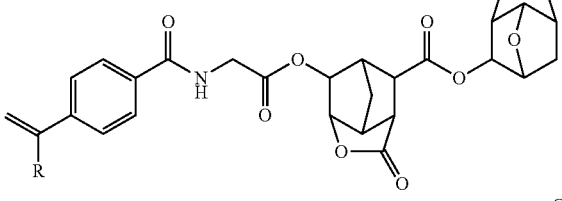
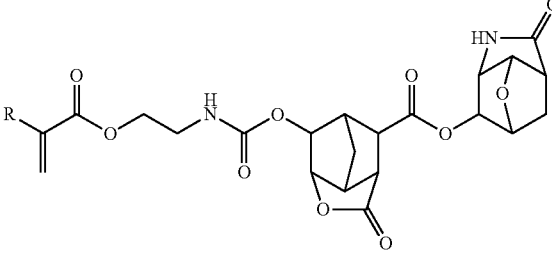

[Chemical Formula 26]

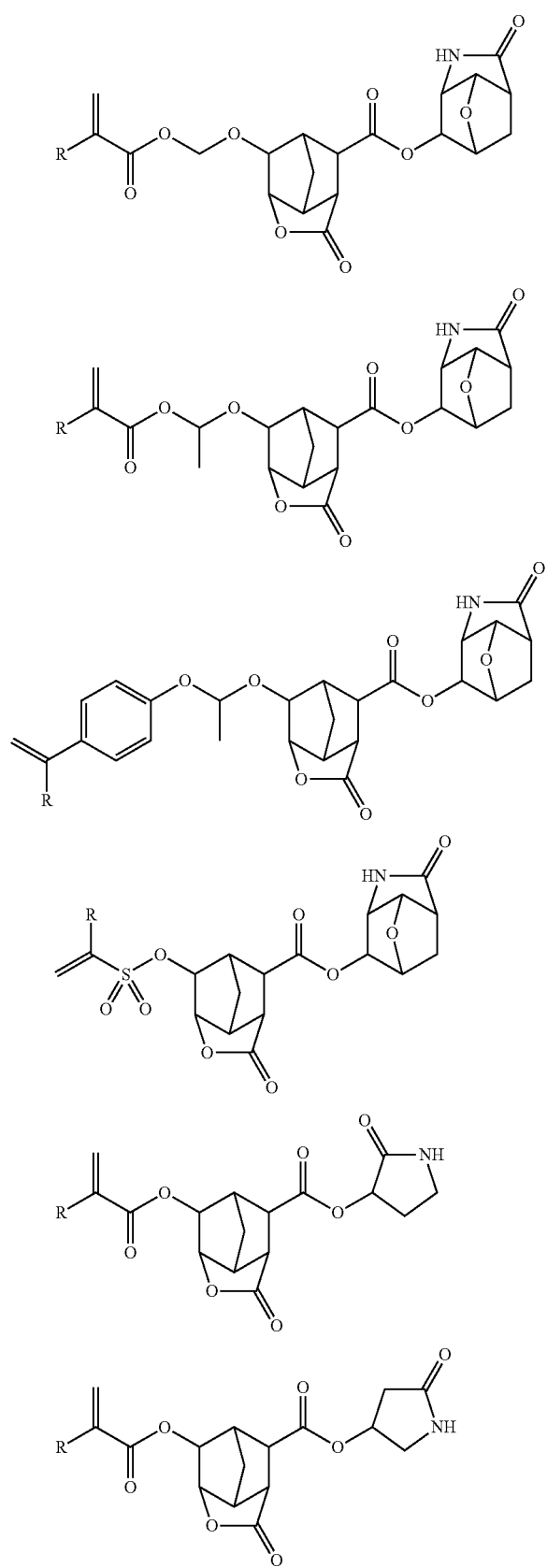
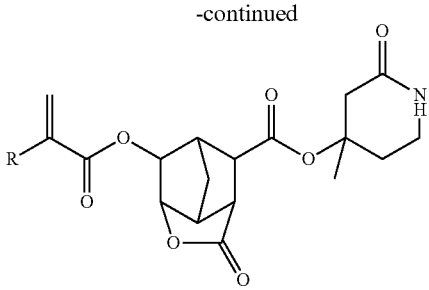

As the structural unit (a0) contained in the component (A1), 1 kind of structural unit may be used, or 2 or more kinds of structural units may be used.

The amount of the structural unit (a0) within the component (A1) based on the combined total of all structural units constituting the component (A1) is preferably 5 to 70 mol %, more preferably 5 to 60 mol %, and still more preferably 10 to 40 mol %.

When the amount of the structural unit (a0) is at least as large as the lower limit of the above-mentioned range, the effects of including the structural unit (a0) (adhesion between the resist film and the substrate, contrast, and the like) can be satisfactorily achieved. On the other hand, when the amount of the structural unit (a0) is no more than the upper limit of the above-mentioned range, a good balance can be achieved with the other structural units, and various lithography properties such as the in-plane uniformity (CDU) of the pattern dimension, the exposure latitude, the mask reproducibility, drawing reproducibility can be improved.

In the present embodiment, the polymeric compound (A1) preferably has a structural unit (a1) containing an acid decomposable group that exhibits increased polarity by the action of acid.

(Structural Unit (a1))

The structural unit (a1) is a structural unit containing an acid decomposable group that exhibits increased polarity by the action of acid.

The term "acid decomposable group" refers to a group in which at least a part of the bond within the structure thereof is cleaved by the action of an acid.

Examples of acid decomposable groups which exhibit increased polarity by the action of an acid include groups which are decomposed by the action of an acid to form a polar group.

Examples of the polar group include a carboxy group, a hydroxy group, an amino group and a sulfo group (—SO$_3$H). Among these, a polar group containing —OH in the structure thereof (hereafter, referred to as "OH-containing polar group") is preferable, a carboxy group or a hydroxy group is more preferable, and a carboxy group is particularly desirable.

More specifically, as an example of an acid decomposable group, a group in which the aforementioned polar group has been protected with an acid dissociable group (such as a group in which the hydrogen atom of the OH-containing polar group has been protected with an acid dissociable group) can be given.

Here, the "acid dissociable group" includes:

(i) a group in which the bond between the acid dissociable group and the adjacent atom is cleaved by the action of acid; and (ii) a group in which one of the bonds is cleaved by the action of acid, and then a decarboxylation reaction occurs, thereby cleaving the bond between the acid dissociable group and the adjacent atom.

It is necessary that the acid dissociable group that constitutes the acid decomposable group is a group which exhibits a lower polarity than the polar group generated by the dissociation of the acid dissociable group. Thus, when the acid dissociable group is dissociated by the action of acid, a polar group exhibiting a higher polarity than that of the acid dissociable group is generated, thereby increasing the polarity. As a result, the polarity of the entire component (A1) is increased. By the increase in the polarity, the solubility in an alkali developing solution changes and, the solubility in an organic developing solution is relatively decreased.

The acid dissociable group is not particularly limited, and any of the groups that have been conventionally proposed as acid dissociable groups for the base resins of chemically amplified resists can be used.

Examples of the acid dissociable group for protecting the carboxy group or hydroxy group as a polar group include the acid dissociable group represented by general formula (a1-r-1) shown below (hereafter, for the sake of convenience, sometimes referred to as "acetal-type acid dissociable group").

[Chemical Formula 27]

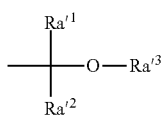

(a1-r-1)

In the formula, $Ra'^1$ and $Ra'^2$ represents a hydrogen atom or an alkyl group; and $Ra'^3$ represents a hydrocarbon group, provided that $Ra'^3$ may be bonded to $Ra'^1$ or $Ra'^2$.

In formula (a1-r-1), as the lower alkyl group for $Ra'^1$ and $Ra'^2$, the same lower alkyl groups as those described above the alkyl groups as the substituent which may be bonded to the carbon atom on the α-position of the aforementioned α-substituted alkylester can be used, although a methyl group or ethyl group is preferable, and a methyl group is particularly desirable.

The hydrocarbon group for $Ra'^3$ is preferably an alkyl group of 1 to 20 carbon atoms, more preferably an alkyl group of 1 to 10 carbon atoms, and still more preferably a linear or branched alkyl group. Specific examples thereof include a methyl group, an ethyl group, a propyl group, an isopropyl group, an n-butyl group, an isobutyl group, a tert-butyl group, a pentyl group, an isopentyl group, a neopentyl group, a 1,1-dimethylethyl group, a 1,1-diethylpropyl group, a 2,2-dimethylpropyl group and a 2,2-dimethylbutyl group.

In the case where $Ra'^3$ represents a cyclic hydrocarbon group, the cyclic hydrocarbon group may be aliphatic or aromatic, and may be polycyclic or monocyclic. As the monocyclic aliphatic hydrocarbon group, a group in which 1 hydrogen atom has been removed from a monocycloalkane is preferable. The monocycloalkane preferably has 3 to 8 carbon atoms, and specific examples thereof include cyclopentane, cyclohexane and cyclooctane. As the polycyclic group, a group in which 1 hydrogen atom has been removed from a polycycloalkane is preferable, and the polycyclic group preferably has 7 to 12 carbon atoms.

Examples of the polycycloalkane include adamantane, norbornane, isobornane, tricyclodecane and tetracyclododecane.

In the case where the hydrocarbon group is an aromatic hydrocarbon group, examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group include a group in which 1 hydrogen atom has been removed from the aforementioned aromatic hydrocarbon ring (aryl group); and a group in which 1 hydrogen atom of the aforementioned aryl group has been substituted with an alkylene group (an arylalkyl group such as a benzyl group, a phenethyl group, a 1-naphthylmethyl group, a 2-naphthylmethyl group, a 1-naphthylethyl group or a 2-naphthylethyl group). The alkylene group (alkyl chain within the arylalkyl group) preferably has 1 to 4 carbon atom, more preferably 1 or 2, and most preferably 1.

In the case where $Ra'^3$ is bonded to $Ra'^1$ or $Ra'^2$ to form a ring, the cyclic group is preferably a 4 to 7-membered ring, and more preferably a 4 to 6-membered ring. Specific examples of the cyclic group include tetrahydropyranyl group and tetrahydrofuranyl group.

Examples of the acid dissociable group for protecting the carboxy group as a polar group include the acid dissociable group represented by general formula (a1-r-2) shown below (hereafter, with respect to the acid dissociable group represented by the following formula (a1-r-2), the acid dissociable group constituted of alkyl groups is referred to as "tertiary ester-type acid dissociable group").

[Chemical Formula 28]

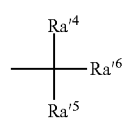

(a1-r-2)

In the formula, $Ra'^4$ to $Ra'^6$ each independently represents a hydrocarbon group, provided that $Ra'^5$ and $Ra'^6$ may be mutually bonded to form a ring.

As the hydrocarbon group for $Ra'^4$ to $Ra'^6$, the same groups as those described above for $Ra'^3$ can be mentioned. $Ra'^4$ is preferably an alkyl group having from 1 to 5 carbon atoms. In the case where $Ra'^5$ and $Ra'^6$ are mutually bonded to form a ring, a group represented by general formula (a1-r2-1) shown below can be mentioned.

On the other hand, in the case where $Ra'^4$ to $Ra'^6$ are not mutually bonded and independently represent a hydrocarbon group, the group represented by general formula (a1-r2-2) shown below can be mentioned.

[Chemical Formula 29]

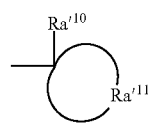

(a1-r2-1)

(a1-r2-2)

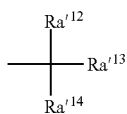

In the formulae, $Ra'^{10}$ represents an alkyl group of 1 to 10 carbon atoms; $Ra'^{11}$ is a group which forms an aliphatic cyclic group together with a carbon atom having $Ra'^{10}$ bonded thereto; and $Ra'^{12}$ to $Ra'^{14}$ each independently represents a hydrocarbon group.

In the formula (a1-r2-1), as the alkyl group of 1 to 10 carbon atoms for $Ra'^{10}$, the same groups as described above for the linear or branched alkyl group for $Ra'^{3}$ in the formula (a1-r-1) are preferable. In the formula (a1-r2-1), as the aliphatic cyclic group which is formed by $Ra'^{11}$, the same groups as those described above for the cyclic alkyl group for $Ra'^{3}$ in the formula (a1-r-1) are preferable.

In the formula (a1-r2-2), it is preferable that $Ra'^{12}$ and $Ra'^{14}$ each independently represents an alkyl group or 1 to 10 carbon atoms, and it is more preferable that the alkyl group is the same group as the described above for the linear or branched alkyl group for $Ra'^{3}$ in the formula (a1-r-1), it is still more preferable that the alkyl group is a linear alkyl group of 1 to 5 carbon atoms, and it is particularly preferable that the alkyl group is a methyl group or an ethyl group.

In the formula (a1-r2-2), it is preferable that $Ra'^{13}$ is the same group as described above for the linear, branched or cyclic alkyl group for $Ra'^{3}$ in the formula (a1-r-1).

Among these, the same cyclic alkyl group as those describe above for $Ra'^{3}$ is more preferable.

Specific examples of the formula (a1-r2-1) are shown below. In the formulae shown below, "*" represents a valence bond.

[Chemical Formula 30]

(r-pr-m1)

(r-pr-m2)

(r-pr-m3)

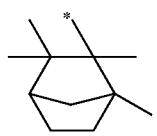

(r-pr-m4)

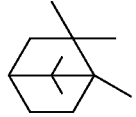

(r-pr-m5)

(r-pr-m6)

(r-pr-m7)

(r-pr-m8)

(r-pr-m9)

(r-pr-m10)

(r-pr-m11)

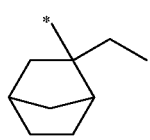

(r-pr-m12)

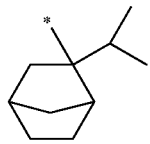

(r-pr-m13)

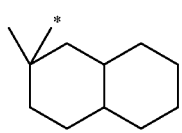

(r-pr-m14)

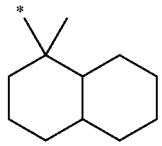

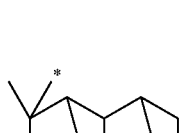

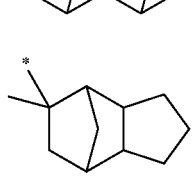

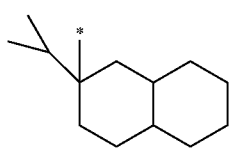
(r-pr-m15)
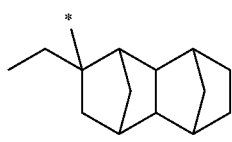
(r-pr-m16)
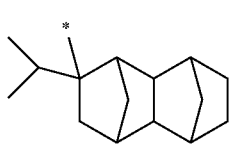
(r-pr-m17)
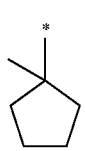
(r-pr-s1)
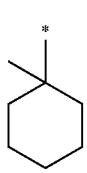
(r-pr-s2)
(r-pr-s3)
(r-pr-s4)
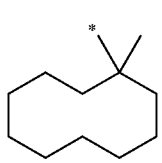
(r-pr-s5)
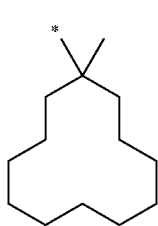
(r-pr-s6)
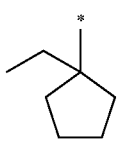
(r-pr-s7)
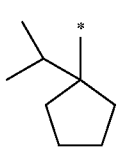
(r-pr-s8)
(r-pr-s9)
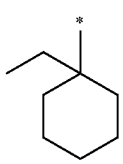
(r-pr-s10)
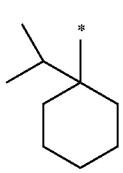
(r-pr-s11)
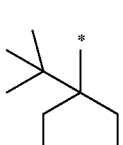
(r-pr-s12)
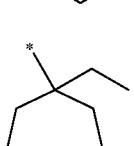
(r-pr-s13)
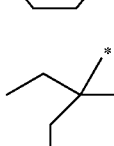
(r-pr-s14)
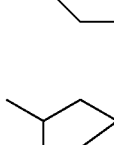
(r-pr-s15)
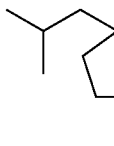
(r-pr-s16)

(r-pr-s17)
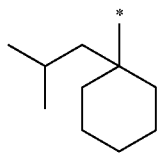
(r-pr-s18)
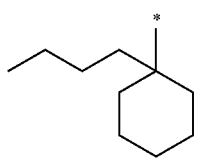
(r-pr-s19)
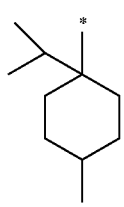
Specific examples of the formula (a1-r2-2) are shown below.
[Chemical Formula 31]
(r-pr-cm1)
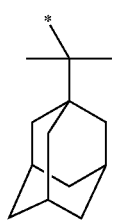
(r-pr-cm2)
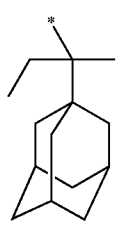
(r-pr-cm3)
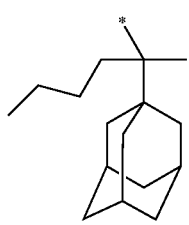
(r-pr-cm4)
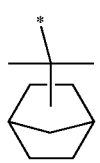
(r-pr-cm5)
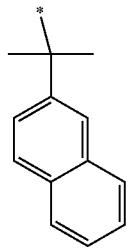
(r-pr-cm6)
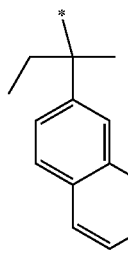
(r-pr-cm7)
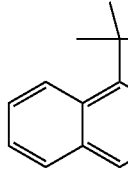
(r-pr-cm8)
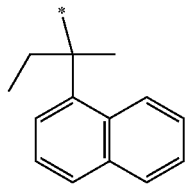
(r-pr-cs-1)
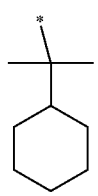
(r-pr-cs-2)
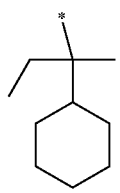
(r-pr-cs-3)
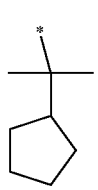

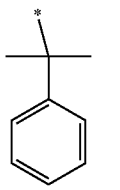 (r-pr-cs-4)

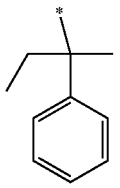 (r-pr-cs-5)

 (r-pr-c1)

 (r-pr-c2)

 (r-pr-c3)

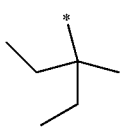 (r-pr-c4)

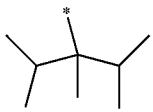 (r-pr-c5)

Examples of the acid dissociable group for protecting a hydroxy group as a polar group include the acid dissociable group represented by general formula (a1-r-3) shown below (hereafter, referred to as "tertiary alkyloxycarbonyl-type acid dissociable group").

[Chemical Formula 32]

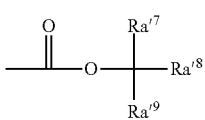 (a1-r-3)

In the formula, $Ra'^7$ to $Ra'^9$ each independently represents an alkyl group.

In the formula (a1-r-3), $Ra'^7$ to $Ra'^9$ is preferably an alkyl group of 1 to 5 carbon atoms, and more preferably an alkyl group of 1 to 3 carbon atoms.

Further, the total number of carbon atoms within the alkyl group is preferably 3 to 7, more preferably 3 to 5, and most preferably 3 or 4.

Examples of the structural unit (a1) include a structural unit derived from an acrylate ester which may have the hydrogen atom bonded to the carbon atom on the α-position substituted with a substituent and contains an acid decomposable group which exhibits increased polarity by the action of acid; a structural unit derived from hydroxystyrene or a hydroxystyrene derivative in which at least a part of the hydrogen atom of the hydroxy group is protected with a substituent containing an acid decomposable group; and a structural unit derived from vinylbenzoic acid or a vinylbenzoic acid derivative in which at least a part of the hydrogen atom within —C(=O)—OH is protected with a substituent containing an acid decomposable group.

As the structural unit (a1), a structural unit derived from an acrylate ester which may have the hydrogen atom bonded to the carbon atom on the α-position substituted with a substituent is preferable.

As the structural unit (a1), structural units represented by general formulae (a1-1) to (a1-3) shown below are preferable.

[Chemical Formula 33]

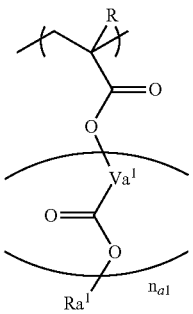 (a1-1)

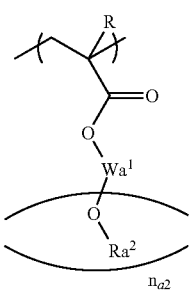 (a1-2)

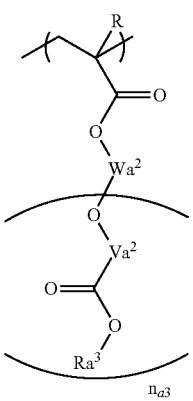 (a1-3)

In the formulae, R represents a hydrogen atom, an alkyl group of 1 to 5 carbon atoms or a halogenated alkyl group of 1 to 5 carbon atoms; $Va^1$ represents a divalent hydrocarbon group which may have an ether bond, an urethane bond or an amide bond; $n_{a1}$ represents an integer of 0 to 2;

$Ra^1$ represents an acid dissociable group represented by the aforementioned formula (a1-r-1) or (a1-r-2);

$Wa^1$ represents a hydrocarbon group having a valency of $n_{a2}+1$; $n_{a2}$ represents an integer of 1 to 3;

$Ra^2$ represents an acid dissociable group represented by the aforementioned formula (a1-r-1) or (a1-r-3);

$Wa^2$ represents a hydrocarbon group having a valency of $n_{a3}+1$; $n_{a3}$ represents an integer of 1 to 3;

$Va^2$ represents a divalent hydrocarbon group which may have an ether bond, an urethane bond or an amide bond;

and $Ra^3$ represents an acid dissociable group represented by the aforementioned formula (a1-r-1) or (a1-r-2).

In general formulae (a1-1) to (a1-3), as the alkyl group of 1 to 5 carbon atoms for R, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group. The halogenated alkyl group of 1 to 5 carbon atoms represented by R is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In general formula (a1-1), the hydrocarbon group for $Va^1$ may be either an aliphatic hydrocarbon group or an aromatic hydrocarbon group. An "aliphatic hydrocarbon group" refers to a hydrocarbon group that has no aromaticity. The aliphatic hydrocarbon group as the divalent hydrocarbon group for $Va^1$ may be either saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

Further, as the group for $Va^1$, a group in which the aforementioned divalent hydrocarbon group has been bonded via an ether bond, urethane bond or amide bond can be mentioned.

The linear or branched aliphatic hydrocarbon group preferably has 1 to 10 carbon atoms, more preferably 1 to 6, still more preferably 1 to 4, and most preferably 1 to 3.

As the linear aliphatic hydrocarbon group, a linear alkylene group is preferable. Specific examples thereof include a methylene group [—$CH_2$—], an ethylene group [—($CH_2$)$_2$—], a trimethylene group [—($CH_2$)$_3$—], a tetramethylene group [—($CH_2$)$_4$—] and a pentamethylene group [—($CH_2$)$_5$—].

As the branched aliphatic hydrocarbon group, branched alkylene groups are preferred, and specific examples include various alkylalkylene groups, including alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)—, and —C($CH_2CH_3$)$_2$—; alkylethylene groups such as —CH($CH_3$)$CH_2$—, —CH($CH_3$)CH($CH_3$)—, —C($CH_3$)$_2CH_2$—, —CH($CH_2CH_3$)$CH_2$—, and —C($CH_3$)$_2$—$CH_2$—; alkyltrimethylene groups such as —CH($CH_3$)$CH_2CH_2$—, and —$CH_2$CH($CH_3$)$CH_2$—; and alkyltetramethylene groups such as —CH($CH_3$)$CH_2CH_2CH_2$—, and —$CH_2$CH($CH_3$)$CH_2CH_2$—. As the alkyl group within the alkylalkylene group, a linear alkyl group of 1 to 5 carbon atoms is preferable.

As examples of the hydrocarbon group containing a ring in the structure thereof, an alicyclic hydrocarbon group (a group in which two hydrogen atoms have been removed from an aliphatic hydrocarbon ring), a group in which the alicyclic hydrocarbon group is bonded to the terminal of the aforementioned chain-like aliphatic hydrocarbon group, and a group in which the alicyclic group is interposed within the aforementioned linear or branched aliphatic hydrocarbon group, can be given. As the linear or branched aliphatic hydrocarbon group, the same groups as those described above can be used.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic aliphatic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane. As the polycyclic group, a group in which two hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The aromatic hydrocarbon group is a hydrocarbon group having an aromatic ring.

The aromatic hydrocarbon group as the divalent hydrocarbon group for $Va^1$ preferably has 3 to 30 carbon atoms, more preferably 5 to 30, still more preferably 5 to 20, still more preferably 6 to 15, and most preferably 6 to 10. Here, the number of carbon atoms within a substituent(s) is not included in the number of carbon atoms of the aromatic hydrocarbon group.

Examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group include a group in which two hydrogen atoms have been removed from the aforementioned aromatic hydrocarbon ring (arylene group); and a group in which one hydrogen atom has been removed from the aforementioned aromatic hydrocarbon ring (aryl group) and one hydrogen atom has been substituted with an alkylene group (such as a benzyl group, a phenethyl group, a 1-naphthylmethyl group, a 2-naphthylmethyl group, a 1-naphthylethyl group, or a 2-naphthylethyl group). The alkylene group (alkyl chain within the arylalkyl group) preferably has 1 to 4 carbon atom, more preferably 1 or 2, and most preferably 1.

In the aforementioned formula (a1-2), the hydrocarbon group for $Wa^1$ having a valency of $n_{a2}+1$ may be either an aliphatic hydrocarbon group or an aromatic hydrocarbon group. The aliphatic cyclic group refers to a hydrocarbon group that has no aromaticity, and may be either saturated or unsaturated, but is preferably saturated. Examples of the aliphatic hydrocarbon group include a linear or branched aliphatic hydrocarbon group, an aliphatic hydrocarbon group containing a ring in the structure thereof, and a combination of the linear or branched aliphatic hydrocarbon group and the aliphatic hydrocarbon group containing a ring in the structure thereof. As the specific examples thereof, the same groups as those described above for $Va^1$ in the aforementioned formula (a1-1) can be mentioned.

The valency of $n_{a2}+1$ is preferably divalent, trivalent or tetravalent, and divalent or trivalent is more preferable.

In the aforementioned formula (a1-3), the hydrocarbon group for $Wa^1$ having a valency of $n_{a3}+1$ may be either an aliphatic hydrocarbon group or an aromatic hydrocarbon group. The aliphatic cyclic group refers to a hydrocarbon group that has no aromaticity, and may be either saturated or unsaturated, but is preferably saturated. Examples of the aliphatic hydrocarbon group include a linear or branched aliphatic hydrocarbon group, an aliphatic hydrocarbon group containing a ring in the structure thereof, and a combination of the linear or branched aliphatic hydrocarbon group and the aliphatic hydrocarbon group containing a ring in the structure thereof. As the specific examples thereof, the same groups as those described above for $Va^1$ in the aforementioned formula (a1-1) can be mentioned.

The valency of $n_{a3}+1$ is preferably divalent, trivalent or tetravalent, and divalent or trivalent is more preferable.

In formula (a1-3), examples of $Va^2$ are the same as defined for the groups for $Va^1$ in formula (a1-1).

As the structural unit (a1-2), a structural unit represented by general formula (a1-2-01) shown below is particularly desirable.

[Chemical Formula 34]

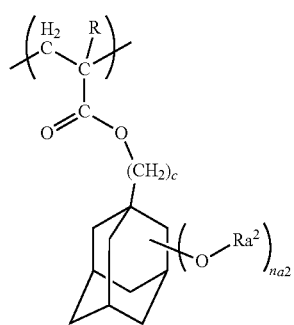

(a-1-2-01)

In the formula (a1-2-01), $Ra^2$ represents an acid dissociable group represented by the aforementioned formula (a1-r-1) or (a1-r-3); $n_{a2}$ is an integer of 1 to 3, preferably 1 or 2, and more preferably 1; c is an integer of 0 to 3, preferably 0 or 1, and more preferably 1; R is the same as defined above.

Specific examples of the structural units (a1-1) and (a1-2) are shown below. In the formulae shown below, $R^\alpha$ represents a hydrogen atom, a methyl group or a trifluoromethyl group.

[Chemical Formula 35]

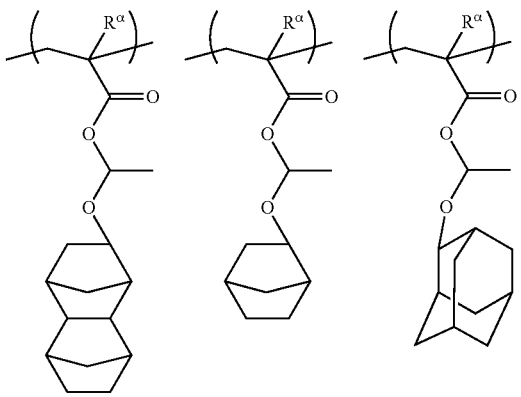

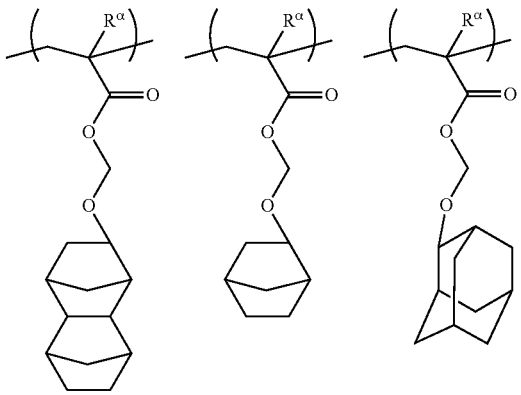

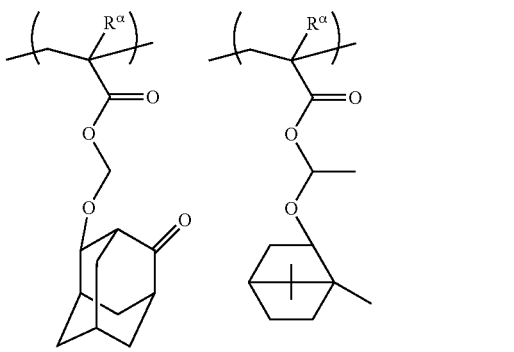

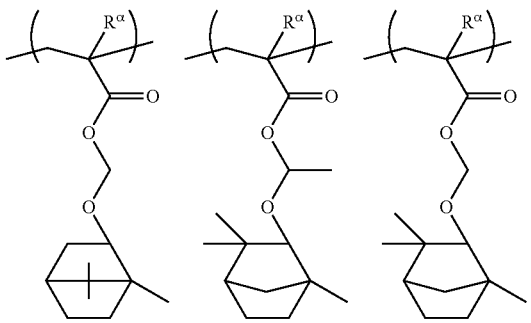

[Chemical Formula 36]
[Chemical Formula 37]
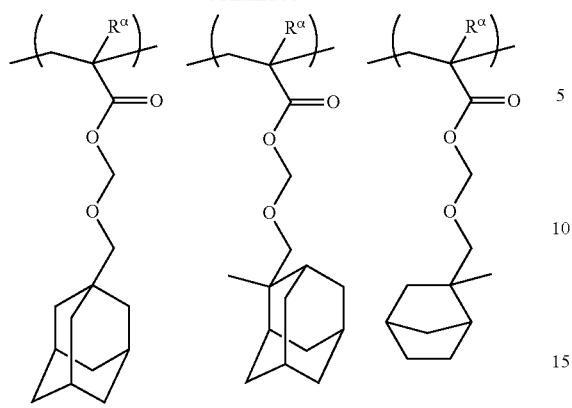
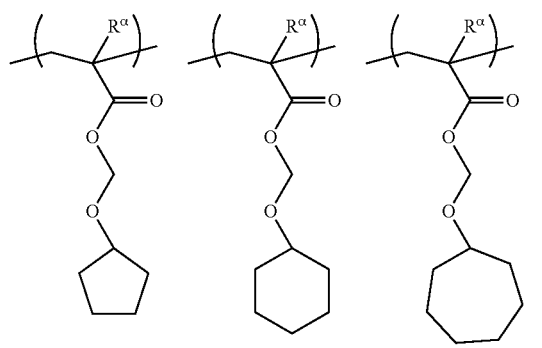
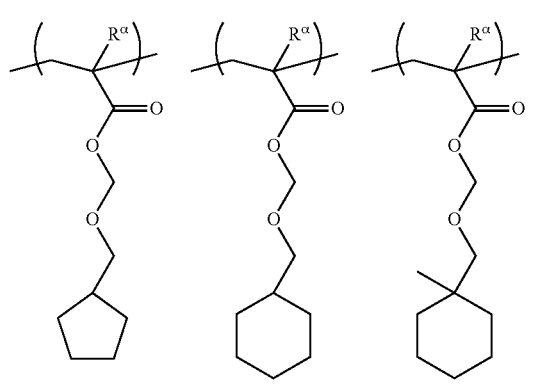
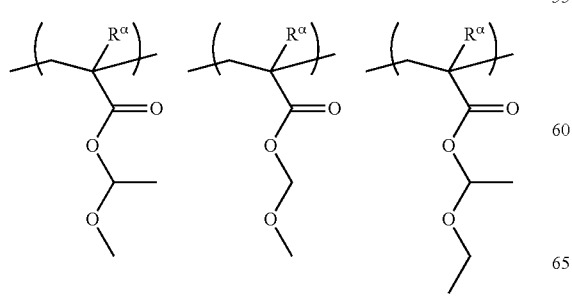
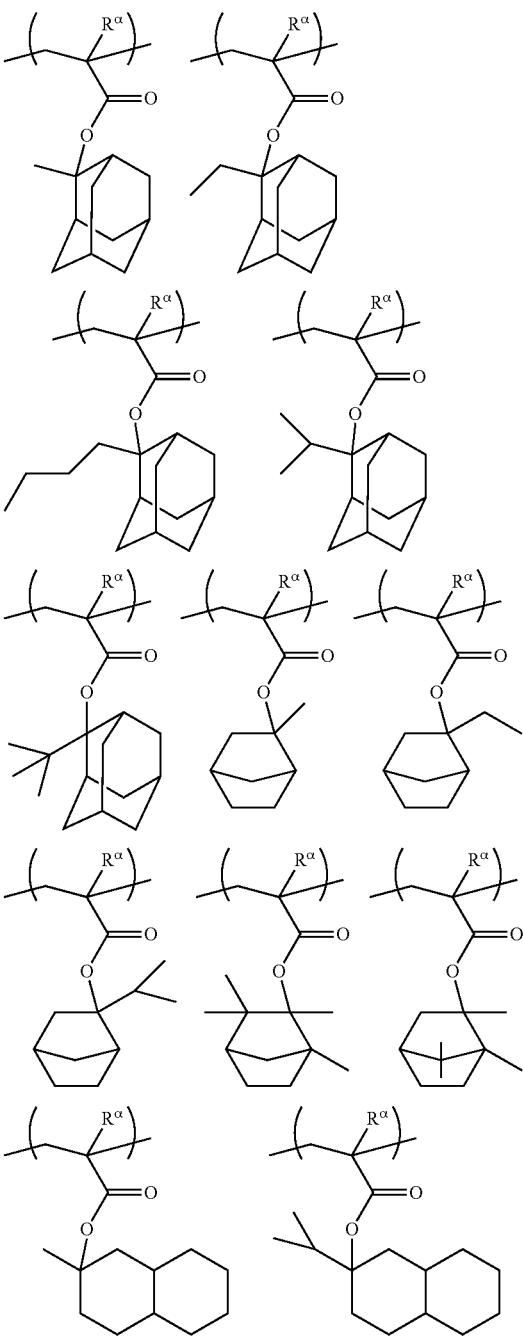

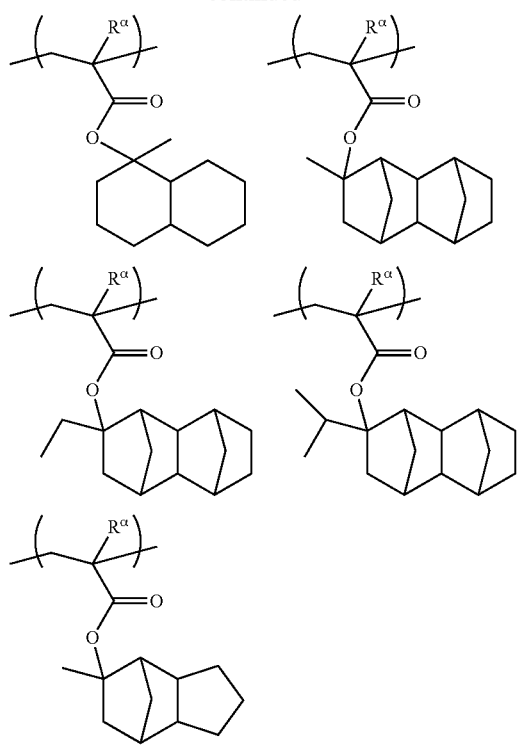
[Chemical Formula 38]
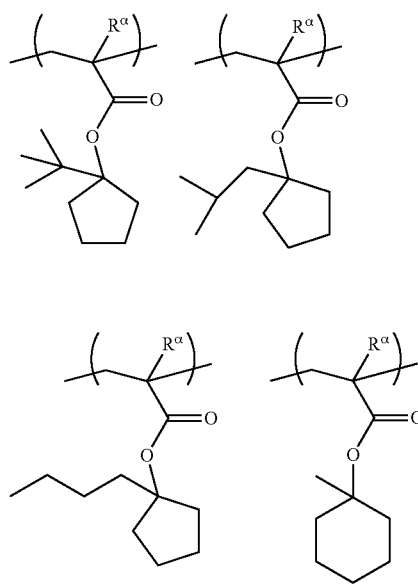
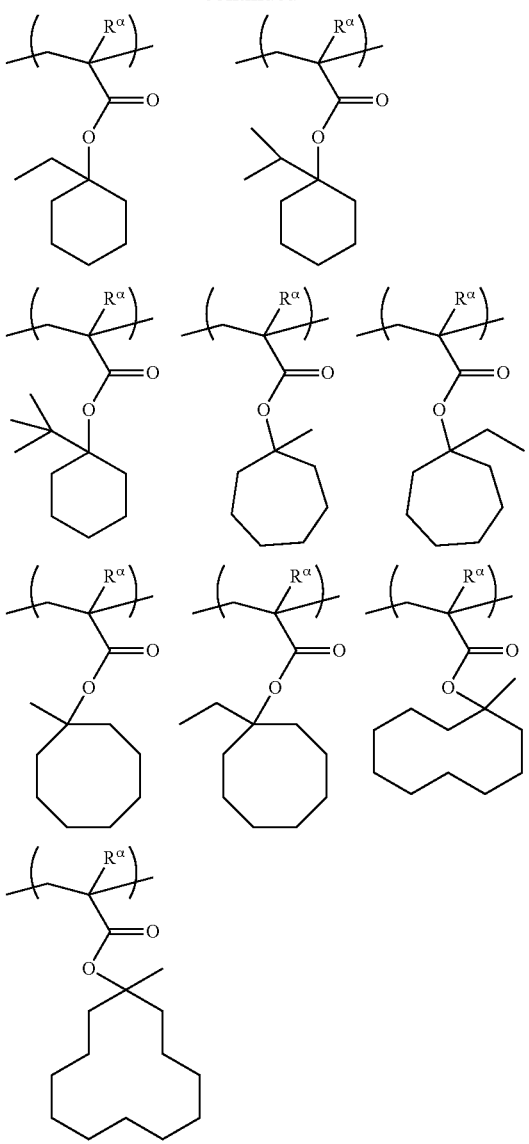
[Chemical Formula 39]
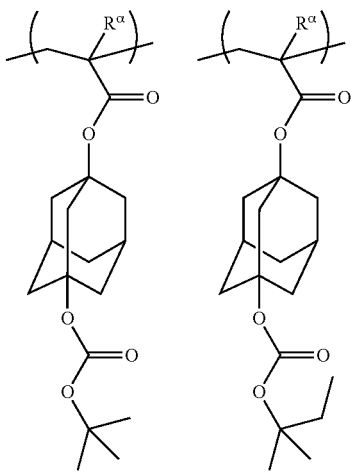

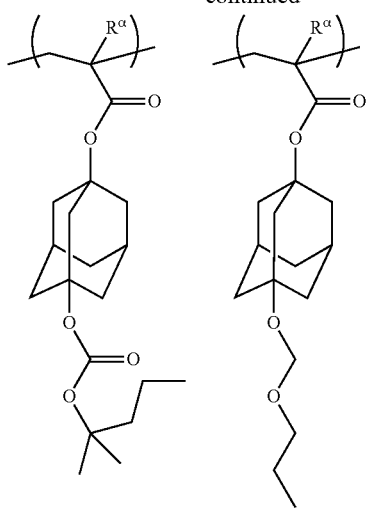
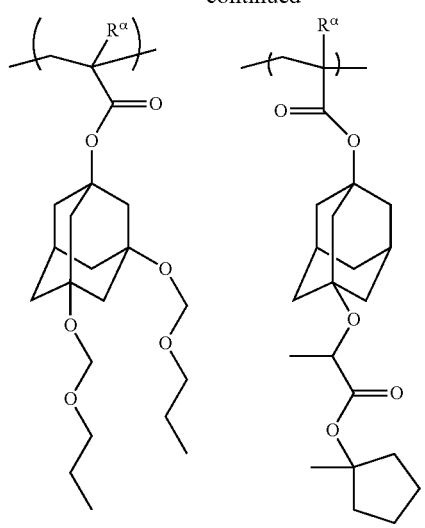
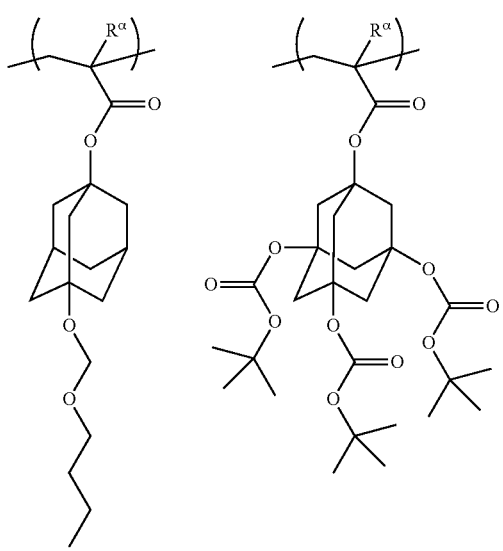
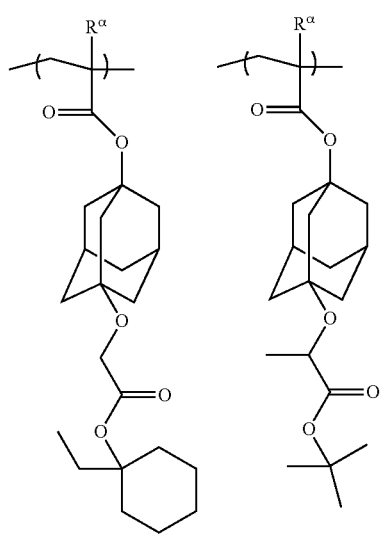
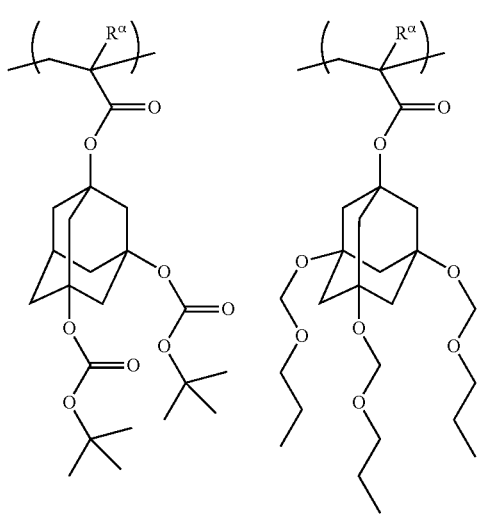
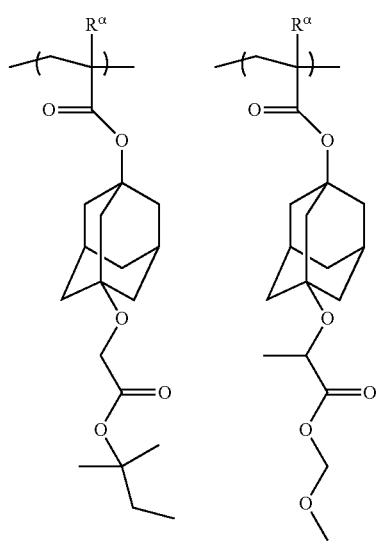

-continued

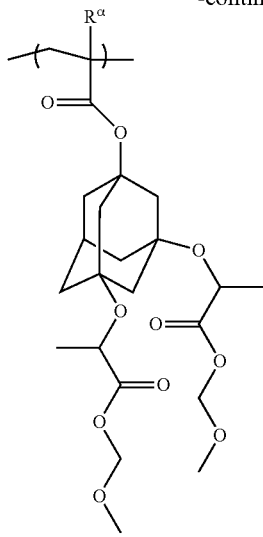

In the component (A), the amount of the structural unit (a1) based on the combined total of all structural units constituting the component (A) is preferably 20 to 80 mol %, more preferably 20 to 75 mol %, and still more preferably 25 to 70 mol %. By ensuring the lower limit, various lithography properties such as sensitivity, resolution and LWR are improved. On the other hand, when the amount of the structural unit (a1) is no more than the upper limit of the above-mentioned range, a good balance can be achieved with the other structural units.

In the present embodiment, the polymeric compound (A1) may further include a structural unit (a2) containing a lactone-containing cyclic group, a carbonate-containing cyclic group or a —$SO_2$— containing cyclic group, a structural unit (a3) containing a polar group-containing aliphatic hydrocarbon group, a structural unit (a4) containing an acid non-dissociable cyclic group and/or a structural unit (a6) which generates acid upon exposure.

(Structural Unit (a2))

The structural unit (a2) is a structural unit containing a lactone-containing cyclic group, a carbonate-containing cyclic group or an —$SO_2$— containing cyclic group.

When the component (A1) is used for forming a resist film, the structural unit (a2) containing a lactone-containing cyclic group or a carbonate-containing cyclic group is effective in improving the adhesion between the resist film and the substrate.

The aforementioned structural unit (a1) which contains a lactone-containing cyclic group or a carbonate-containing cyclic group falls under the definition of the structural unit (a2); however, such a structural unit is regarded as a structural unit (a1), and does not fall under the definition of the structural unit (a2).

When the component (A1) is used for forming a resist film, the structural unit (a2) containing an —$SO_2$— containing cyclic group is effective in improving the adhesion between the resist film and the substrate.

The aforementioned structural unit (a1) which contains an —$SO_2$— containing cyclic group falls under the definition of the structural unit (a2); however, such a structural unit is regarded as a structural unit (a1), and does not fall under the definition of the structural unit (a2).

The structural unit (a2) is preferably a structural unit represented by general formula (a2-1) shown below.

[Chemical Formula 40]

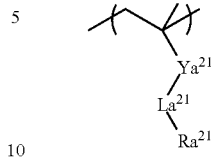

(a2-1)

In the formula, R represents a hydrogen atom, an alkyl group of 1 to 5 carbon atoms, a halogenated alkyl group of 1 to 5 carbon atoms, a hydroxyalkyl group, an alkoxy group; $Ya^{21}$ represents a single bond or a divalent linking group; $La^{21}$ represents —O—, —COO— or —OCO—; and R' represents a hydrogen atom or a methyl group, provided that, when $La^{21}$ represents —O—, $Ya^{21}$ does not represents —CO—; and $Ra^{21}$ represents a lactone-containing cyclic group, a carbonate-containing cyclic group or an —$SO_2$— containing cyclic group.

The divalent linking group for $Ya^{21}$ is not particularly limited, and preferable examples thereof include a divalent hydrocarbon group which may have a substituent and a divalent linking group containing a hetero atom.

(Divalent Hydrocarbon Group which May have a Substituent)

The hydrocarbon group as a divalent linking group may be either an aliphatic hydrocarbon group or an aromatic hydrocarbon group.

An "aliphatic hydrocarbon group" refers to a hydrocarbon group that has no aromaticity. The aliphatic hydrocarbon group may be saturated or unsaturated. In general, the aliphatic hydrocarbon group is preferably saturated.

Examples of the aliphatic hydrocarbon group include a linear or branched aliphatic hydrocarbon group, and an aliphatic hydrocarbon group containing a ring in the structure thereof. Specifically, groups exemplified above for $Va^1$ in the aforementioned formula (a1-1) ca be mentioned.

The linear or branched aliphatic hydrocarbon group may or may not have a substituent. Examples of the substituent include a fluorine atom, a fluorinated alkyl group of 1 to 5 carbon atoms, and a carbonyl group.

As examples of the hydrocarbon group containing a ring in the structure thereof, a cyclic aliphatic hydrocarbon group containing a hetero atom in the ring structure thereof and may have a substituent (a group in which two hydrogen atoms have been removed from an aliphatic hydrocarbon ring), a group in which the cyclic aliphatic hydrocarbon group is bonded to the terminal of the aforementioned chain-like aliphatic hydrocarbon group, and a group in which the cyclic aliphatic group is interposed within the aforementioned linear or branched aliphatic hydrocarbon group, can be given. As the linear or branched aliphatic hydrocarbon group, the same groups as those described above can be used.

The cyclic aliphatic hydrocarbon group preferably has 3 to 20 carbon atoms, and more preferably 3 to 12 carbon atoms.

Specific examples of the cyclic aliphatic hydrocarbon group include the same group as exemplified above for $Va^1$ in the aforementioned formula (a1-1).

The cyclic aliphatic hydrocarbon group may or may not have a substituent. Examples of the substituent include an alkyl group, an alkoxy group, a halogen atom, a halogenated alkyl group, a hydroxyl group and a carbonyl group.

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

The cyclic aliphatic hydrocarbon group may have part of the carbon atoms constituting the ring structure thereof substituted with a substituent containing a hetero atom. As the substituent containing a hetero atom, —O—, —C(=O)—O—, —S—, —S(=O)$_2$— or —S(=O)$_2$—O— is preferable.

Specific examples of the aromatic hydrocarbon group as a divalent hydrocarbon group include the same group as exemplified above for $Va^1$ in the aforementioned formula (a1-1).

With respect to the aromatic hydrocarbon group, the hydrogen atom within the aromatic hydrocarbon group may be substituted with a substituent. For example, the hydrogen atom bonded to the aromatic ring within the aromatic hydrocarbon group may be substituted with a substituent. Examples of substituents include an alkyl group, an alkoxy group, a halogen atom, a halogenated alkyl group, and a hydroxyl group.

The alkyl group as the substituent is preferably an alkyl group of 1 to 5 carbon atoms, and a methyl group, an ethyl group, a propyl group, an n-butyl group or a tert-butyl group is particularly desirable.

As the alkoxy group, the halogen atom and the halogenated alkyl group for the substituent, the same groups as the aforementioned substituent groups for substituting a hydrogen atom within the cyclic aliphatic hydrocarbon group can be used.

(Divalent Linking Group Containing a Hetero Atom)

With respect to a divalent linking group containing a hetero atom, a hetero atom is an atom other than carbon and hydrogen, and examples thereof include an oxygen atom, a nitrogen atom, a sulfur atom and a halogen atom.

In the case where $Ya^{21}$ represents a divalent linking group containing a hetero atom, preferable examples of the linking group include —O—, —C(=O)—O—, —C(=O)—, —O—C(=O)—O—, —C(=O)—NH—, —NH—, —NH—C(=NH)— (wherein H may be substituted with a substituent such as an alkyl group or an acyl group), —S—, —S(=O)$_2$—, —S(=O)$_2$—O—, a group represented by general formula —Y$^{21}$—O—Y$^{22}$—, —Y$^{21}$—O—, —Y$^{21}$—C(=O)—O—, —C(=O)—O—Y$^{21}$, —[Y$^{21}$—C(=O)—O]$_{m'}$—Y$^{22}$— or —Y$^{21}$—O—C(=O)—Y$^{22}$— [in the formulae, Y$^{21}$ and Y$^{22}$ each independently represents a divalent hydrocarbon group which may have a substituent, and O represents an oxygen atom; and m' represents an integer of 0 to 3.

The divalent linking group containing a hetero atom represents —C(=O)—NH—, —NH—, or —NH—C(=NH)—, H may be substituted with a substituent such as an alkyl group, an acyl group or the like. The substituent (an alkyl group, an acyl group or the like) preferably has 1 to 10 carbon atoms, more preferably 1 to 8, and most preferably 1 to 5.

In formulae —Y$^{21}$—O—Y$^{22}$—, —Y$^{21}$—O—, —Y$^{21}$—C(=O)—O—, —C(=O)—O—Y$^{21}$, —[Y$^{21}$—C(=O)—O]$_{m'}$—Y$^{22}$— and —Y$^{21}$—O—C(=O)—Y$^{22}$—, Y$^{21}$ and Y$^{22}$ each independently represents a divalent hydrocarbon group which may have a substituent. Examples of the divalent hydrocarbon group include the same groups as those described above as the "divalent hydrocarbon group which may have a substituent" in the explanation of the aforementioned divalent linking group.

As Y$^{21}$, a linear aliphatic hydrocarbon group is preferable, more preferably a linear alkylene group, still more preferably a linear alkylene group of 1 to 5 carbon atoms, and a methylene group or an ethylene group is particularly desirable.

As Y$^{22}$, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula —[Y$^{21}$—C(=O)—O]$_{m'}$—Y$^{22}$—, m' represents an integer of 0 to 3, preferably an integer of 0 to 2, more preferably 0 or 1, and most preferably 1. Namely, it is particularly desirable that the group represented by the formula —[Y$^{21}$—C(=O)—O]$_{m'}$—Y$^{22}$— is a group represented by the formula —Y$^{21}$—C(=O)—O—Y$^{22}$—. Among these, a group represented by the formula —(CH$_2$)$_{a'}$—C(=O)—O—(CH$_2$)$_{b'}$— is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

In the present invention, $Ya^{21}$ preferably represents an ester bond [—C(=O)—O—], an ether bond (—O—), a linear or branched alkylene group, a combination of these, or a single bond.

In formula (a2-1), $Ra^{21}$ represents a lactone-containing cyclic group, a carbonate-containing cyclic group or an —SO$_2$— containing cyclic group.

The term "lactone-containing cyclic group" refers to a cyclic group including a ring containing a —O—C(=O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings. The lactone-containing cyclic group may be either a monocyclic group or a polycyclic group.

As the lactone-containing cyclic group, there is no particular limitation, and an arbitrary group may be used.

Specific examples include groups represented by general formulas (a2-r-1) to (a2-r-7) shown below. Hereinbelow, "*" represents a valence bond.

[Chemical Formula 41]

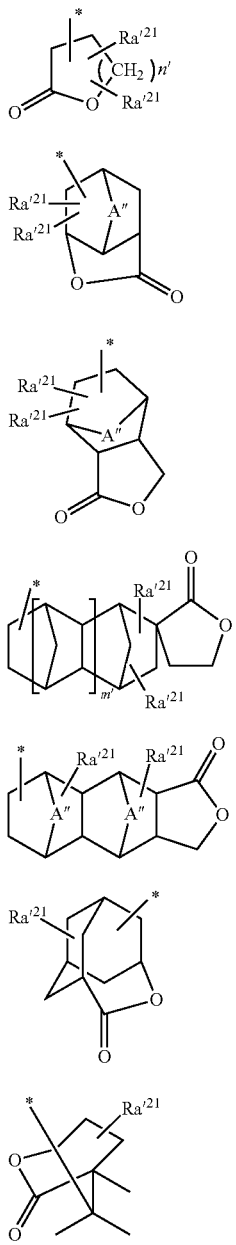

(a2-r-1)
(a2-r-2)
(a2-r-3)
(a2-r-4)
(a2-r-5)
(a2-r-6)
(a2-r-7)

In the formulae, each $Ra'^{21}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom or an alkyl group; A" represents an oxygen atom, a sulfur atom or an alkylene group of 1 to 5 carbon atoms with or without an oxygen atom or a sulfur atom; n' represents an integer of 0 to 2; and m' represents 0 or 1.

In general formulae (a2-r-1) to (a2-r-7) above, A" represents an oxygen atom (—O—), a sulfur atom (—S—) or an alkylene group of 1 to 5 carbon atoms with or without an oxygen atom or a sulfur atom. As the alkylene group of 1 to 5 carbon atoms for A", a linear or branched alkylene group is preferable, and examples thereof include a methylene group, an ethylene group, an n-propylene group and an isopropylene group. Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—$CH_2$—, —$CH_2$—O—$CH_2$—, —S—$CH_2$— and —$CH_2$—S—$CH_2$—. As A", an alkylene group of 1 to 5 carbon atoms or —O— is preferable, more preferably an alkylene group of 1 to 5 carbon atoms, and most preferably a methylene group.

In formulae (a2-r-1) to (a2-r-7), the alkyl group for $Ra'^{21}$ is preferably an alkyl group of 1 to 6 carbon atoms. Further, the alkyl group is preferably a linear alkyl group or a branched alkyl group. Specific examples include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly desirable.

The alkoxy group for $Ra'^{21}$ is preferably an alkoxy group of 1 to 6 carbon atoms.

Further, the alkoxy group is preferably a linear or branched alkoxy group. Specific examples of the alkoxy groups include the aforementioned alkyl groups for $Ra'^{21}$ having an oxygen atom (—O—) bonded thereto.

As examples of the halogen atom for $Ra'^{21}$, a fluorine atom, chlorine atom, bromine atom and iodine atom can be given. Among these, a fluorine atom is preferable.

Examples of the halogenated alkyl group for $Ra'^{21}$ include groups in which part or all of the hydrogen atoms within the aforementioned alkyl group for $Ra'^{21}$ has been substituted with the aforementioned halogen atoms. As the halogenated alkyl group, a fluorinated alkyl group is preferable, and a perfluoroalkyl group is particularly desirable.

With respect to —COOR" and —OC(=O)R" for $Ra'^{21}$, R" represents a hydrogen atom, an alkyl group, a lactone-containing cyclic group, a carbonate-containing cyclic group or an —$SO_2$— containing cyclic group.

The alkyl group for R" may be linear, branched or cyclic, and preferably has 1 to 15 carbon atoms.

When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" is a cyclic alkyl group (cycloalkyl group), it preferably has 3 to 15 carbon atoms, more preferably 4 to 12 carbon atoms, and most preferably 5 to 10 carbon atoms. Specific examples include groups in which one or more hydrogen atoms have been removed from a monocycloalkane or a polycycloalkane such as a bicycloalkane, tricycloalkane or tetracycloalkane which may or may not be substituted with a fluorine atom or a fluorinated alkyl group. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

Examples of the lactone-containing cyclic group for R" include groups represented by the aforementioned general formulae (a2-r-1) to (a2-r-7).

The carbonate-containing cyclic group for R" is the same as defined for the carbonate-containing cyclic group described later. Specific examples of the carbonate-containing cyclic group include groups represented by general formulae (ax3-r-1) to (ax3-r-3).

The —$SO_2$— containing cyclic group for R" is the same as defined for the —$SO_2$— containing cyclic group described later. Specific examples of the —$SO_2$— containing cyclic group include groups represented by general formulae (a5-r-1) to (a5-r-4).

The hydroxyalkyl group for $Ra'^{21}$ preferably has 1 to 6 carbon atoms, and specific examples thereof include the alkyl groups for $Ra'^{21}$ in which at least one hydrogen atom has been substituted with a hydroxy group.

In formulae (a2-r-2), (a2-r-3) and (a2-r-5), as the alkylene group of 1 to 5 carbon atoms represented by A", a linear or branched alkylene group is preferable, and examples thereof include a methylene group, an ethylene group, an n-propylene group and an isopropylene group. Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—$CH_2$—, —$CH_2$—O—$CH_2$—, —S—$CH_2$— and —$CH_2$—S—$CH_2$—. As A", an alkylene group of 1 to 5 carbon atoms or —O— is preferable, more preferably an alkylene group of 1 to 5 carbon atoms, and most preferably a methylene group.

Specific examples of the groups represented by the aforementioned general formulae (a2-r-1) to (a2-r-7) are shown below.

[Chemical Formula 42]

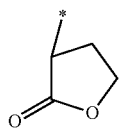
(r-Ic-1-1)

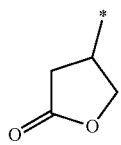
(r-Ic-1-2)

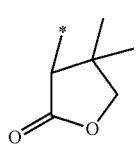
(r-Ic-1-3)

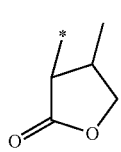
(r-Ic-1-4)

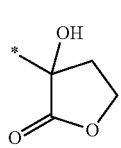
(r-Ic-1-5)

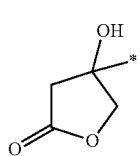
(r-Ic-1-6)

-continued

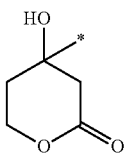
(r-Ic-1-7)

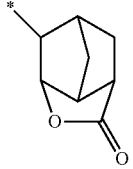
(r-Ic-2-1)

(r-Ic-2-2)

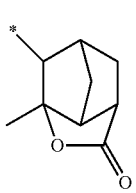
(r-Ic-2-3)

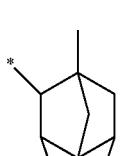
(r-Ic-2-4)

(r-Ic-2-5)

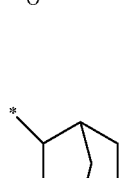
(r-Ic-2-6)

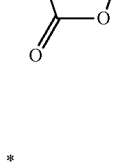
(r-Ic-2-7)

(r-Ic-2-8)
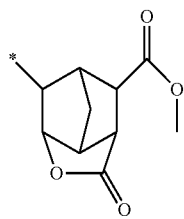
(r-Ic-2-9)
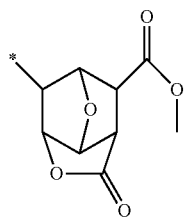
(r-Ic-2-10)
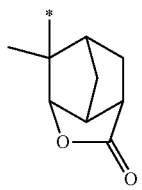
(r-Ic-2-11)
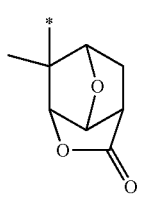
(r-Ic-2-12)
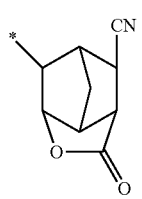
(r-Ic-2-13)
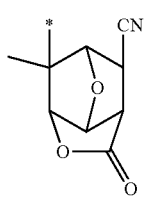
(r-Ic-3-1)
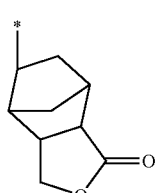
(r-Ic-3-2)
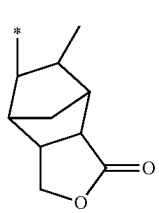
(r-Ic-3-3)
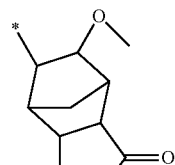
(r-Ic-3-4)
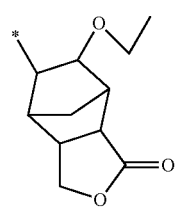
(r-Ic-3-5)
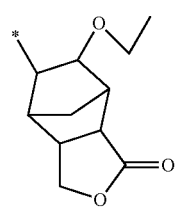
(r-Ic-4-1)
(r-Ic-4-2)
(r-Ic-4-3)
(r-Ic-4-4)
(r-Ic-4-5)
(r-Ic-4-6)
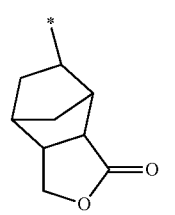

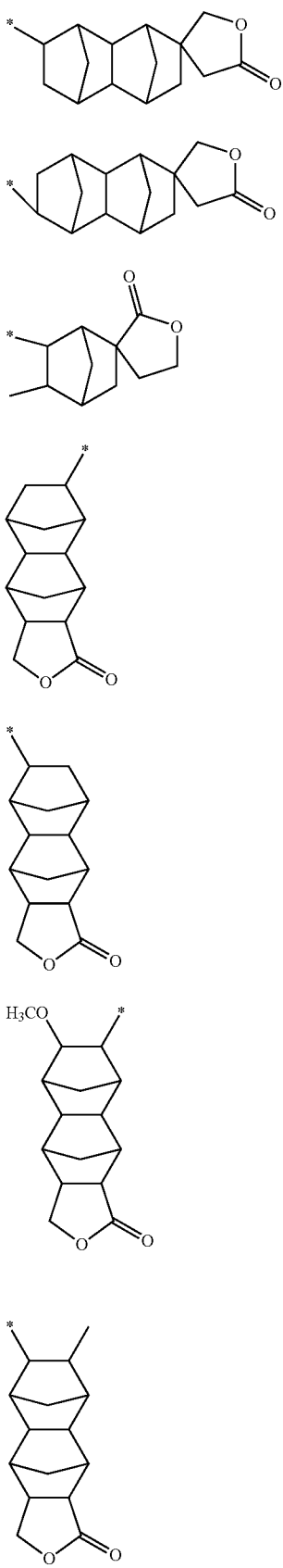

(r-Ic-4-7)

(r-Ic-4-8)

(r-Ic-4-9)

(r-Ic-5-1)

(r-Ic-5-2)

(r-Ic-5-3)

(r-Ic-5-4)

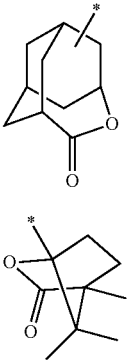

(r-Ic-6-1)

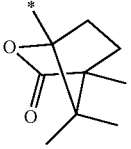

(r-Ic-7-1)

An "—SO$_2$— containing cyclic group" refers to a cyclic group having a ring containing —SO$_2$— within the ring structure thereof, i.e., a cyclic group in which the sulfur atom (S) within —SO$_2$— forms part of the ring skeleton of the cyclic group. The ring containing —SO$_2$— within the ring skeleton thereof is counted as the first ring. A cyclic group in which the only ring structure is the ring that contains —SO$_2$— in the ring skeleton thereof is referred to as a monocyclic group, and a group containing other ring structures is described as a polycyclic group regardless of the structure of the other rings. The —SO$_2$— containing cyclic group may be either a monocyclic group or a polycyclic group.

As the —SO$_2$— containing cyclic group for the cyclic hydrocarbon group represented by R$^1$, a cyclic group containing —O—SO$_2$— within the ring skeleton thereof, i.e., a cyclic group containing a sultone ring in which —O—S— within the —O— SO$_2$— group forms part of the ring skeleton thereof is particularly desirable. Specific examples of the —SO$_2$— containing cyclic group include groups represented by general formulae (a5-r-1) to (a5-r-4) shown below.

[Chemical Formula 43]

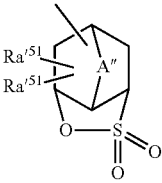

(a5-r-1)

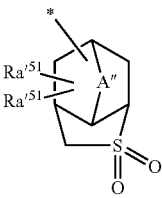

(a5-r-2)

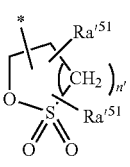

(a5-r-3)

(a5-r-4)

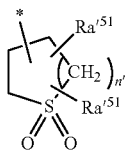

In the formulae, each Ra'$^{51}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom or an alkyl group; A" represents an oxygen atom, a sulfur atom or an alkylene group of 1 to 5 carbon atoms with or without an oxygen atom or a sulfur atom; and n' represents an integer of 0 to 2.

In general formulae (a5-r-1) to (a5-r-4), A" is the same as defined for A" in general formulae (a2-r-1) to (a2-r-7). The alkyl group, alkoxy group, halogen atom, halogenated alkyl group, —COOR", —OC(=O)R" and hydroxyalkyl group for Ra'$^{51}$ are the same as defined for Ra'$^{21}$ in the aforementioned general formulae (a2-r-1) to (a2-r-7).

Specific examples of the groups represented by the aforementioned general formulas (a5-r-1) to (a5-r-4) are shown below. In the formulae shown below, "Ac" represents an acetyl group.

[Chemical Formula 44]

(r-sI-1-1)

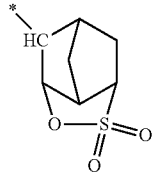

(r-sI-1-2)

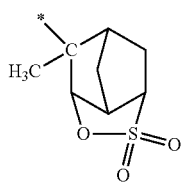

(r-sI-1-3)

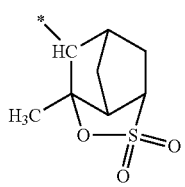

(r-sI-1-4)

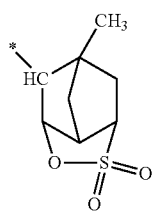

(r-sI-1-5)

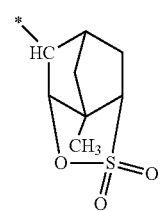

(r-sI-1-6)

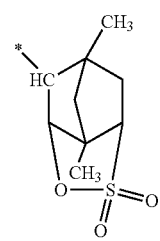

(r-sI-1-7)

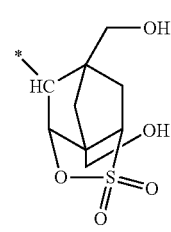

(r-sI-1-8)

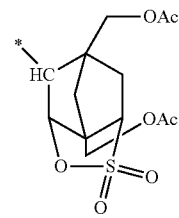

(r-sI-1-9)

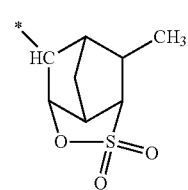

(r-sI-1-10)

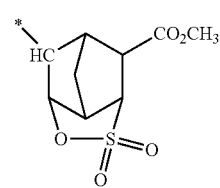

(r-sI-1-11)

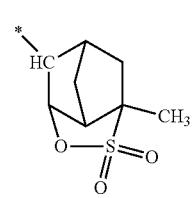

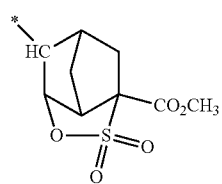 (r-sI-1-12)
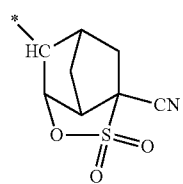 (r-sI-1-13)
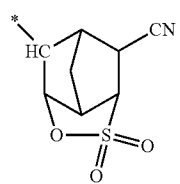 (r-sI-1-14)
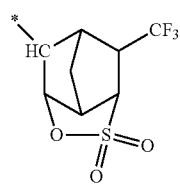 (r-sI-1-15)
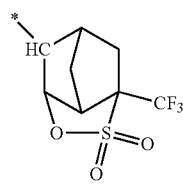 (r-sI-1-16)
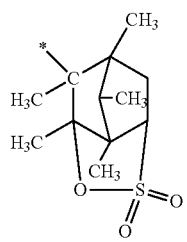 (r-sI-1-17)
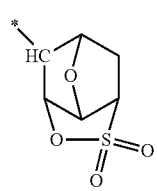 (r-sI-1-18)
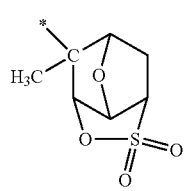 (r-sI-1-19)
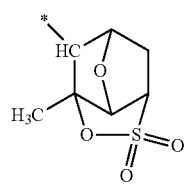 (r-sI-1-20)
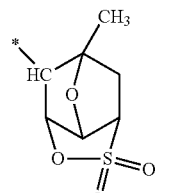 (r-sI-1-21)
[Chemical Formula 45]
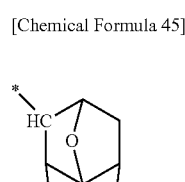 (r-sI-1-22)
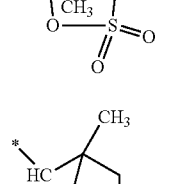 (r-sI-1-23)
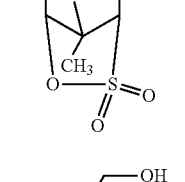 (r-sI-1-24)
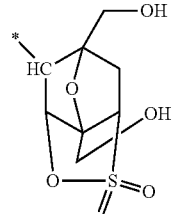 (r-sI-1-25)
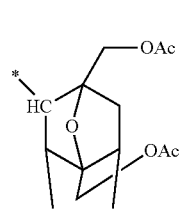 (r-sI-1-26)
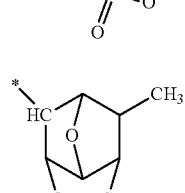

(r-sI-1-27) 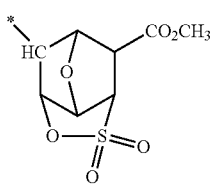

(r-sI-1-28) 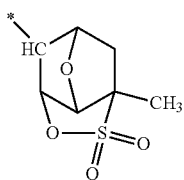

(r-sI-1-29) 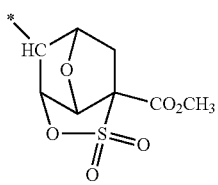

(r-sI-1-30) 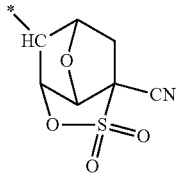

(r-sI-1-31) 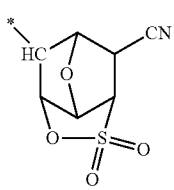

(r-sI-1-32) 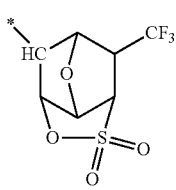

(r-sI-1-33) 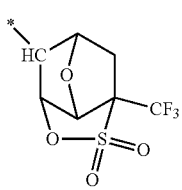

[Chemical Formula 46]

(r-sI-2-1) 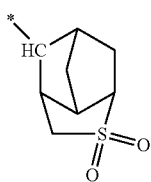

(r-sI-2-2) 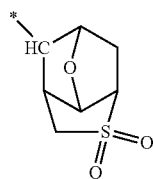

(r-sI-3-1) 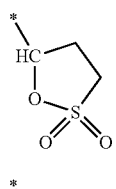

(r-sI-4-1) 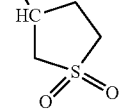

As the —$SO_2$— containing cyclic group, a group represented by the aforementioned general formula (a5-r-1) is preferable, at least one member selected from the group consisting of groups represented by the aforementioned chemical formulas (r-sl-1-1), (r-sl-1-18), (r-sl-3-1) and (r-sl-4-1) is more preferable, and a group represented by chemical formula (r-sl-1-1) is most preferable.

The term "carbonate-containing cyclic group" refers to a cyclic group including a ring containing a —O—C(=O)—O— structure (carbonate ring). The term "carbonate ring" refers to a single ring containing a —O—C(=O)—O— structure, and this ring is counted as the first ring. A carbonate-containing cyclic group in which the only ring structure is the carbonate ring is referred to as a monocyclic group, and groups containing other ring structures are described as polycyclic groups regardless of the structure of the other rings. The carbonate-containing cyclic group may be either a monocyclic group or a polycyclic group.

The carbonate-containing cyclic group as the cyclic hydrocarbon group for $R^1$ is not particularly limited, and an arbitrary group may be used. Specific examples include groups represented by general formulas (ax3-r-1) to (ax3-r-3) shown below.

[Chemical Formula 47]

(ax3-r-1) 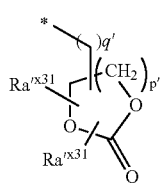

(ax3-r-2) 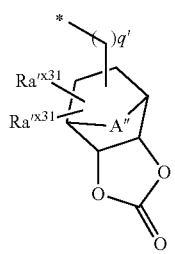

(ax3-r-3)

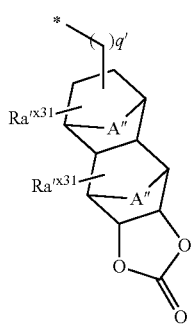

In the formulae, each $Ra'^{x31}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom or an alkyl group; A" represents an oxygen atom, a sulfur atom or an alkylene group of 1 to 5 carbon atoms with or without an oxygen atom or a sulfur atom; p' represents an integer of 0 to 3; and q' represents 0 or 1.

In general formulae (ax3-r-1) to (ax3-r-3), A" is the same as defined for A" in general formula (a2-r-1).

Examples of the alkyl group, alkoxy group, halogen atom, halogenated alkyl group, —COOR", —OC(=O)R" and hydroxyalkyl group for $Ra'^{31}$ include the same groups as those described above in the explanation of $Ra'^{21}$ in the general formulas (a2-r-1) to (a2-r-7).

Specific examples of the groups represented by the aforementioned general formulae (ax3-r-1) to (ax3-r-3) are shown below.

[Chemical Formula 48]

(r-cr-1-1)

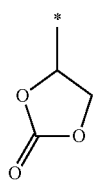

(r-cr-1-2)

(r-cr-1-3)

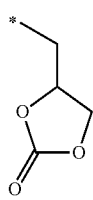

(r-cr-1-4)

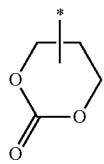

(r-cr-1-5)

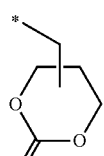

(r-cr-1-6)

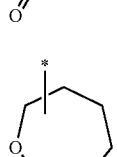

(r-cr-1-6)

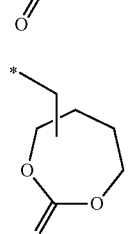

(r-cr-2-1)

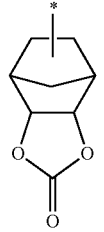

(r-cr-2-2)

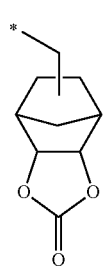

(r-cr-2-3)

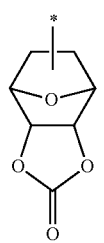

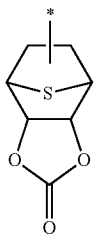
(r-cr-2-4)

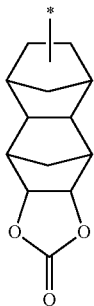
(r-cr-3-1)

(r-cr-3-2)

(r-cr-3-3)

(r-cr-3-4)

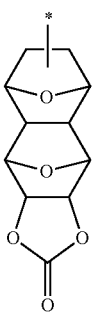
(r-cr-3-5)

Among the above examples, a lactone-containing cyclic group or an —SO$_2$— containing cyclic group is preferable, a group represented by the general formula (a2-r-1), (a2-r-2) or (a5-r-1) is more preferable, and a group represented by any one of the chemical formulae (r-lc-1-1) to (r-lc-1-7), (r-lc-2-1) to (r-lc-2-13), (r-sl-1-1) and (r-sl-1-18) is still more preferable.

As the structural unit (a2) contained in the component (A1), 1 type of structural unit may be used, or 2 or more types may be used.

When the component (A1) contains the structural unit (a2), the amount of the structural unit (a2) based on the combined total of all structural units constituting the component (A1) is preferably 1 to 80 mol %, more preferably 5 to 70 mol %, still more preferably 10 to 65 mol %, and most preferably 10 to 60 mol %. When the amount of the structural unit (a2) is at least as large as the lower limit of the above-mentioned range, the effect of using the structural unit (a2) can be satisfactorily achieved. On the other hand, when the amount of the structural unit (a2) is no more than the upper limit of the above-mentioned range, a good balance can be achieved with the other structural units, and various lithography properties such as DOF and CDU and pattern shape can be improved.

(Structural Unit (a3))

The structural unit (a3) is a structural unit containing a polar group-containing aliphatic hydrocarbon group (provided that the structural units that fall under the definition of structural units (a1) and (a2) are excluded).

When the component (A1) includes the structural unit (a3), it is presumed that the hydrophilicity of the component (A1) is enhanced, thereby contributing to improvement in resolution.

Examples of the polar group include a hydroxyl group, cyano group, carboxyl group, or hydroxyalkyl group in which part of the hydrogen atoms of the alkyl group have been substituted with fluorine atoms, although a hydroxyl group is particularly desirable.

Examples of the aliphatic hydrocarbon group include linear or branched hydrocarbon groups (preferably alkylene groups) of 1 to 10 carbon atoms, and cyclic aliphatic hydrocarbon groups (cyclic groups). These cyclic groups can be selected appropriately from the multitude of groups that have been proposed for the resins of resist compositions designed for use with ArF excimer lasers. The cyclic group is preferably a polycyclic group, more preferably a polycyclic group of 7 to 30 carbon atoms.

Of the various possibilities, structural units derived from an acrylate ester that include an aliphatic polycyclic group that contains a hydroxyl group, cyano group, carboxyl group or a hydroxyalkyl group in which part of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

As the structural unit (a3), there is no particular limitation as long as it is a structural unit containing a polar group-containing aliphatic hydrocarbon group, and an arbitrary structural unit may be used.

The structural unit (a3) is preferably a structural unit derived from an acrylate ester which may have the hydrogen atom bonded to the carbon atom on the α-position substituted with a substituent and contains a polar group-containing aliphatic hydrocarbon group.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2) and (a3-3) shown below are preferable.

[Chemical Formula 49]

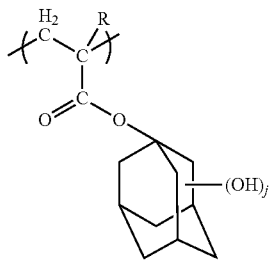

(a3-1)

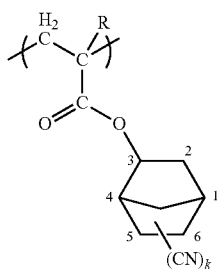

(a3-2)

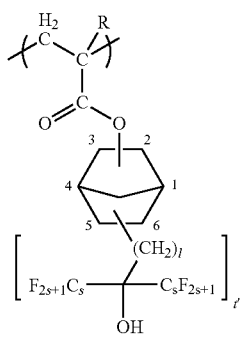

(a3-3)

In the formulas, R is the same as defined above; j is an integer of 1 to 3; k is an integer of 1 to 3; t' is an integer of 1 to 3; l is an integer of 1 to 5; and s is an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1. l is preferably 1. s is preferably 1. Further, it is preferable that a 2-norbornyl group or 3-norbornyl group be bonded to the terminal of the carboxy group of the acrylic acid. The fluorinated alkyl alcohol is preferably bonded to the 5th or 6th position of the norbornyl group.

As the structural unit (a3) contained in the component (A1), 1 type of structural unit may be used, or 2 or more types may be used.

The amount of the structural unit (a3) within the component (A1) based on the combined total of all structural units constituting the component (A1) is preferably 5 to 50 mol %, more preferably 5 to 40 mol %, and still more preferably 5 to 25 mol %.

When the amount of the structural unit (a3) is at least as large as the lower limit of the above-mentioned range, the effect of using the structural unit (a3) can be satisfactorily achieved. On the other hand, when the amount of the structural unit (a3) is no more than the upper limit of the above-mentioned range, a good balance can be achieved with the other structural units.

(Structural Unit (a4))

The structural unit (a4) is a structural unit containing an acid non-dissociable cyclic group. When the component (A1) includes the structural unit (a4), dry etching resistance of the resist pattern to be formed is improved. Further, the hydrophobicity of the component (A1) is further improved. Increase in the hydrophobicity contributes to improvement in terms of resolution, shape of the resist pattern and the like, particularly in an organic solvent developing process.

An "acid non-dissociable, aliphatic cyclic group" in the structural unit (a4) refers to a cyclic group which is not dissociated by the action of acid generated from the component (B) described later upon exposure, and remains in the structural unit.

As the structural unit (a4), a structural unit which contains a non-acid-dissociable aliphatic cyclic group, and is also derived from an acrylate ester is preferable. Examples of this cyclic group include the same groups as those described above in relation to the aforementioned structural unit (a1), and any of the multitude of conventional groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecyl group, adamantyl group, tetracyclododecyl group, isobornyl group, and norbornyl group is particularly desirable. These polycyclic groups may be substituted with a linear or branched alkyl group of 1 to 5 carbon atoms.

Specific examples of the structural unit (a4) include units with structures represented by general formulas (a4-1) to (a4-7) shown below.

[Chemical Formula 50]

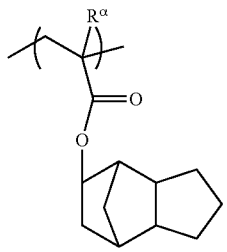
(a4-1)

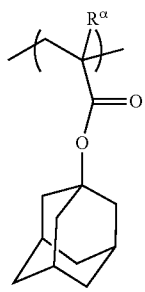
(a4-2)

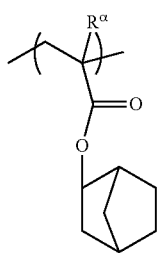
(a4-3)

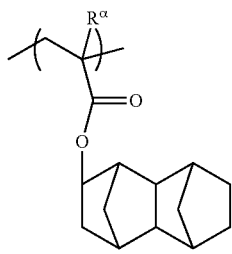
(a4-4)

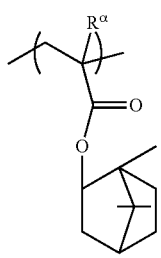
(a4-5)

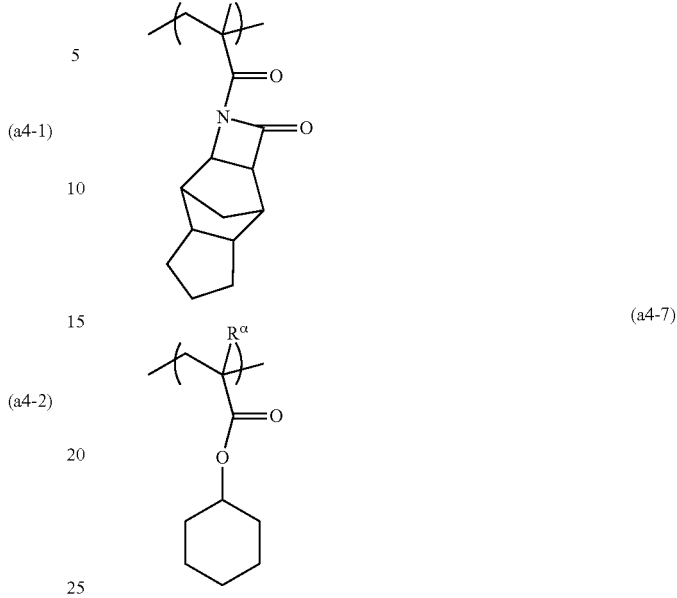

In the formulae, $R^\alpha$ represents a hydrogen atom, a methyl group or a trifluoromethyl group.

As the structural unit (a4) contained in the component (A1), 1 type of structural unit may be used, or 2 or more types may be used.

When the structural unit (a4) is included in the component (A1), the amount of the structural unit (a4) based on the combined total of all the structural units that constitute the component (A1) is preferably within the range from 1 to 30 mol %, and more preferably from 10 to 20 mol %.

(Structural Unit (a6))

The structural unit (a6) is a structural unit which generates acid upon exposure.

The structural unit (a6) is not particularly limited as long as it generates acid upon exposure. For example, a structural unit copolymerizable with the aforementioned structural unit (a0) and in which a structure proposed as an acid generator for a conventional chemically amplified resist has been introduced can be used.

Preferable examples of the structural unit copolymerizable with the structural unit (a0) include a structural unit derived from a (meth)acrylate ester and a structural unit derived from hydroxystyrene.

Preferable examples of a compound having a structure proposed as an acid generator for a conventional chemically amplified resist include the component (B) described later.

Examples of the structural unit (a6) include a structural unit (a6c) having an anion group which generates an acid upon exposure on a side chain thereof, and a structural unit (a6c) which has a cation group that is decomposed upon exposure on a side chain thereof.

Structural Unit (a6a)

The structural unit (a6c) is a structural unit having an anion group which generates an acid upon exposure on a side chain thereof.

The anion group which generates acid upon exposure is not particularly limited, and a sulfonic acid anion, an amide anion or a methide anion is preferable.

Among these, as the anion group, a group represented by any one of general formulae (a6a-r-1), (a6a-r-2) or (a6a-r-3) shown below is preferable.

[Chemical Formula 51]

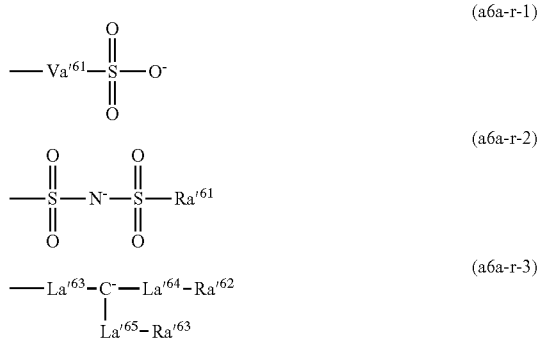

In the formulae, $Va'^{61}$ represents a divalent hydrocarbon group having a fluorine atom; $La'^{63}$ to $La'^{65}$ each independently represents $-SO_2-$ or a single bond; $Ra'^{61}$ to $Ra'^{63}$ each independently represents a hydrocarbon group.

In formula (a6a-r-1), $Va'^{61}$ represents a divalent hydrocarbon group having a fluorine atom.

The divalent hydrocarbon group for $Va'^{61}$ is the same as defined for the divalent hydrocarbon group (with or without a substituent) for $Ya^{01}$ in the aforementioned formula (a0-1).

The linear or branched aliphatic hydrocarbon group has a fluorine atom, and all of the hydrogen atoms of the aliphatic hydrocarbon group may be substituted with fluorine. Further, in addition to fluorine, the aliphatic hydrocarbon group may be substituted with an oxo group ($=O$).

The cyclic aliphatic hydrocarbon group has a fluorine atom, and all of the hydrogen atoms of the cyclic aliphatic hydrocarbon group may be substituted with fluorine. Further, in addition to fluorine, the cyclic aliphatic hydrocarbon group may be substituted with an alkyl group, an alkoxy group, a hydroxy group, an oxo group ($=O$) or the like. These substituents are the same as defined above.

The aromatic hydrocarbon group has a fluorine atom, and all of the hydrogen atoms of the aromatic hydrocarbon group may be substituted with fluorine. Further, in addition to fluorine, the cyclic aliphatic hydrocarbon group may be substituted with an alkyl group, an alkoxy group, a hydroxy group, an oxo group ($=O$) or the like. The alkyl group and the alkoxy group as the substituent are the same as defined for the alkyl group and the alkoxy group as the substituent for the cyclic aliphatic hydrocarbon group.

Among the anion groups represented by formula (a6a-r-1), a group represented by general formula (a6a-r-11) shown below is preferable.

[Chemical Formula 52]

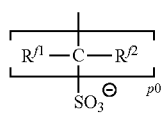 (a6a-r-11)

In the formula, $R^{f1}$ and $R^{f2}$ each independently represents a hydrogen atom, an alkyl group, a fluorine atom or a fluorinated alkyl group, provided that at least one of $R^{f1}$ and $R^{f2}$ represents a fluorine atom or a fluorinated alkyl group; and p0 represents an integer of 1 to 8.

In formula (a6a-r-11), each of $R^{f1}$ and $R^{f2}$ independently represents a hydrogen atom, an alkyl group, a fluorine atom or a fluorinated alkyl group, provided that at least one of $R^{f1}$ and $R^{f2}$ represents a fluorine atom or a fluorinated alkyl group.

The alkyl group for $R^{f1}$ and $R^{f2}$ is preferably an alkyl group of 1 to 5 carbon atoms, and specific examples thereof include a methyl group, an ethyl group, a propyl group, an isopropyl group, an n-butyl group, an isobutyl group, a tert-butyl group, a pentyl group, an isopentyl group and a neopentyl group.

The fluorinated alkyl group for $R^{f1}$ and $R^{f2}$ is preferably a group in which part or all of the hydrogen atoms within the aforementioned alkyl group for $R^{f1}$ and $R^{f2}$ have been substituted with a fluorine atom.

As $R^{f1}$ and $R^{f2}$, a fluorine atom or a fluorinated alkyl group is preferable.

In formula (a6a-r-11), p0 represents an integer of 1 to 8, preferably an integer of 1 to 4, and more preferably 1 or 2.

In formula (a6a-r-2), as the hydrocarbon group for $Ra'^{61}$, an alkyl group, a monovalent alicyclic hydrocarbon group, an aryl group and an aralkyl group can be mentioned.

The alkyl group for $Ra'^{61}$ preferably has 1 to 8 carbon atoms, more preferably 1 to 6 carbon atoms, and still more preferably 1 to 4 carbon atoms. The alkyl group may be linear or branched. Specific examples of preferable alkyl groups include a methyl group, an ethyl group, a propyl group, a butyl group, a hexyl group and an octyl group.

The monovalent alicyclic hydrocarbon group for $Ra'^{61}$ preferably has 3 to 20 carbon atoms, and more preferably 3 to 12 carbon atoms. The monovalent alicyclic hydrocarbon group may be polycyclic or monocyclic. As the monocyclic alicyclic hydrocarbon group, a group in which one or more hydrogen atoms have been removed from a monocycloalkane is preferable. The monocycloalkane preferably has 3 to 6 carbon atoms, and specific examples thereof include cyclobutane, cyclopentane and cyclohexane. As the polycyclic alicyclic hydrocarbon group, a group in which one or more hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The aryl group for $Ra'^{61}$ preferably has 6 to 18 carbon atoms, and more preferably 6 to 10 carbon atoms. Specifically, a phenyl group is particularly desirable.

As a preferable examples of the aralkyl group for $Ra'^{61}$, a group in which an alkylene group of 1 to 8 carbon atoms has been bonded to the aforementioned "aryl group for $Ra'^{61}$" can be mentioned. An aralkyl group in which an alkylene group of 1 to 6 carbon atoms has been bonded to the aforementioned "aryl group for $Ra'^{61}$" is more preferable, and an aralkyl group in which an alkylene group of 1 to 4 carbon atoms has been bonded to the aforementioned "aryl group for $Ra'^{61}$" is most preferable.

The hydrocarbon group for $Ra'^{61}$ preferably has part or all of the hydrogen atoms within the hydrocarbon group substituted with fluorine, and the hydrocarbon group more preferably has 30 to 100% of the hydrogen atoms substituted with fluorine. Among these, a perfluoroalkyl group in which all of the hydrogen atoms within the alkyl group have been substituted with fluorine atoms is particularly desirable.

In formula (a6a-r-3), $La'^{63}$ to $La'^{65}$ each independently represents $-SO_2-$ or a single bond, and $Ra'^{62}$ and $Ra'^{63}$ each independently represents a hydrocarbon group. The hydrocarbon group for $Ra'^{62}$ and $Ra'^{63}$ is the same as defined for the hydrocarbon group for $Ra'^{61}$.

Preferable examples of the structural unit (a6a) include structural units represented by general formulae (a6a-1) to (a6a-8) shown below.

[Chemical Formula 53]

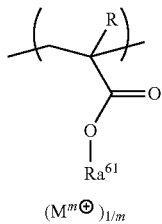
(a6a-1)

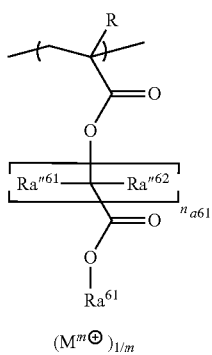
(a6a-2)

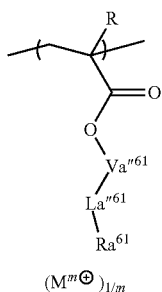
(a6a-3)

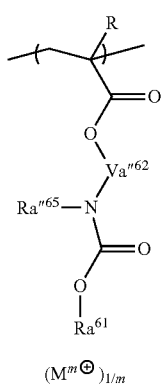
(a6a-4)

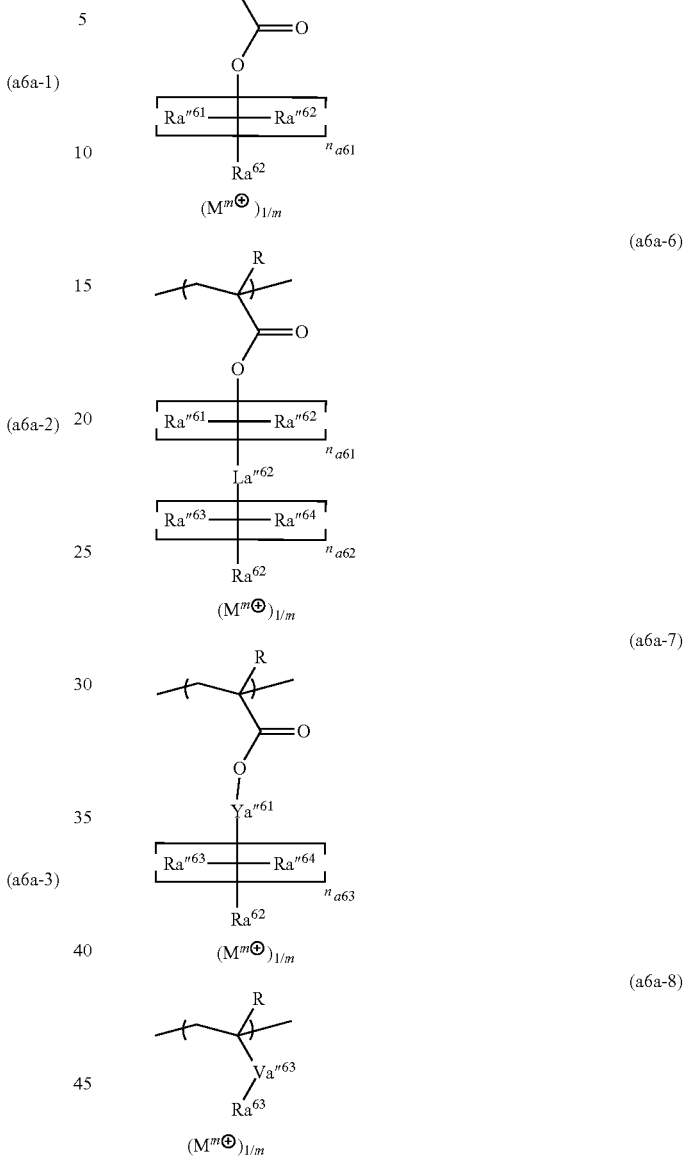

In the formula, R represents a hydrogen atom, an alkyl group of 1 to 5 carbon atoms or a halogenated alkyl group of 1 to 5 carbon atoms; $Ra^{61}$ is a group represented by the aforementioned formula (a6a-r-1); $Ra^{62}$ is a group represented by the aforementioned formula (a6a-r-2) or (a6a-r-3); $Ra^{63}$ is a group represented by the aforementioned formula (a6a-r-3); $Ra''^{61}$ to $Ra''^{64}$ each independently represents a hydrogen atom, a fluorine atom, an alkyl group of 1 to 5 carbon atoms or a fluorinated alkyl group; $n_{a61}$ and $n_{a62}$ each independently represents an integer of 1 to 10; $n_{a63}$ represents an integer of 0 to 10;

$Va''^{61}$ represents a divalent cyclic hydrocarbon group; $La''^{61}$ represents —C(=O)—O—, —O—C(=O)—O— or —O—CH$_2$—C(=O)—O—; $Va''^{62}$ represents a divalent hydrocarbon group; $Ra''^{65}$ represents a hydrogen atom or an alkyl group of 1 to 5 carbon atoms; $La''^{62}$ represents —C(=O)—O—, —O—C(=O)—O— or —NH—C(=O)—O—; $Ya''^{61}$ represents a divalent linking group containing a cyclic hydrocarbon group; Va"$^{63}$ represents a divalent cyclic hydrocarbon group or a single bond; m represents an integer of 1 or more; and each M$^{m+}$ independently represents an organic cation having a valency of m.

In formulae (a6a-1) to (a6a-8), R is the same as defined for R in the aforementioned formula (a0-1).

In formulae (a6a-1) to (a6a-4), each Ra$^{61}$ independently represents a group represented by the aforementioned formula (a6a-r-1). In formulae (a6a-5) to (a6a-7), each Ra$^{62}$ independently represents a group represented by the aforementioned formula (a6a-r-2) or (a6a-r-3). In formula (a6a-8), Ra$^{63}$ represents a group represented by the aforementioned formula (a6a-r-3).

In formulae (a6a-2) and (a6a-5) to (a6a-7), Ra"$^{61}$ to Ra"$^{64}$ each independently represents a hydrogen atom, a fluorine atom, an alkyl group of 1 to 5 carbon atoms or a fluorinated alkyl group. Examples of the fluorinated alkyl group for Ra"$^{61}$ to Ra"$^{64}$ include groups in which part or all of the hydrogen atoms within the alkyl group of 1 to 5 carbon atoms have been substituted with a fluorine atom.

In formulae (a6a-2), (a6a-5) and (a6a-6), each $n_{a61}$ independently represents an integer of 1 to 10, preferably an integer of 1 to 8, more preferably an integer of 1 to 4, and still more preferably 1 or 2.

In formula (a6a-6), $n_{a62}$ represents an integer of 1 to 10, preferably an integer of 1 to 8, more preferably an integer of 1 to 4, and still more preferably 1 or 2.

In formula (a6a-7), $n_{a63}$ represents an integer of 0 to 10, preferably an integer of 0 to 5, more preferably an integer of 0 to 3, and still more preferably 0.

In formula (a6a-3), Va"$^{61}$ represents a divalent cyclic hydrocarbon group, and is the same as defined for the "aliphatic hydrocarbonon group containing a ring in the structure thereof" and "aromatic hydrocarbon group" explained above in relation to Va'$^{61}$ in the aforementioned formula (a6a-r-1).

La"$^{61}$ represents —C(=O)—O—, —O—C(=O)—O— or —O—CH$_2$—C(=O)—O—.

In formula (a6a-4), Va"$^{62}$ represents a divalent hydrocarbon group, and is the same as defined for the divalent hydrocarbon group explained above in relation to Va'61 in the aforementioned formula (a6a-r-1).

Ra"$^{65}$ represents a hydrogen atom or an alkyl group of 1 to 5 carbon atoms.

In formula (a6a-6), La"$^{62}$ represents —C(=O)—O—, —O—C(=O)—O— or —NH—C(=O)—O—.

In formula (a6a-7), Ya"$^{61}$ represents a divalent cyclic hydrocarbon group, and is the same as defined for the "aliphatic hydrocarbonon group containing a ring in the structure thereof", the "aromatic hydrocarbon group" and the "divalent linking group containing a hetero atom" (having an "aliphatic hydrocarbonon group containing a ring in the structure thereof" or an "aromatic hydrocarbon group") described later in relation to the divalent linking group for Ya$^{01}$ in the aforementioned general formula (a0-1).

In formula (a6a-8), Va"$^{63}$ represents a divalent cyclic hydrocarbon group or a single bond. The divalent cyclic hydrocarbon group for Va"$^{63}$ is the same as defined for the "aliphatic hydrocarbonon group containing a ring in the structure thereof" and "aromatic hydrocarbon group" explained above in relation to Va'$^{61}$ in the aforementioned formula (a6a-r-1).

In formula (a6a-1) to (a6a-8), m represents an integer of 1 or more, and each M$^{m+}$ independently represents an organic cation having a valency of m. The organic cation for M$^{m+}$ is not particularly limited. As the organic cation, an onium cation having a valency of m is preferable, more preferably a sulfonium cation or an iodonium cation, most preferably an organic cation represented by any one of formulae (ca-1) to (ca-4) described later.

Specific examples of structural unit represented by formula (a6a-1) are shown below. $(M^{m+})_{1/m}$ is the same as defined above.

[Chemical Formula 54]

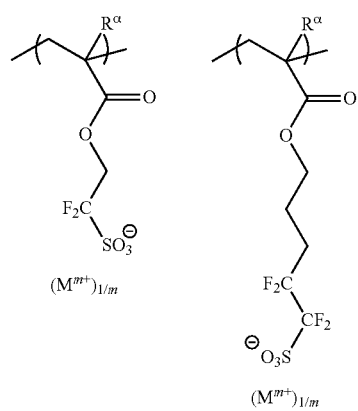

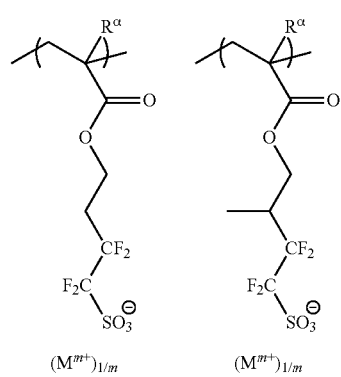

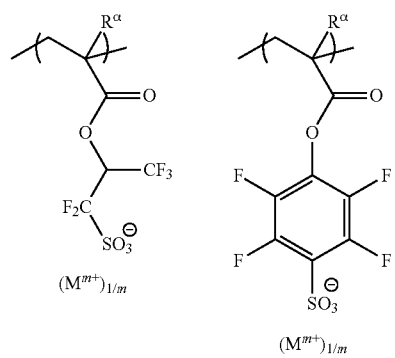

Specific examples of structural unit represented by formula (a6a-2) are shown below.

[Chemical Formula 55]
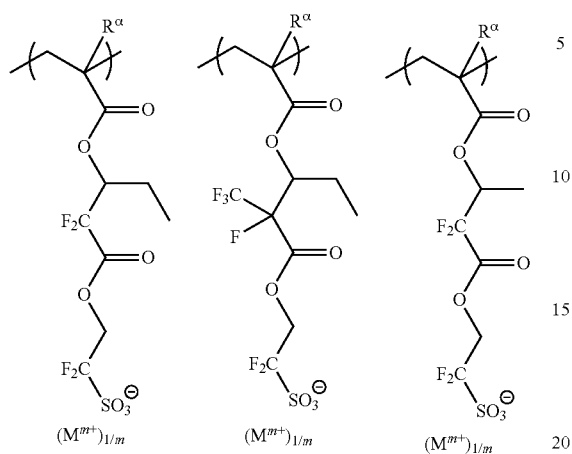
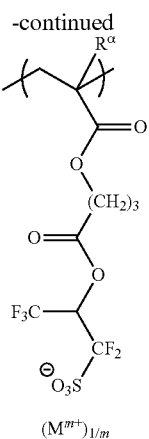
Specific examples of structural unit represented by formula (a6a-3) are shown below.
[Chemical Formula 56]
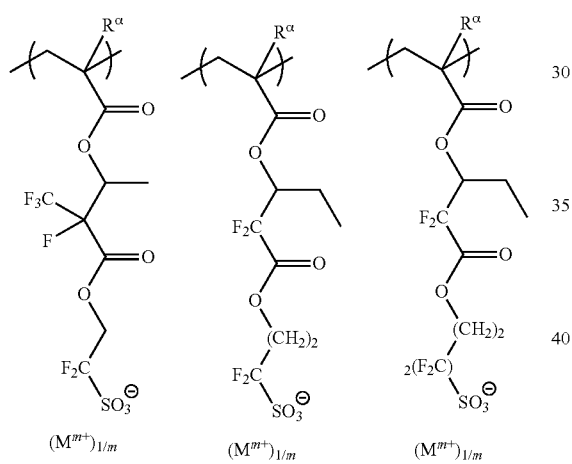
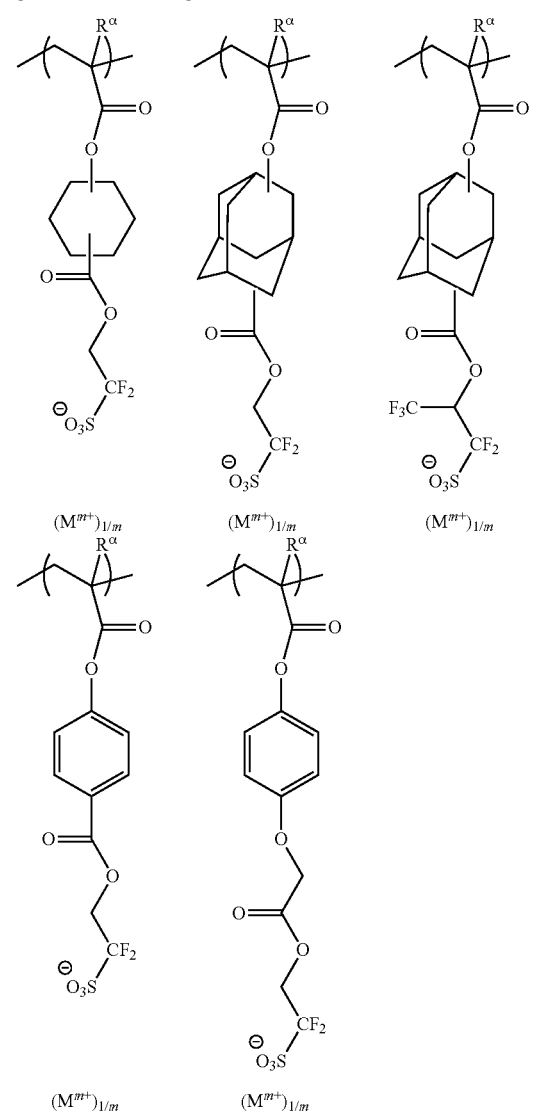

Specific examples of structural unit represented by formula (a6a-4) are shown below.
[Chemical Formula 57]
[Chemical Formula 58]
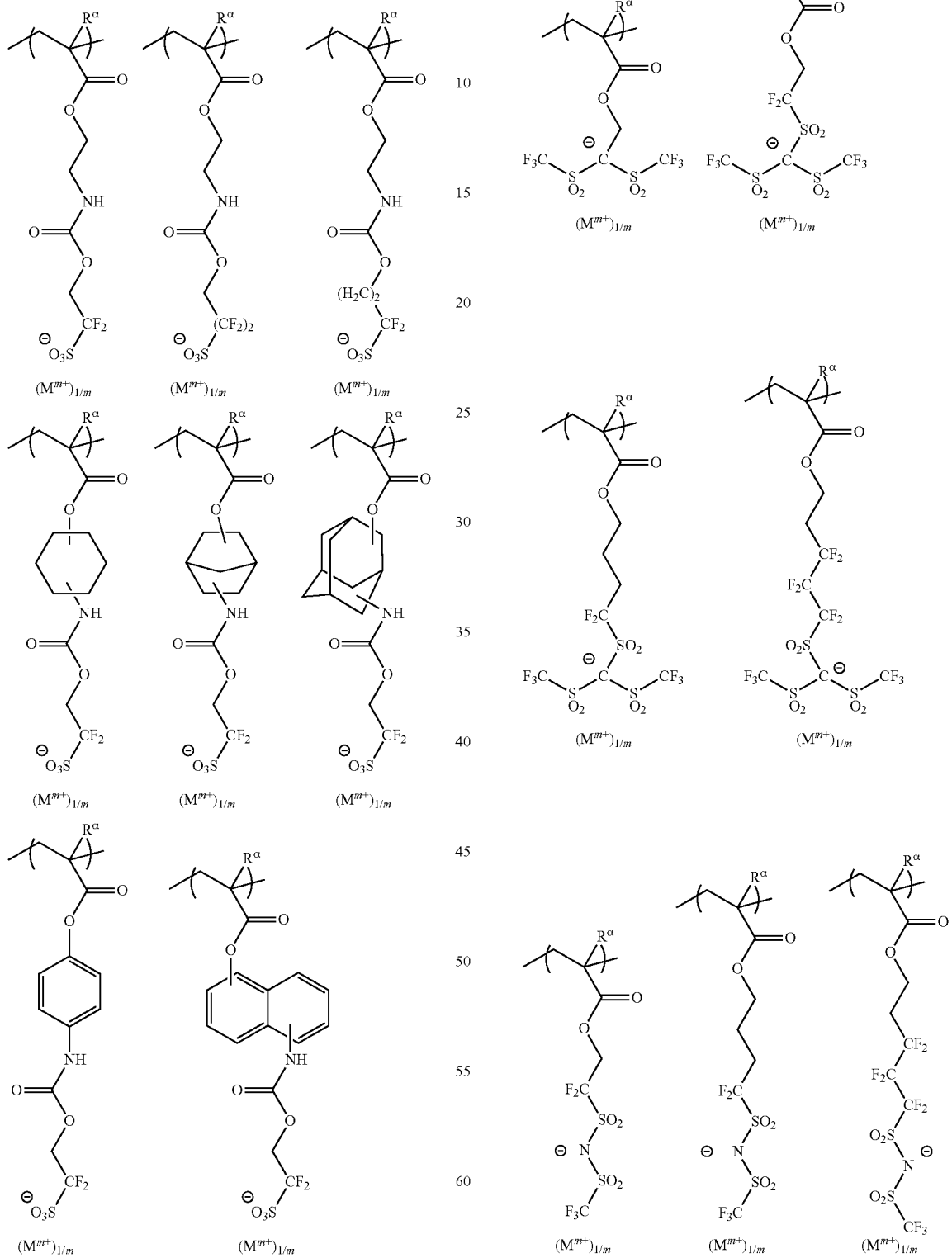
Specific examples of structural unit represented by formula (a6a-5) are shown below.
Specific examples of structural unit represented by formula (a6a-6) are shown below.

[Chemical Formula 59]
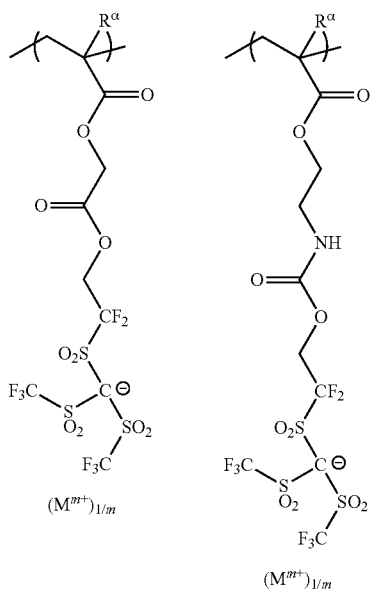
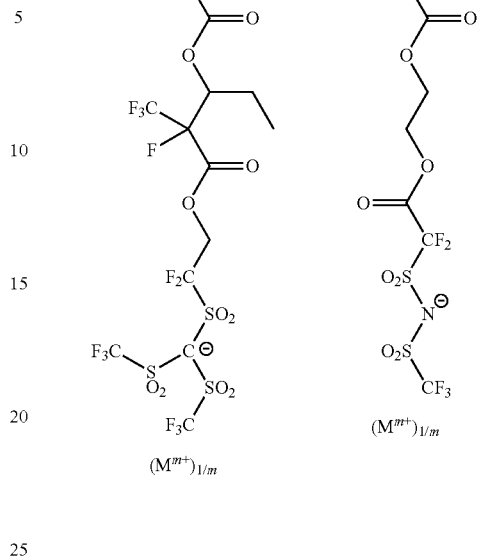
Specific examples of structural unit represented by formula (a6a-7) are shown below.
[Chemical Formula 60]
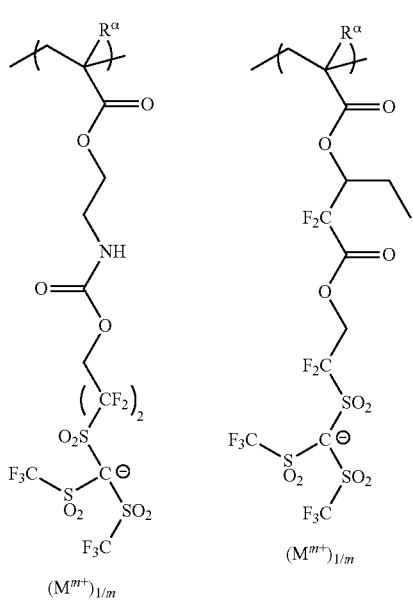
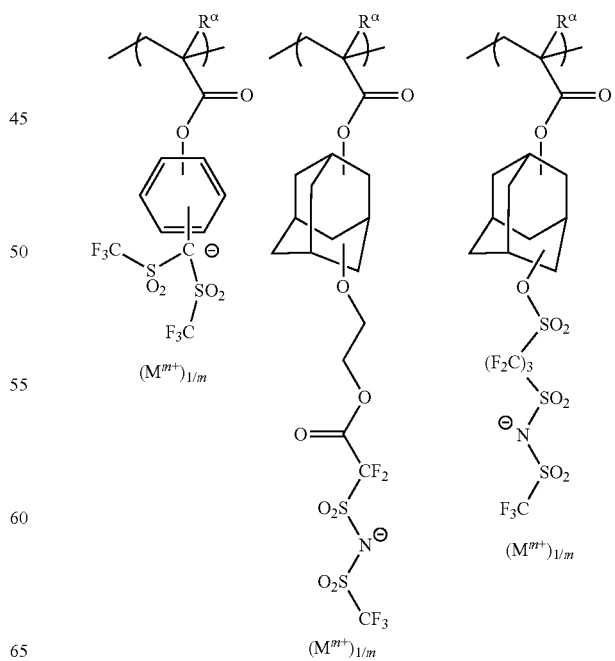

Specific examples of structural unit represented by formula (a6a-8) are shown below.

[Chemical Formula 61]

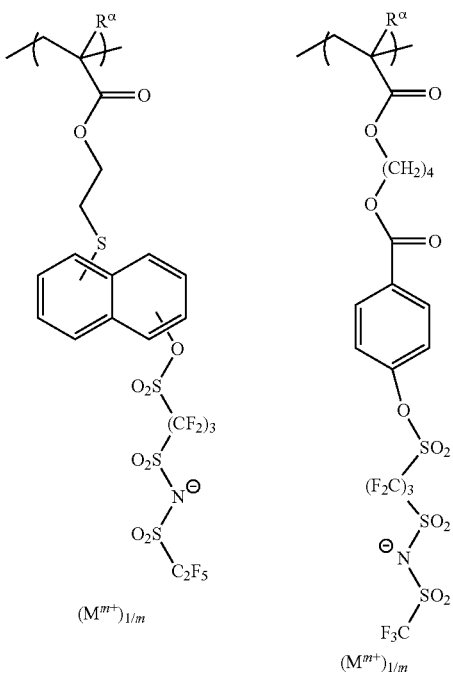
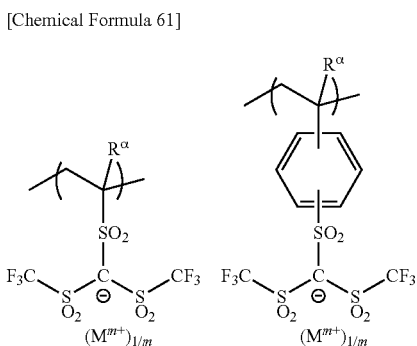
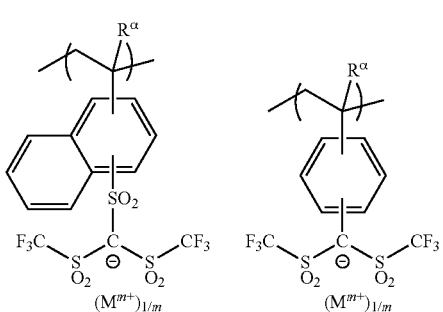

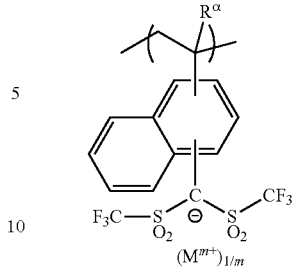

Structural Unit (a6c)

The structural unit (a6a) is a structural unit having a cation group which is decomposed upon exposure on a side chain thereof.

The cation group decomposed upon exposure is not particularly limited, and a group represented by general formula (a6c-r-1) shown below is preferable.

[Chemical Formula 62]

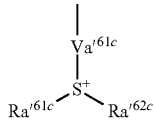

(a6c-r-1)

In the formula, $Ra'^{61c}$ and $Ra'^{62c}$ each independently represents an aryl group which may have a substituent, an alkyl group which may have a substituent or an alkenyl group which may have a substituent; $Va'^{61c}$ represents an arylene group, an alkylene group or an alkenylene group; provided that $Ra'^{61c}$, $Ra'^{62c}$ and $Va'^{61c}$ may be mutually bonded to form a ring with the sulfur atom.

In formula (a6c-r-1), $Ra'^{61c}$ and $Ra'^{62c}$ each independently represents an aryl group which may have a substituent, an alkyl group which may have a substituent or an alkenyl group which may have a substituent. $Ra'^{61c}$ and $Ra'^{62c}$ are the same as defined for the "aryl group which may have a substituent", the "alkyl group which may have a substituent" and the "alkenyl group which may have a substituent" for $R^{201}$ to $R^{203}$ in the aforementioned formula (ca-1).

$Va'^{61c}$ represents an arylene group, an alkylene group or an alkenylene group, and examples thereof include a group in which one hydrogen atom has been removed from an aryl group, an alkyl group or an alkenyl group for $Ra'^{61c}$ and $Ra'^{62c}$.

$Ra'^{61c}$, $Ra'^{62c}$ and $Va'^{61c}$ may be mutually bonded to form a ring with the sulfur atom. Examples of the formed ring structure include a group in which one hydrogen atom has been removed from the ring formed by $R^{201}$ to $R^{203}$ mutually bonded with the sulfur atom in formula (ca-1).

Preferable examples of the structural unit (a6c) include structural units represented by general formulae (a6c-1) to (a6c-3) shown below.

[Chemical Formula 63]

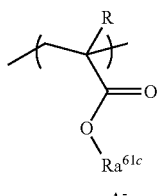
(a6c-1)

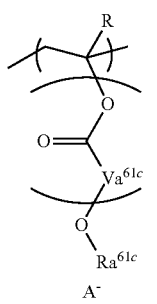
(a6c-2)

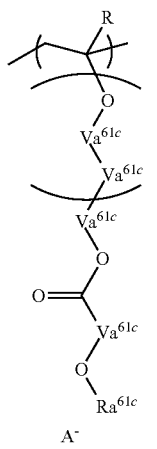
(a6c-3)

In the formula, R represents a hydrogen atom, an alkyl group of 1 to 5 carbon atoms or a halogenated alkyl group of 1 to 5 carbon atoms; each $Va^{61c}$ independently represents an alkylene group of 1 to 5 carbon atoms; $Va^{62c}$ and $Va^{64c}$ each independently represents an alkylene group of 1 to 10 carbon atoms; $Va^{63c}$ represents an aliphatic cyclic group or a single bond; $na^{61c}$ represents an integer of 0 to 2; $na^{62c}$ represents 0 or 1; $Ra^{61c}$ is a group represented by the aforementioned formula (a6c-r-1); and A⁻ represents a counteranion.

In formulae (a6c-1) to (a6c-3), R is the same as defined for R in the aforementioned formula (a0-1). Each $Ra^{61c}$ independently represents a group represented by the aforementioned formula (a6c-r-1).

In formulae (a6c-2) and (a6c-3), each $Va^{61c}$ independently represents an alkylene group of 1 to 5 carbon atoms, preferably an alkylene group of 1 to 3 carbon atoms, and more preferably a methylene group.

In formula (a6c-3), $Va^{62c}$ and $Va^{64c}$ independently represents an alkylene group of 1 to 10 carbon atoms, preferably an alkylene group of 1 to 8 carbon atoms, more preferably an alkylene group of 1 to 5 carbon atoms, and still more preferably an alkylene group of 1 to 3 carbon atoms.

In formula (a6c-3), $Va^{63c}$ represents an aliphatic cyclic group or a single bond. The aliphatic cyclic group for $Va^{63c}$ is the same as defined for the aliphatic cyclic group explained above in relation to $Va'^{61}$ in the aforementioned formula (a6a-r-1).

$na^{61c}$ represents an integer of 0 to 2, preferably 1 or 2.

$na^{62c}$ represents 0 or 1.

In formulae (a6c-1) to (a6c-3), A⁻ represents a counteranion.

The counteranion for A⁻ is not particularly limited, and examples thereof include the anion moiety of an onium salt acid generator represented by general formula (b-1) or (b-2) described later ($R^{4"}SO_3^-$) and an anion represented by general formula (b-3) or (b-4) described later. The counteranion is preferably $R^{4"}SO_3^-$, more preferably a fluorinated alkylsulfonate ion of 1 to 8 carbon atoms (preferably 1 to 4 carbon atoms) or at least one member selected from anions represented by general formulae (an-1) to (an-3) described later.

Specific examples of the structural unit represented by formula (a6c-1), (a6c-2) or (a6c-3) are shown below. A⁻ is the same as defined above,

[Chemical Formula 64]

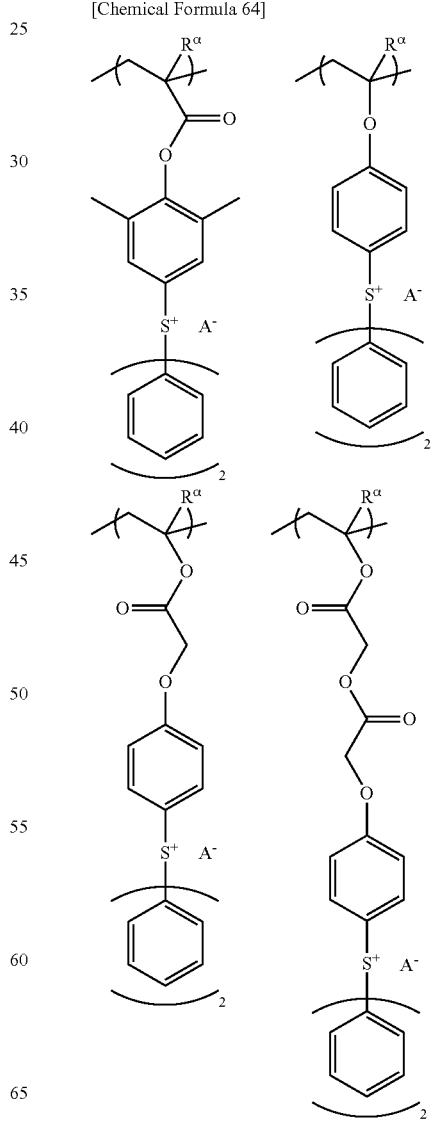

-continued

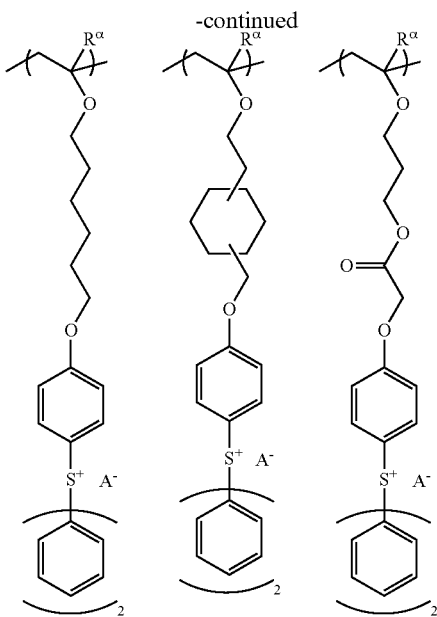

As the structural unit (a6) contained in the component (A1), 1 type of structural unit may be used, or 2 or more types may be used.

As the structural unit (a6a), a structural unit represented by general formula (a6a-1) or (a6a-2) is preferable. As the structural unit (a6c), a structural unit represented by general formula (a6c-1) shown below is preferable.

Among these, as the structural unit (a6), the structural unit (a6a) is preferable.

The amount of the structural unit (a6) within the component (A1) based on the combined total of all structural units constituting the component (A1) is preferably 5 to 70 mol %, more preferably 5 to 60 mol %, and still more preferably 10 to 40 mol %.

When the amount of the structural unit (a6) is at least as large as the lower limit of the above-mentioned range, roughness can be reduced, and an excellent resist pattern can be reliably obtained. On the other hand, when the amount of the structural unit (a6) is no more than the upper limit of the above-mentioned range, a good balance can be achieved with the other structural units, and the lithography properties can be improved.

In the resist composition of the present embodiment, the component (A) containing the component (A1) may be a resin that exhibits increased solubility in a developing solution under action of acid or a resin that exhibits decreased solubility in a developing solution under action of acid.

When the resist composition of the present invention is a "negative resist composition for alkali developing process" that forms a negative-tone resist pattern in an alkali developing process (or a "positive resist composition for solvent developing process" that forms a positive-tone resist pattern in a solvent developing process), as the component (A), a base component (A-2) that is soluble in an alkali developing solution (hereafter, this base component is sometimes referred to as "component (A-2)") is preferably used, and a cross-linking component is further added. In such a resist composition, when acid is generated upon exposure, the action of the acid causes cross-linking between the component (A-2) and the cross-linking component. As a result, the solubility of the resist composition in an alkali developing solution is decreased (the solubility of the resist composition in an organic developing solution is increased). Therefore, in the formation of a resist pattern, by conducting selective exposure of a resist film formed by applying the resist composition to a substrate, the exposed portions become insoluble in an alkali developing solution (soluble in an organic developing solution), whereas the unexposed portions remain soluble in an alkali developing solution (insoluble in an organic developing solution), and hence, a negative resist pattern can be formed by conducting development using an alkali developing solution. Alternatively, in such a case, by developing using an organic developing solution, a positive resist pattern is formed.

The component (A-2) preferably contains a resin soluble in an alkali developing solution (hereafter, referred to as "alkali-soluble resin"), and more preferably contains a polymeric compound which is soluble in an alkali developing solution and has the aforementioned structural units (a0) and (a6).

Examples of the alkali soluble resin include a resin having a structural unit derived from at least one of α-(hydroxyalkyl)acrylic acid and an alkyl ester of α-(hydroxyalkyl)acrylic acid (preferably an alkyl ester having 1 to 5 carbon atoms), as disclosed in Japanese Unexamined Patent Application, First Publication No. 2000-206694; an acrylic resin which has a —$SO_2$—$NH_2$ group and may have the hydrogen atom bonded to the carbon atom on the α-position substituted with a substituent or polycycloolefin resin having a —$SO_2$—$NH_2$ group, as disclosed in U.S. Pat. No. 6,949,325; an acrylic resin which may have the hydrogen atom bonded to the carbon atom on the α-position substituted with a substituent and having a fluorinated alcohol, as disclosed in U.S. Pat. No. 6,949,325, Japanese Unexamined Patent Application, First Publication No. 2005-336452 or Japanese Unexamined Patent Application, First Publication No. 2006-317803; and a polycyclolefin resin having a fluorinated alcohol, as disclosed in Japanese Unexamined Patent Application, First Publication No. 2006-259582. These resins are preferable in that a resist pattern can be formed with minimal swelling.

Here, the term "α-(hydroxyalkyl)acrylic acid" refers to one or both of acrylic acid in which a hydrogen atom is bonded to the carbon atom on the α-position having the carboxyl group bonded thereto, and α-hydroxyalkylacrylic acid in which a hydroxyalkyl group (preferably a hydroxyalkyl group of 1 to 5 carbon atoms) is bonded to the carbon atom on the α-position.

As the cross-linking agent, typically, an amino-based cross-linking agent such as a glycoluril having a methylol group or alkoxymethyl group, or a melamine-based cross-linking agent is preferable, as it enables formation of a resist pattern with minimal swelling. The amount of the cross-linker added is preferably within a range from 1 to 50 parts by weight, relative to 100 parts by weight of the alkali-soluble resin.

In the case where the resist composition of the present invention is a resist composition which forms a positive pattern in an alkali developing process and a negative pattern in a solvent developing process (i.e, a positive type resist compound for alkali developing process) or a resist composition which forms a negative pattern in a solvent developing process (i.e., a negative type resist composition for solvent developing process), as a component (A), it is preferable to use a base component (A-1) (hereafter, referred to as "component (A-1)") which exhibits increased polarity by the action of acid. By using the component (A-1), since the polarity of the base component changes prior to and after exposure, an excellent development contrast can be obtained not only in an alkali developing process, but also in a solvent developing process.

More specifically, in the case of applying an alkali developing process, the component (A-1) is substantially insoluble in an alkali developing solution prior to exposure, but when acid is generated upon exposure, the action of this acid causes an increase in the polarity of the base component, thereby increasing the solubility of the component (A-1) in an alkali developing solution. Therefore, in the formation of a resist pattern, by conducting selective exposure of a resist film formed by applying the resist composition to a substrate, the exposed portions change from an insoluble state to a soluble state in an alkali developing solution, whereas the unexposed portions remain insoluble in an alkali developing solution, and hence, a positive resist pattern can be formed by alkali developing.

On the other hand, in the case of a solvent developing process, the component (A-1) exhibits high solubility in an organic developing solution prior to exposure, and when acid is generated upon exposure, the polarity of the component (A-1) is increased by the action of the generated acid, thereby decreasing the solubility of the component (A-1) in an organic developing solution. Therefore, in the formation of a resist pattern, by conducting selective exposure of a resist film formed by applying the resist composition to a substrate, the exposed portions changes from an soluble state to an insoluble state in an organic developing solution, whereas the unexposed portions remain soluble in an organic developing solution. As a result, by conducting development using an organic developing solution, a contrast can be made between the exposed portions and unexposed portions, thereby enabling the formation of a negative resist pattern.

In the resist composition of the present invention, the component (A) is preferably a component (A1).

In the case where the component (A) is a component (A-1), the component (A-1) preferably includes a structural unit (a1) containing an acid decomposable group that exhibits increased polarity by the action of acid, and more preferably contains a polymeric compound (A1-1) (hereafter, referred to as "component (A1-1)") having the aforementioned structural units (a0), (a6) and (a1).

The component (A1) is preferably a copolymer containing the structural unit (a1). The copolymer containing the structural unit (a1) is preferably a copolymer further containing a structural unit (a2) or (a3), and still more preferably a copolymer containing the structural units (a1), (a2) and (a3).

In the present invention, the weight average molecular weight (Mw) (the polystyrene equivalent value determined by gel permeation chromatography) of the component (A1) is not particularly limited, but is preferably 1,000 to 50,000, more preferably 1,500 to 30,000, and most preferably 2,000 to 20,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) of the component (A1) is not particularly limited, but is preferably 1.0 to 5.0, more preferably 1.0 to 3.0, and most preferably 1.2 to 2.5.

Here, Mn is the number average molecular weight.

As the component (A1), one type may be used alone, or two or more types may be used in combination.

In the component (A), the amount of the component (A1) based on the total weight of the component (A) is preferably 25% by weight or more, more preferably 50% by weight or more, still more preferably 75% by weight or more, and may be even 100% by weight. When the amount of the component (A1) is 25% by weight or more, various lithography properties are improved, such as improvement in MEF and circularity, and reduction of roughness.

In the resist composition of the present invention, as the component (A), one type may be used, or two or more types of compounds may be used in combination.

In the resist composition of the present invention, the amount of the component (A) can be appropriately adjusted depending on the thickness of the resist film to be formed, and the like.

The resist composition according to the present embodiment may contain an acid generator component (B) described below.

As the component (B), there is no particular limitation, and any of the known acid generators used in conventional chemically amplified resist compositions can be used.

Examples of these acid generators are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethanes; nitrobenzylsulfonate acid generators; iminosulfonate acid generators; and disulfone acid generators. Among these, it is preferable to use an onium salt acid generator.

As the onium salt acid generator, a compound represented by general formula (b-1) below (hereafter, sometimes referred to as "component (b-1)"), a compound represented by general formula (b-2) below (hereafter, sometimes referred to as "component (b-2)") or a compound represented by general formula (b-3) below (hereafter, sometimes referred to as "component (b-3)") may be used.

[Chemical Formula 65]

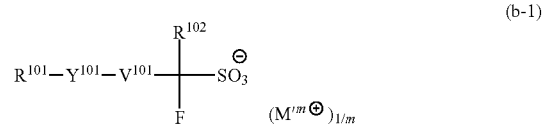

(b-1)

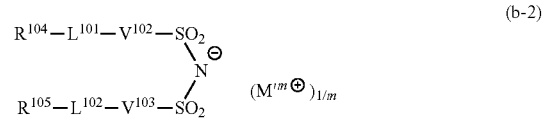

(b-2)

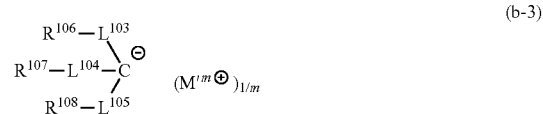

(b-3)

In the formulae, $R^{101}$ and $R^{104}$ to $R^{108}$ each independently represents a cyclic group which may have a substituent, a chain-like alkyl group which may have a substituent or a chain-like alkenyl group which may have a substituent, provided that $R^{104}$ and $R^{105}$ may be mutually bonded to form a ring; $R^{106}$ and $R^{107}$ may be mutually bonded to form a ring; $R^{102}$ represents a fluorine atom or a fluorinated alkyl group of 1 to 5 carbon atoms; $Y^{101}$ represents a single bond or a divalent linking group containing an oxygen atom; $V^{101}$ to $V^{103}$ each independently represents a single bond, an alkylene group or a fluorinated alkylene group; $L^{101}$ and $L^{102}$ each independently represents a single bond or an oxygen atom; $L^{103}$ to $L^{105}$ each independently represents a single bond, —CO— or —SO$_2$—; and $M'^{m+}$ represents an organic cation having a valency of m.

{Anion Moiety}

Anion Moiety of Component (b-1)

In the formula (b-1), $R^{101}$ represents a cyclic group which may have a substituent, a chain-like alkyl group which may have a substituent or a chain-like alkenyl group which may have a substituent.

(Cyclic Group which May have a Substituent)

The cyclic group is preferably a cyclic hydrocarbon group, and the cyclic hydrocarbon group may be either an aromatic hydrocarbon group or an aliphatic hydrocarbon group.

As the aromatic hydrocarbon group for $R^{101}$, groups in which one hydrogen atom has been removed from an aromatic hydrocarbon ring described above in relation to the divalent aromatic hydrocarbon group for $Va^1$ in the formula (a1-1) or an aromatic compound containing two or more aromatic ring can be mentioned, and a phenyl group or a naphthyl group is preferable.

As the cyclic aliphatic hydrocarbon group for $R^{101}$, groups in which one hydrogen atom has been removed from a monocycloalkane or a polycycloalkane exemplified above in the explanation of the divalent aliphatic hydrocarbon group for $Va^1$ in the formula (a1-1) can be mentioned. Among polycycloalkanes, a polycycloalkane having a bridged ring polycyclic skeleton, such as an adamantyl group or a norbornyl group, and a polycycloalkane having a condensed ring polycyclic skeleton, such as a cyclic group having a steroid skeleton are preferable. In the present specification, a steroid skeleton refers to a skeleton (st) shown below which has three 6-membered rings and one 5-membered ring bonded.

[Chemical Formula 66]

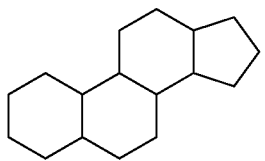

(st)

Further, the cyclic hydrocarbon group for $R^{101}$ may contain a hetero atom like as a heterocycle, and specific examples thereof include lactone-containing cyclic groups represented by the aforementioned general formulas (a2-r-1) to (a2-r-7), —SO$_2$— containing cyclic groups represented by the aforementioned formulas (a5-r-1) to (a5-r-4) and heterocycles shown below.

[Chemical Formula 67]

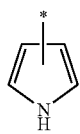

(r-hr-1)

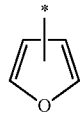

(r-hr-2)

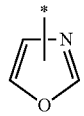

(r-hr-3)

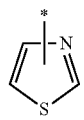

(r-hr-4)

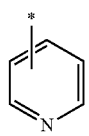

(r-hr-5)

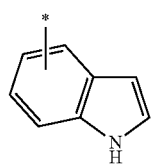

(r-hr-6)

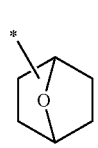

(r-hr-7)

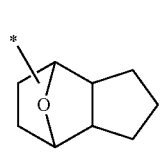

(r-hr-8)

(r-hr-9)

(r-hr-10)

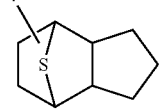

(r-hr-11)

(r-hr-12)

(r-hr-13)

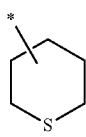
(r-hr-14)

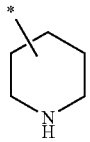
(r-hr-15)

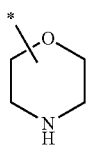
(r-hr-16)

As the substituent for the cyclic hydrocarbon group for $R^{101}$, an alkyl group, an alkoxy group, a halogen atom, a halogenated alkyl group, a hydroxyl group, a carbonyl group, a nitro group or the like can be used.

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, isopropoxy group, n-butoxy group or tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Example of the aforementioned halogenated alkyl group includes a group in which a part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

(Chain-Like Alkyl Group which May have a Substituent)

The chain-like alkyl group for $R^{101}$ may be linear or branched.

The linear alkyl group preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched alkyl group preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

(Chain-Like Alkenyl Group which May have a Substituent)

The chain-like alkenyl group for $R^{101}$ may be linear or branched, and preferably has 2 to 10 carbon atoms, more preferably 2 to 5 carbon atoms, still more preferably 2 to 4 carbon atoms, and most preferably 3 carbon atoms. Examples of linear alkenyl groups include a vinyl group, a propenyl group (an allyl group) and a butynyl group. Examples of branched alkenyl groups include a 1-methylpropenyl group and a 2-methylpropenyl group.

Among the above-mentioned examples, as the chain-like alkenyl group, a propenyl group is particularly desirable.

As the substituent for the chain-like alkyl group or alkenyl group for $R^{101}$, an alkoxy group, a halogen atom, a halogenated alkyl group, a hydroxyl group, a carbonyl group, a nitro group, an amino group, a cyclic group for $R^{101}$ or the like can be used.

Among these examples, as $R^{101}$, a cyclic group which may have a substituent is preferable, and a cyclic hydrocarbon group which may have a substituent is more preferable. Specifically, a phenyl group, a naphthyl group, a group in which one or more hydrogen atoms have been removed from a polycycloalkane, a lactone-containing cyclic group represented by any one of the aforementioned formula (a2-r-1) to (a2-r-7), and an —$SO_2$— containing cyclic group represented by any one of the aforementioned formula (a5-r-1) to (a5-r-4).

In formula (b-1), $Y^{101}$ represents a single bond or a divalent linking group containing an oxygen atom.

In the case where $Y^{101}$ is a divalent linking group containing an oxygen atom, $Y^{101}$ may contain an atom other than an oxygen atom. Examples of atoms other than an oxygen atom include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an oxycarbonyl group (—O—C(=O)—), an amido bond (—C(=O)—NH—), a carbonyl group (—C(=O)—) and a carbonate bond (—O—C(=O)—O—); and combinations of the aforementioned non-hydrocarbon, hetero atom-containing linking groups with an alkylene group. Furthermore, the combinations may have a sulfonyl group (—$SO_2$—) bonded thereto. As the combination, the linking group represented by formulas (y-al-1) to (y-al-7) shown below can be mentioned.

[Chemical Formula 68]

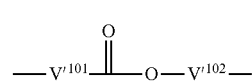
(y-al-1)

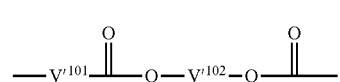
(y-al-2)

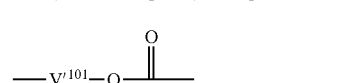
(y-al-3)

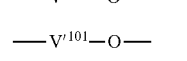
(y-al-4)

-continued

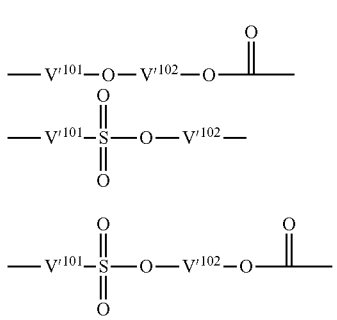
(y-al-5)
(y-al-7)

In the formulae, $V'^{101}$ represents a single bond or an alkylene group of 1 to 5 carbon atoms; $V'^{102}$ represents a divalent saturated hydrocarbon group of 1 to 30 carbon atoms.

The divalent saturated hydrocarbon group for $V'^{102}$ is preferably an alkylene group of 1 to 30 carbon atoms.

The alkylene group for $V'^{101}$ and $V'^{102}$ may be a linear alkylene group or a branched alkylene group, and a linear alkylene group is preferable.

Specific examples of the alkylene group for $V'^{101}$ and $V'^{102}$ include a methylene group [—$CH_2$—]; an alkylmethylene group, such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$— and —$C(CH_2CH_3)_2$—; an ethylene group [—$CH_2CH_2$—]; an alkylethylene group, such as —$CH(CH_3)CH_2$—, —$CH(CH_3)CH(CH_3)$—, —$C(CH_3)_2CH_2$— and —$CH(CH_2CH_3)CH_2$—; a trimethylene group (n-propylene group) [—$CH_2CH_2CH_2$—]; an alkyltrimethylene group, such as —$CH(CH_3)CH_2CH_2$— and —$CH_2CH(CH_3)CH_2$—; a tetramethylene group [—$CH_2CH_2CH_2CH_2$—]; an alkyltetramethylene group, such as —$CH(CH_3)CH_2CH_2CH_2$—, —$CH_2CH(CH_3)CH_2CH_2$—; and a pentamethylene group [—$CH_2CH_2CH_2CH_2CH_2$—].

Further, part of methylene group within the alkylene group for $V'^{101}$ and $V'^{102}$ may be substituted with a divalent aliphatic cyclic group of 5 to 10 carbon atoms. The aliphatic cyclic group is preferably a divalent group in which one hydrogen atom has been removed from the cyclic aliphatic hydrocarbon group for $Ra^{r3}$ in the aforementioned formula (a1-r-1), and a cyclohexylene group, 1,5-adamantylene group or 2,6-adamantylene group is preferable.

$Y^{101}$ is preferably a divalent linking group containing an ether bond or an ester bond, and groups represented by the aforementioned formulas (y-al-1) to (y-al-5) are preferable.

In formula (b-1), $V^{101}$ represents a single bond, an alkylene group or a fluorinated alkylene group. The alkylene group and the fluorinated alkylene group for $V^{101}$ preferably has 1 to 4 carbon atoms. Examples of the fluorinated alkylene group for $V^{101}$ include a group in which part or all of the hydrogen atoms within the alkylene group for $V^{101}$ have been substituted with fluorine. Among these examples, as $V^{101}$, a single bond or a fluorinated alkylene group of 1 to 4 carbon atoms is preferable.

In formula (b-1), $R^{102}$ represents a fluorine atom or a fluorinated alkyl group of 1 to 5 carbon atoms. $R^{102}$ is preferably a fluorine atom or a perfluoroalkyl group of 1 to 5 carbon atoms, and more preferably a fluorine atom.

As specific examples of anion moieties of the formula (b-1), in the case where $Y^{101}$ a single bond, a fluorinated alkylsulfonate anion such as a trifluoromethanesulfonate anion or a perfluorobutanesulfonate anion can be mentioned; and in the case where $Y^{101}$ represents a divalent linking group containing an oxygen atom, anions represented by formulae (an-1) to (an-3) shown below can be mentioned.

[Chemical Formula 69]

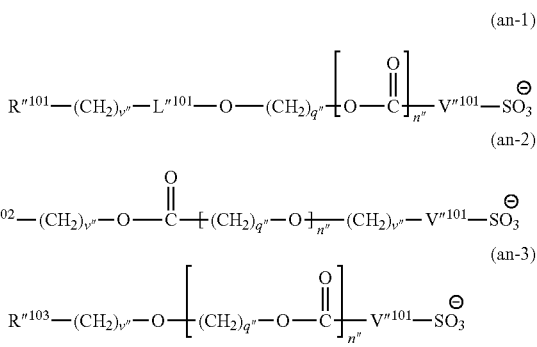

In the formulae, $R'''^{101}$ represents an aliphatic cyclic group which may have a substituent, a group represented by any one of the aforementioned formulae (r-hr-1) to (r-hr-6) or a chain-like alkyl group which may have a substituent; $R'''^{102}$ represents an aliphatic cyclic group which may have a substituent, a lactone-containing cyclic group represented by any one of the aforementioned formulae (a2-r-1) to (a2-r-7) or an —$SO_2$— containing cyclic group represented by any one of the aforementioned formulae (a5-r-1) to (a5-r-4); $R'''^{103}$ represents an aromatic cyclic group which may have a substituent, an aliphatic cyclic group which may have a substituent or a chain-like alkenyl group which may have a substituent; $V'''^{101}$ represents a fluorinated alkylene group; $L'''^{101}$ represents —$C(=O)$— or —$SO_2$—; v" represents an integer of 0 to 3; q" represents an integer of 1 to 20; and n" represents 0 or 1.

As the aliphatic cyclic group for $R'''^{101}$, $R'''^{102}$ and $R'''^{103}$ which may have a substituent, the same groups as the cyclic aliphatic hydrocarbon group for $R^{101}$ described above are preferable. As the substituent, the same groups as those described above for substituting the cyclic aliphatic hydrocarbon group for $R^{101}$ can be mentioned.

As the aromatic cyclic group for $R'''^{103}$ which may have a substituent, the same groups as the aromatic hydrocarbon group for the cyclic hydrocarbon group represented by $R^{101}$ described above are preferable. The substituent is the same as defined for the substituent for the aromatic hydrocarbon group represented by $R^{101}$.

As the chain-like alkyl group for $R'''^{101}$ which may have a substituent, the same groups as those described above for $R^{101}$ are preferable. As the chain-like alkenyl group for $R'''^{103}$ which may have a substituent, the same groups as those described above for $R^{101}$ are preferable. $V'''^{101}$ is preferably a fluorinated alkylene group of 1 to 3 carbon atoms, and most preferably —$CF_2$—, —$CF_2CF_2$—, —$CHFCF_2$—, —$CF(CF_3)CF_2$— or —$CH(CF_3)CF_2$—.

Anion Moiety of Component (b-2)

In formula (b-2), $R^{104}$ and $R^{105}$ each independently represents a cyclic group which may have a substituent, a chain-like alkyl group which may have a substituent or a chain-like alkenyl group which may have a substituent, and is the same as defined for $R^{101}$ in formula (b-1). $R^{104}$ and $R^{105}$ may be mutually bonded to form a ring.

As $R^{104}$ and $R^{105}$, a chain-like alkyl group which may have a substituent is preferable, and a linear or branched alkyl group or a linear or branched fluorinated alkyl group is more preferable.

The chain-like alkyl group preferably has 1 to 10 carbon atoms, more preferably 1 to 7 carbon atoms, and still more preferably 1 to 3 carbon atoms. The smaller the number of carbon atoms of the chain-like alkyl group for $R^{104}$ and $R^{105}$, the more the solubility in a resist solvent is improved. Further, in the chain-like alkyl group for $R^{104}$ and $R^{105}$, it is preferable that the number of hydrogen atoms substituted with fluorine atoms is as large as possible because the acid strength increases and the transparency to high energy radiation of 200 nm or less or electron beam is improved. The fluorination ratio of the chain-like alkyl group is preferably from 70 to 100%, more preferably from 90 to 100%, and it is particularly desirable that the chain-like alkyl group be a perfluoroalkyl group in which all hydrogen atoms are substituted with fluorine atoms.

In formula (b-2), $V^{102}$ and $V^{103}$ each independently represents a single bond, an alkylene group or a fluorinated alkylene group, and is the same as defined for $V^{101}$ in formula (b-1).

In formula (b-2), $L^{101}$ and $L^{102}$ each independently represents a single bond or an oxygen atom.

Anion Moiety of Component (b-3)

In formula (b-3), $R^{106}$ to $R^{108}$ each independently represents a cyclic group which may have a substituent, a chain-like alkyl group which may have a substituent or a chain-like alkenyl group which may have a substituent, and is the same as defined for $R^{101}$ in formula (b-1).

$L^{103}$ to $L^{105}$ each independently represents a single bond, —CO— or —SO$_2$—.

{Cation Moiety}

In formulae (b-1), (b-2) and (b-3), $M'^{m+}$ represents an organic cation having a valency of m other than the cation moiety of the compound (B11), preferably a sulfonium cation or an iodonium cation, and most preferably a cation represented by any one of formulae (ca-1) to (ca-4) shown below.

[Chemical Formula 70]

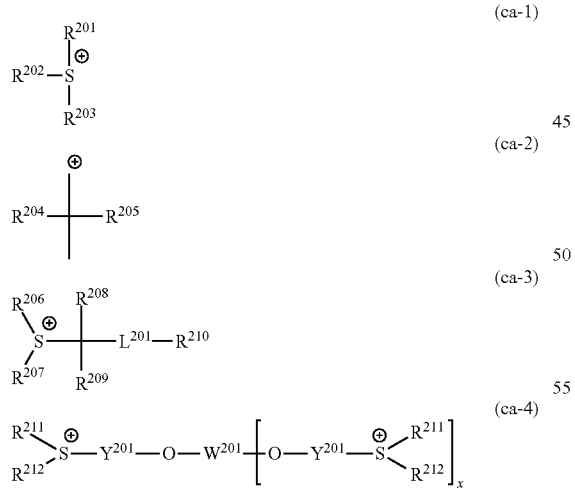

In the formulae, $R^{201}$ to $R^{207}$, $R^{211}$ and $R^{212}$ independently represents an aryl group, an alkyl group or an alkenyl group, provided that two of $R^{201}$ to $R^{203}$, $R^{206}$ and $R^{207}$, or $R^{211}$ and $R^{212}$ may be mutually bonded to form a ring with the sulfur atom; $R^{208}$ and $R^{209}$ each independently represents a hydrogen atom or an alkyl group of 1 to 5 carbon atoms; $R^{210}$ represents an aryl group which may have a substituent, an alkyl group which may have a substituent, an alkenyl group which may have a substituent or an —SO$_2$— containing cyclic group which may have a substituent; $L^{201}$ represents —C(=O)— or —C(=O)—O—; $Y^{201}$ each independently represents an arylene group, an alkylene group or an alkenylene group; x represents 1 or 2; and $W^{201}$ represents a linking group having a valency of (x+1).

As the aryl group for $R^{201}$ to $R^{207}$, $R^{211}$ and $R^{212}$, an unsubstituted aryl group of 6 to 20 carbon atoms can be mentioned, and a phenyl group or a naphthyl group is preferable.

The alkyl group for $R^{201}$ to $R^{207}$, $R^{211}$ and $R^{212}$ is preferably a chain-like or cyclic alkyl group having 1 to 30 carbon atoms.

The alkenyl group for $R^{201}$ to $R^{207}$, $R^{211}$ and $R^{212}$ preferably has 2 to 10 carbon atoms.

Specific examples of the substituent which $R^{201}$ to $R^{207}$ and $R^{210}$ to $R^{212}$ may have include an alkyl group, a halogen atom, a halogenated alkyl group, a carbonyl group, a cyano group, an amino group, an aryl group, an arylthio group and groups represented by formulae (ca-r-1) to (ca-r-7) shown below.

The aryl group within the arylthio group as the substituent is the same as defined for $R^{101}$, and specific examples include a phenylthio group and a biphenylthio group.

[Chemical Formula 71]

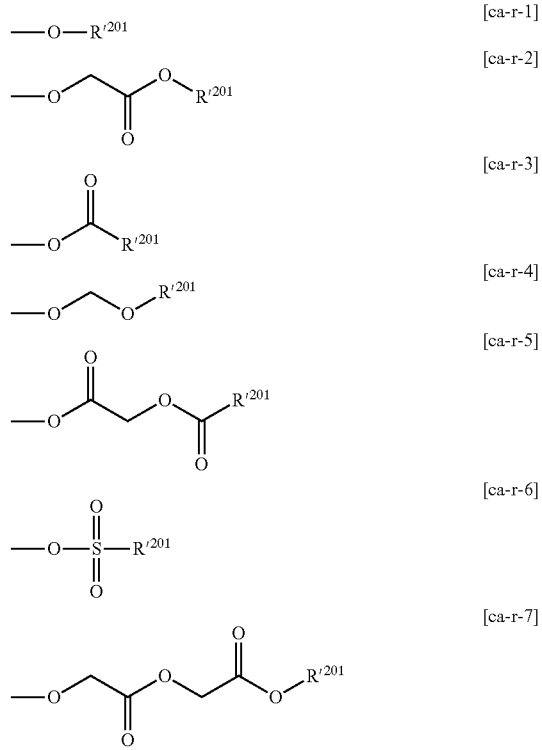

In the formulae, $R'^{201}$ each independently represents a hydrogen atom, a cyclic group which may have a substituent, a chain-like alkyl group which may have a substituent or a chain-like alkenyl group which may have a substituent.

As the cyclic group which may have a substituent, the chain-like alkyl group which may have a substituent and the chain-like alkenyl group which may have a substituent for $R'^{201}$, the same groups as those described above for $R^{101}$ can be mentioned. As the cyclic group which may have a substituent and chain-like alkyl group which may have a substituent, the same groups as those described above for the acid dissociable group represented by the aforementioned formula (a1-r-2) can be also mentioned.

When $R^{201}$ to $R^{203}$, $R^{206}$, $R^{207}$, $R^{211}$ and $R^{212}$ are mutually bonded to form a ring with the sulfur atom, these groups may be mutually bonded via a hetero atom such as a sulfur atom, an oxygen atom or a nitrogen atom, or a functional group such as a carbonyl group, —SO—, —SO$_2$—, —SO$_3$—, —COO—, —CONH— or —N(R$_N$)— (wherein R$_N$ represents an alkyl group of 1 to 5 carbon atoms). The ring containing the sulfur atom in the skeleton thereof is preferably a 3 to 10-membered ring, and most preferably a 5 to 7-membered ring. Specific examples of the ring formed include a thiophene ring, a thiazole ring, a benzothiophene ring, a thianthrene ring, a benzothiophene ring, a dibenzothiophene ring, a 9H-thioxanthene ring, a thioxanthone ring, a phenoxathiin ring, a tetrahydrothiophenium ring, and a tetrahydrothiopyranium ring.

$R^{208}$ and $R^{209}$ each independently represents a hydrogen atom or an alkyl group of 1 to 5 carbon atoms, preferably a hydrogen atom or an alkyl group of 1 to 3 carbon atoms, and when $R^{208}$ and $R^{209}$ each represents an alkyl group, $R^{208}$ and $R^{209}$ may be mutually bonded to form a ring.

$R^{210}$ represents an aryl group which may have a substituent, an alkyl group which may have a substituent, an alkenyl group which may have a substituent, or an —SO$_2$— containing cyclic group which may have a substituent.

Examples of the aryl group for $R^{210}$ include an unsubstituted aryl group of 6 to 20 carbon atoms, and a phenyl group or a naphthyl group is preferable.

As the alkyl group for $R^{210}$, a chain-like or cyclic alkyl group having 1 to 30 carbon atoms is preferable.

The alkenyl group for $R^{210}$ preferably has 2 to 10 carbon atoms.

As the —SO$_2$— containing cyclic group for $R^{210}$ which may have a substituent, the same "—SO$_2$— containing cyclic groups" as those described above for Ra$^{21}$ in the aforementioned general formula (a2-1) can be mentioned, and the group represented by the aforementioned general formula (a5-r-1) is preferable.

Each $Y^{201}$ independently represents an arylene group, an alkylene group or an alkenylene group.

Examples of the arylene group for $Y^{201}$ include groups in which one hydrogen atom has been removed from an aryl group given as an example of the aromatic hydrocarbon group for $R^{101}$ in the aforementioned formula (b-1).

The alkylene group and the alkenylene group for $Y^{201}$ is the same as defined for the aliphatic hydrocarbon group as the divalent linking group represented by Va$^1$ in the aforementioned general formula (a1-1).

In the formula (ca-4), x represents 1 or 2.

$W^{201}$ represents a linking group having a valency of (x+1), i.e., a divalent or trivalent linking group.

As the divalent linking group for $W^{201}$, a divalent hydrocarbon group which may have a substituent is preferable, and as examples thereof, the same hydrocarbon groups as those described above for Ya$^{21}$ in the general formula (a2-1) can be mentioned. The divalent linking group for $W^{201}$ may be linear, branched or cyclic, and cyclic is more preferable. Among these, an arylene group having two carbonyl groups, each bonded to the terminal thereof is preferable. Examples of the arylene group include a phenylene group and a naphthylene group, and a phenylene group is particularly desirable.

As the trivalent linking group for $W^{201}$, a group in which one hydrogen atom has been removed from the aforementioned divalent linking group for $W^{201}$ and a group in which the divalent linking group has been bonded to another divalent linking group can be mentioned. The trivalent linking group for $W^{201}$ is preferably a group in which 2 carbonyl groups are bonded to an arylene group.

Specific examples of preferable cations represented by formula (ca-1) include cations represented by formulae (ca-1-1) to (ca-1-63) shown below.

[Chemical Formula 72]

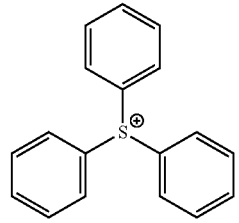

(ca-1-1)

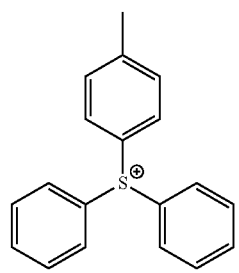

(ca-1-2)

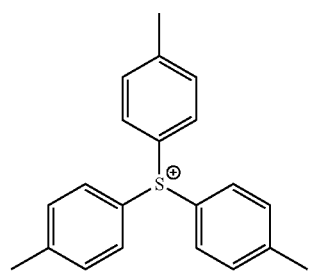

(ca-1-3)

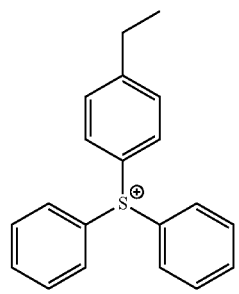

(ca-1-4)

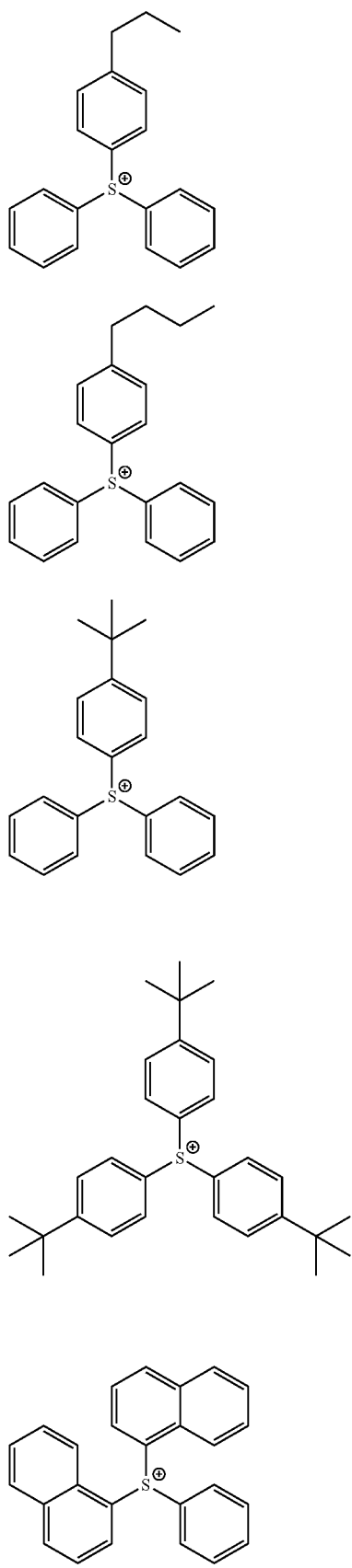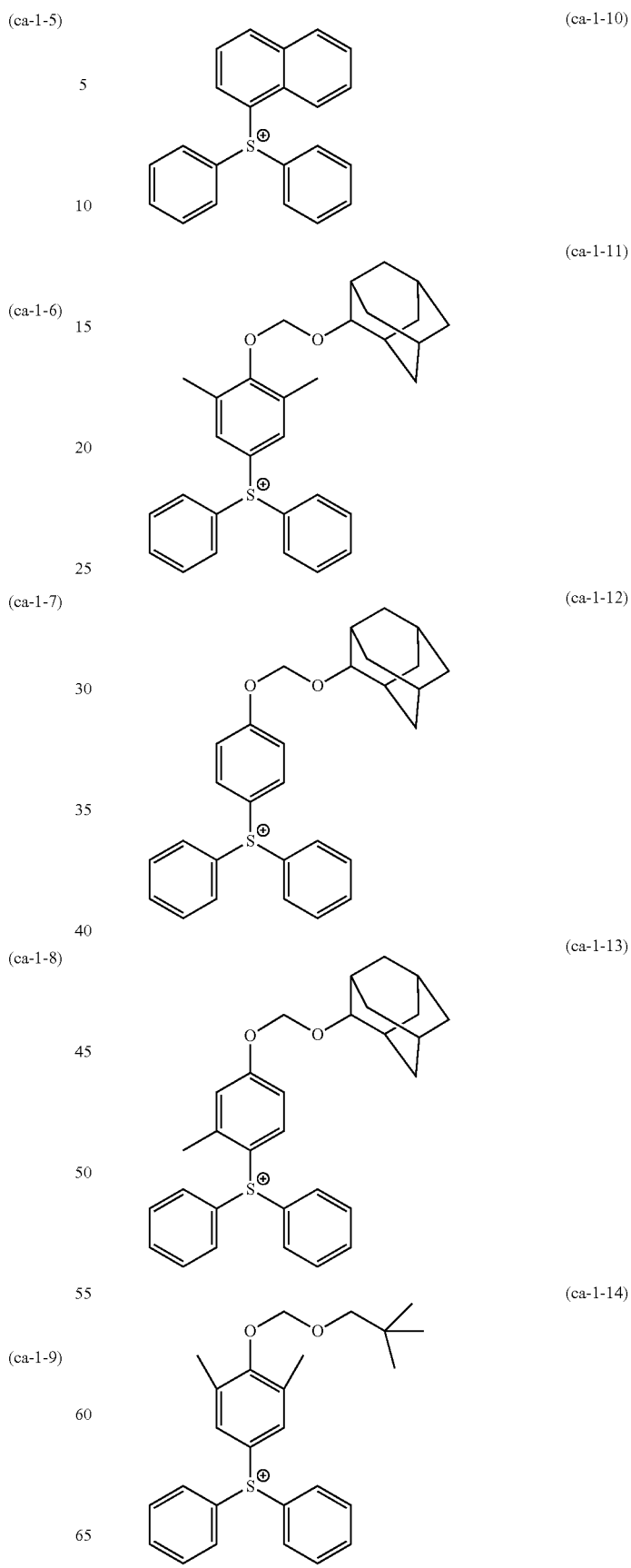

-continued
(ca-1-15)
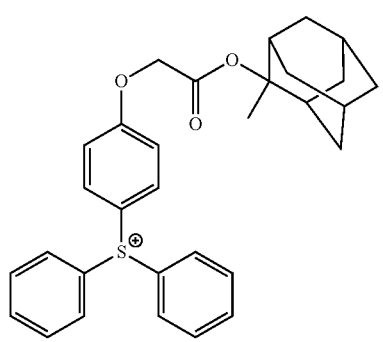
(ca-1-16)
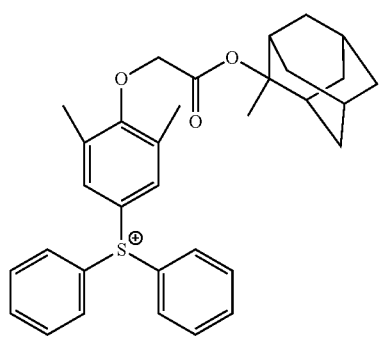
[Chemical Formula 73]
(ca-1-17)
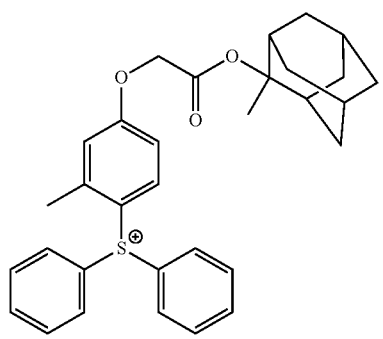
(ca-1-18)
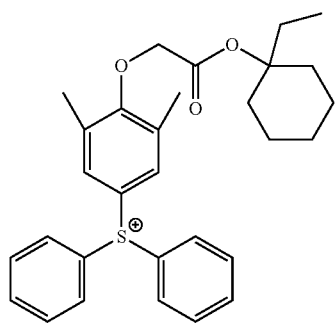
-continued
(ca-1-19)
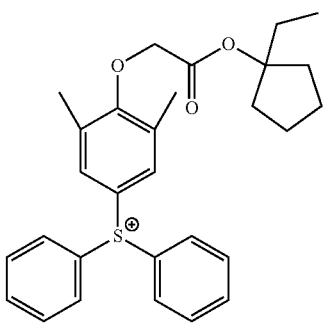
(ca-1-20)
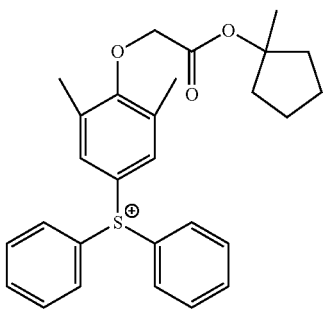
(ca-1-21)
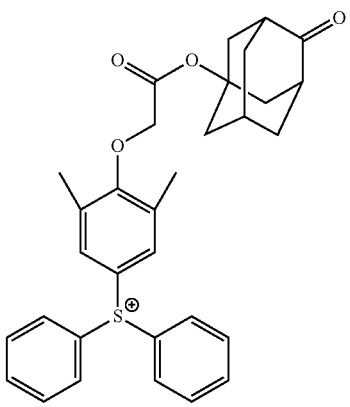
(ca-1-22)
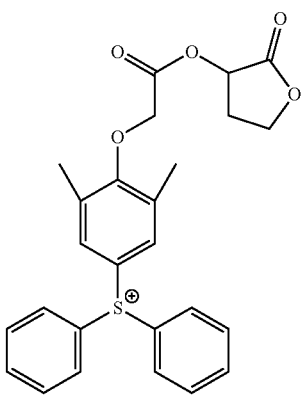

(ca-1-23) 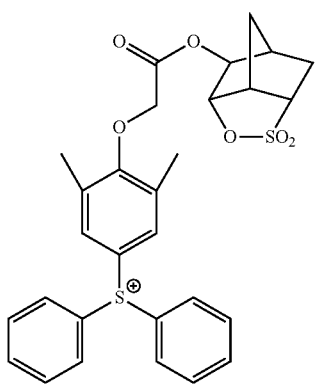
(ca-1-24) 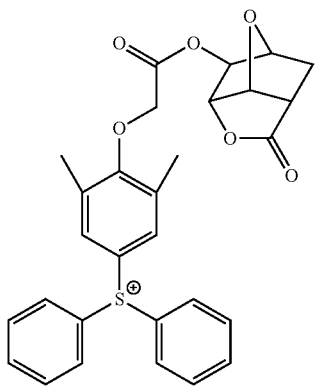
(ca-1-25) 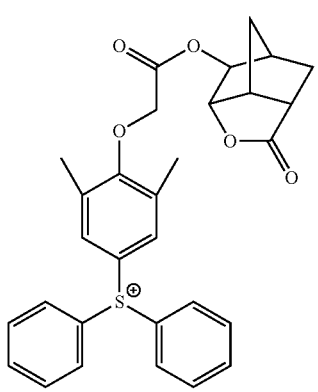
(ca-1-26) 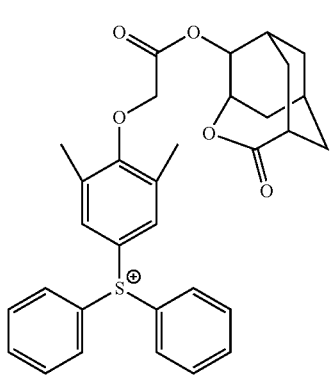
(ca-1-27) 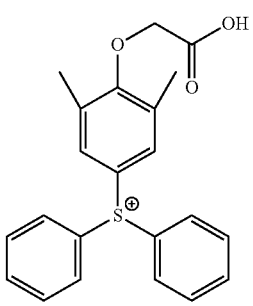
(ca-1-28) 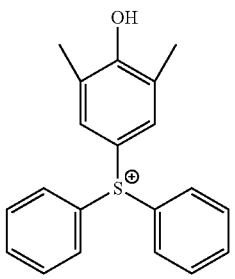
(ca-1-29) 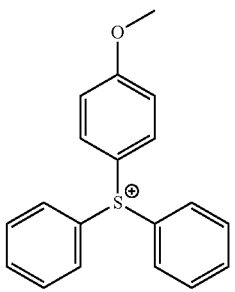
(ca-1-30) 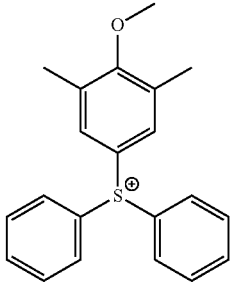
(ca-1-31)

(ca-1-32)
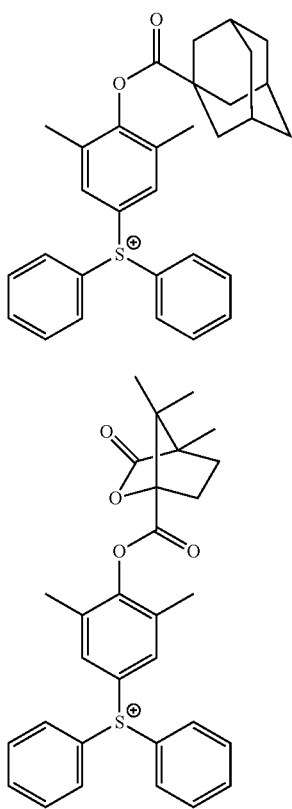
(ca-1-33)
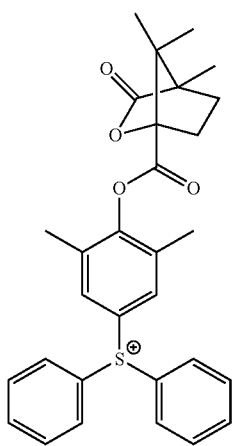
[Chemical Formula 74]
(ca-1-34)
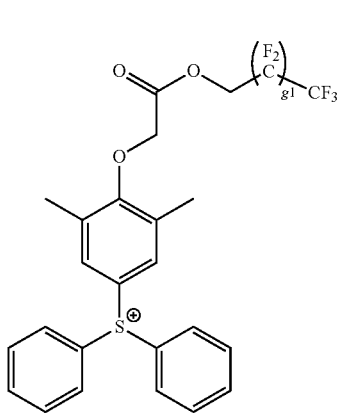
(ca-1-35)
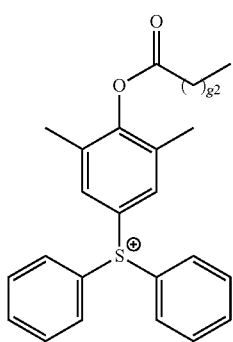
(ca-1-36)
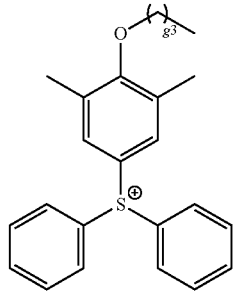
(ca-1-37)
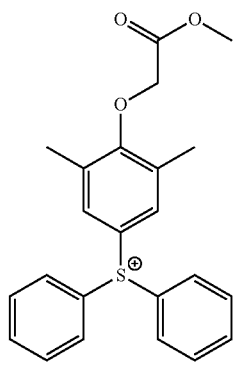
(ca-1-38)
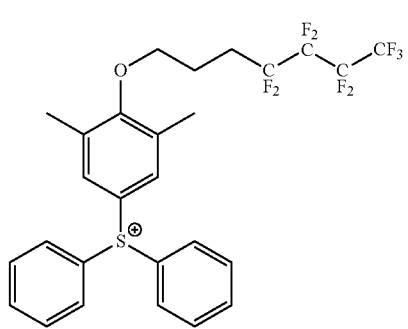
(ca-1-39)
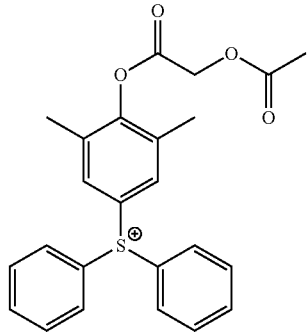

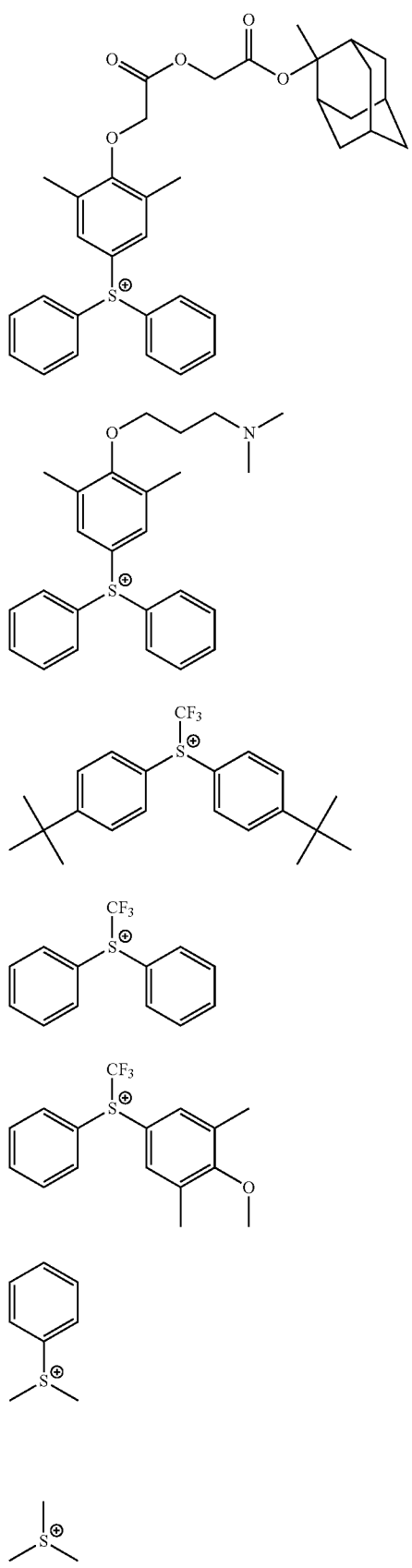
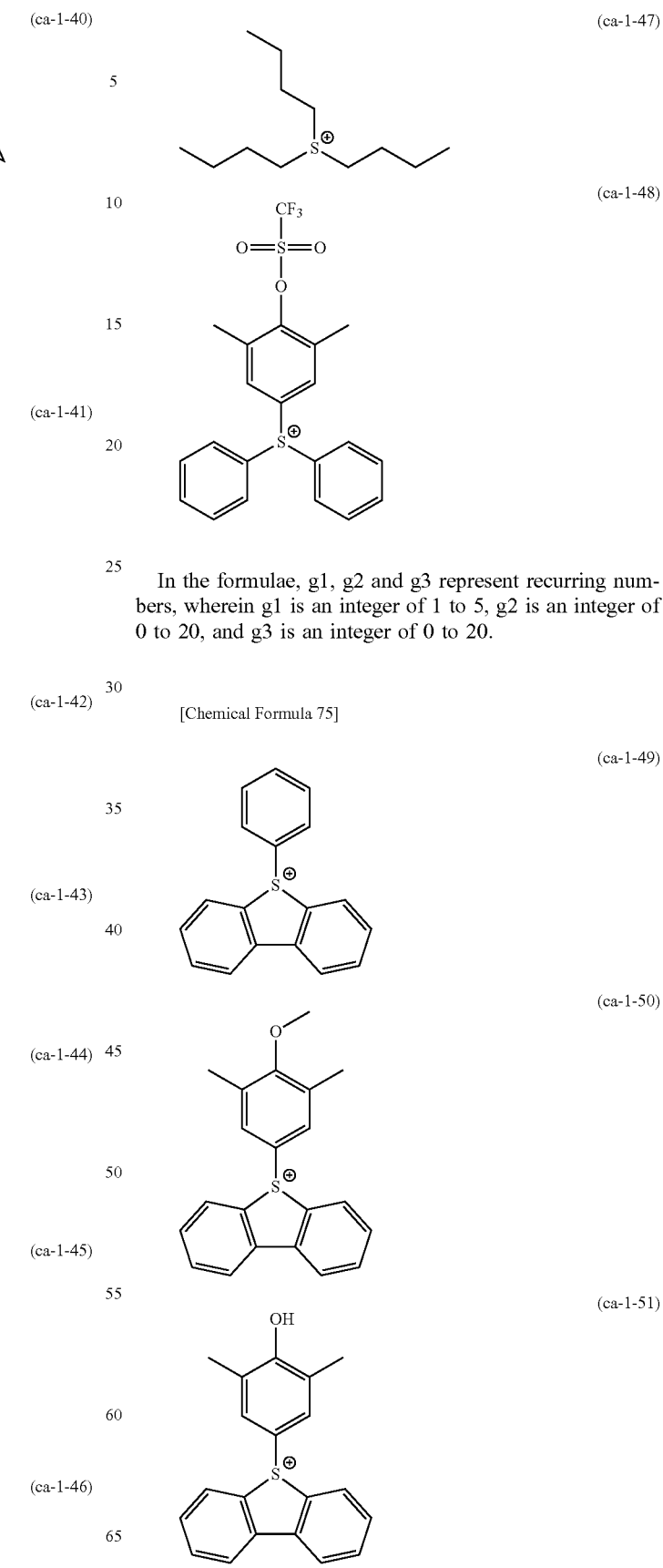
In the formulae, g1, g2 and g3 represent recurring numbers, wherein g1 is an integer of 1 to 5, g2 is an integer of 0 to 20, and g3 is an integer of 0 to 20.
[Chemical Formula 75]

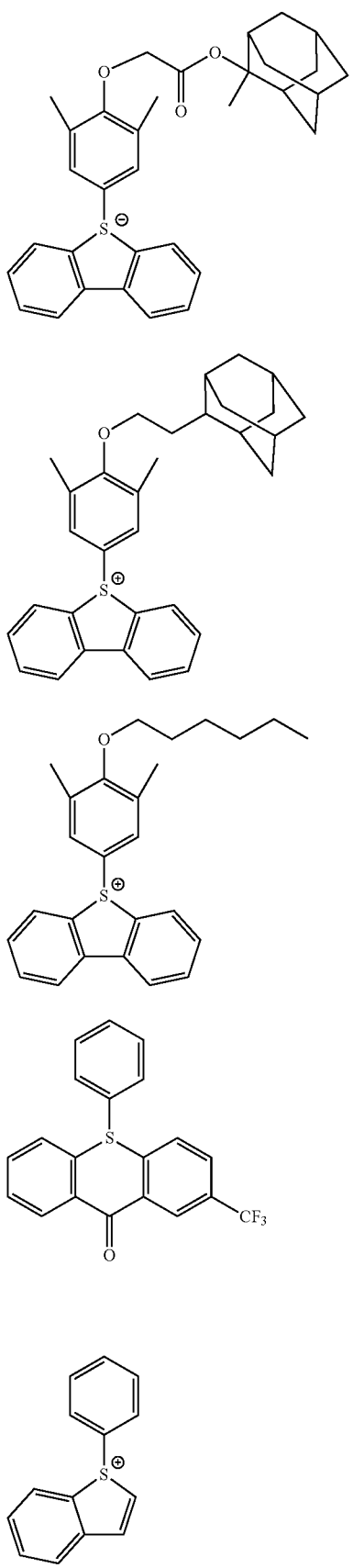
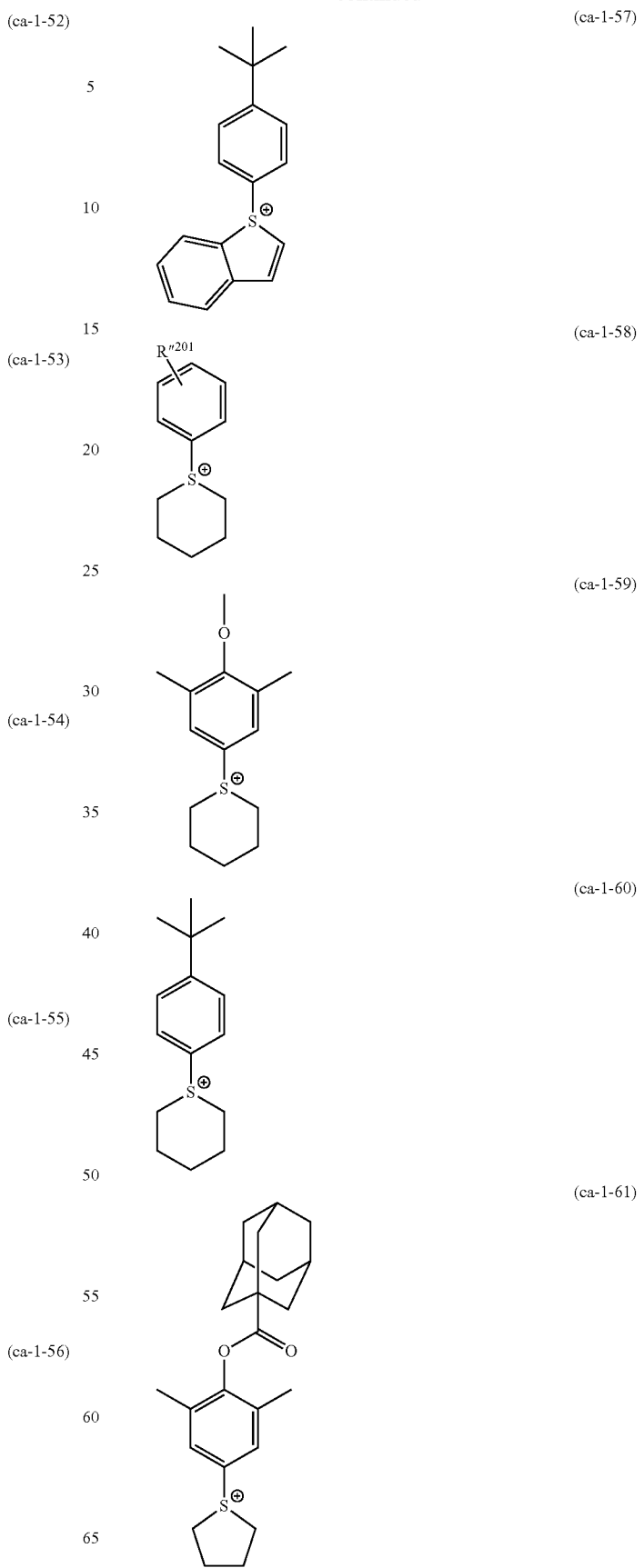

-continued (ca-1-62)

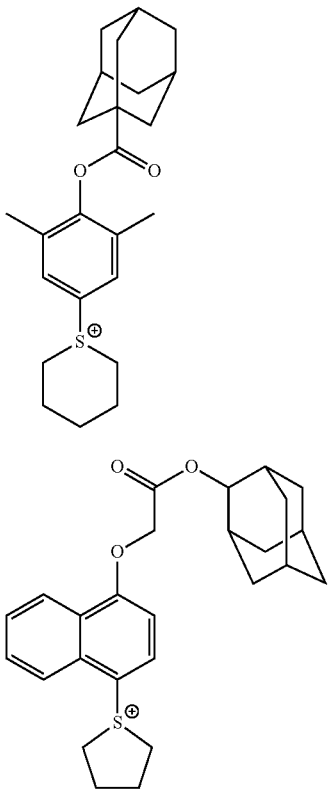

(ca-1-63)

In the formulae, $R''^{201}$ represents a hydrogen atom or a substituent, and as the substituent, the same groups as those described above for substituting $R^{201}$ to $R^{207}$ and $R^{210}$ to $R^{212}$ can be mentioned.

Specific examples of preferable cations represented by formula (ca-3) include cations represented by formulae (ca-3-1) to (ca-3-6) shown below.

[Chemical Formula 76]

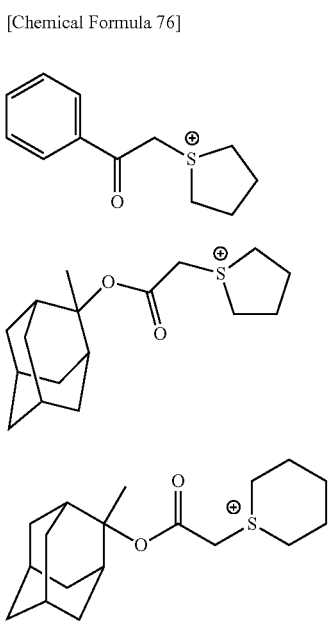

(ca-3-1)

(ca-3-2)

(ca-3-3)

-continued (ca-3-4)

(ca-3-5)

(ca-3-6)

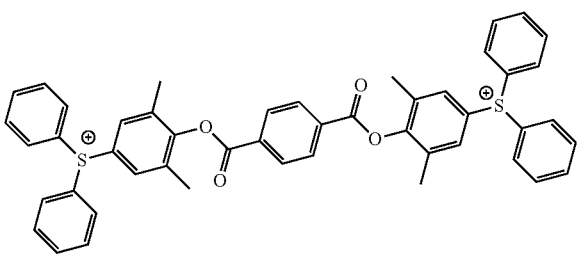

Specific examples of preferable cations represented by formula (ca-4) include cations represented by formulae (ca-4-1) and (ca-4-2) shown below.

[Chemical Formula 77]

(ca-4-1)

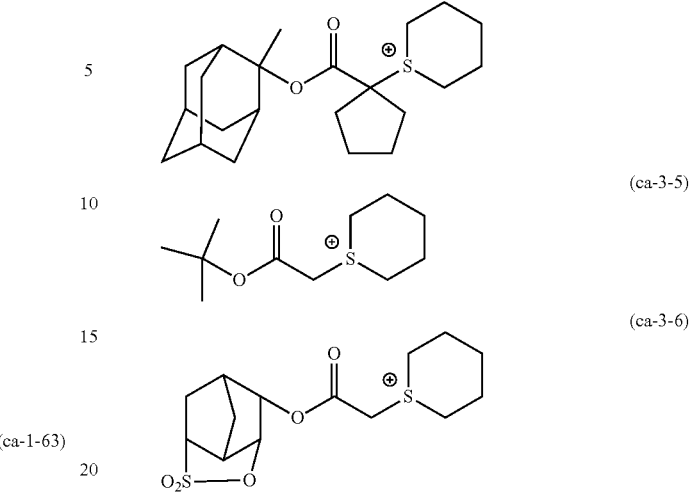

(ca-4-2)

As the component (B), one type of these acid generators may be used alone, or two or more types may be used in combination.

When the resist composition of the present invention contains the component (B), the amount of the component (B) relative to 100 parts by weight of the component (A) is preferably within a range from 0.5 to 60 parts by weight, more preferably from 1 to 50 parts by weight, and still more preferably from 1 to 40 parts by weight. When the amount of the component (B) is within the above-mentioned range, formation of a resist pattern can be satisfactorily performed. Further, by virtue of the above-mentioned range, when each of the components are dissolved in an organic solvent, a uniform solution can be obtained and the storage stability becomes satisfactory.

<Acid Diffusion Control Agent; Component (D)>

The resist composition of the present embodiment may include, in addition to the components (A) and (B), an acid diffusion control agent (hereafter, sometimes referred to as "component (D)").

The component (D) functions as an acid diffusion control agent, i.e., a quencher which traps the acid generated from the component (B) and the like upon exposure.

In the present invention, the component (D) may be a photodecomposable base (D1) (hereafter, referred to as "component (D1)") which is decomposed upon exposure and then loses the ability of controlling of acid diffusion, or a nitrogen-containing organic compound (D2) (hereafter, referred to as "component (D2)") which does not fall under the definition of component (D1).

[Component (D1)]

When a resist pattern is formed using a resist composition containing the component (D1), the contrast between exposed portions and unexposed portions is improved.

The component (D1) is not particularly limited, as long as it is decomposed upon exposure and then loses the ability of controlling of acid diffusion. As the component (D1), at least one compound selected from the group consisting of a compound represented by general formula (d1-1) shown below (hereafter, referred to as "component (d1-1)"), a compound represented by general formula (d1-2) shown below (hereafter, referred to as "component (d1-2)") and a compound represented by general formula (d1-3) shown below (hereafter, referred to as "component (d1-3)") is preferably used.

At exposed portions, the components (d1-1) to (d1-3) are decomposed and then lose the ability of controlling of acid diffusion (i.e., basicity), and therefore the components (d1-1) to (d1-3) cannot function as a quencher, whereas at unexposed portions, the components (d1-1) to (d1-3) functions as a quencher.

[Chemical Formula 78]

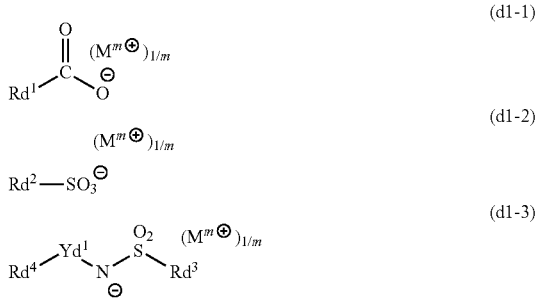

In the formulae, $Rd^1$ to $Rd^4$ represent a cyclic group which may have a substituent, a chain-like alkyl group which may have a substituent or a chain-like alkenyl group which may have a substituent, provided that, the carbon atom adjacent to the sulfur atom within the $Rd^2$ in the formula (d1-2) has no fluorine atom bonded thereto; $Yd^1$ represents a single bond or a divalent linking group; and $M^{m+}$ each independently represents a cation having a valency of m.

{Component (d1-1)}

Anion Moiety

In formula (d1-1), $Rd^1$ represents a cyclic group which may have a substituent, a chain-like alkyl group which may have a substituent or a chain-like alkenyl group which may have a substituent, and is the same groups as those defined above for $R^{101}$.

Among these, as the group for $Rd^1$, an aromatic hydrocarbon group which may have a substituent, an aliphatic cyclic group which may have a substituent and a chain-like alkyl group which may have a substituent are preferable. Examples of the substitutent for these groups include a hydroxy group, an oxo group, an alkyl group, an aryl group, a fluorine atom, a fluorinated alkyl group, a lactone-containing cyclic group represented by any one of the aforementioned formulae (a2-r-1) to (a2-r-7), an ether bond, an ester bond, and a combination thereof. In the case where an ether bond or an ester bond is included as the substituent, the substituent may be bonded via an alkylene group, and a linking group represented by any one of formulae (y-al-1) to (y-al-5) shown below is preferable.

The aromatic hydrocarbon group is preferably an aryl group such as a phenyl group or a naphthyl group.

Examples of the aliphatic cyclic group include groups in which one or more hydrogen atoms have been removed from a polycycloalkane such as adamantane, norbornane, isobornane, tricyclodecane or tetracyclododecane.

As the chain-like hydrocarbon group, a chain-like alkyl group is preferable. The chain-like alkyl group preferably has 1 to 10 carbon atoms, and specific examples thereof include a linear alkyl group such as a methyl group, an ethyl group, a propyl group, a butyl group, a pentyl group, a hexyl group, a heptyl group, an octyl group, a nonyl or a decyl group, and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group or a 4-methylpentyl group.

In the case where the chain-like alkyl group is a fluorinated alkyl group having a fluorine atom or a fluorinated alkyl group, the fluorinated alkyl group preferably has 1 to 11 carbon atoms, more preferably 1 to 8 carbon atoms, and still more preferably 1 to 4 carbon atoms. The fluorinated alkyl group may contain an atom other than fluorine. Examples of the atom other than fluorine include an oxygen atom, a carbon atom, a hydrogen atom, a sulfur atom and a nitrogen atom.

As $Rd^1$, a fluorinated alkyl group in which part or all of the hydrogen atoms constituting a linear alkyl group have been substituted with fluorine atom(s) is preferable, and a fluorinated alkyl group in which all of the hydrogen atoms constituting a linear alkyl group have been substituted with fluorine atoms (i.e., a linear perfluoroalkyl group) is more preferable.

Specific examples of preferable anion moieties for the component (d1-1) are shown below.

[Chemical Formula 79]

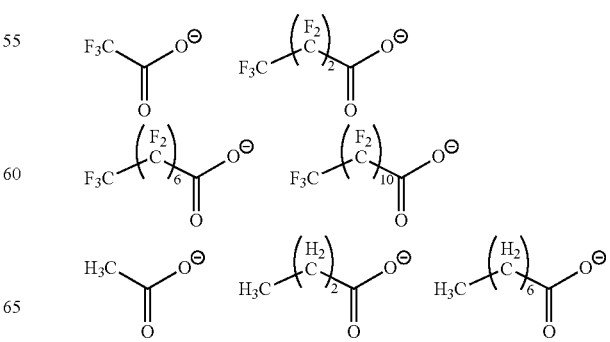

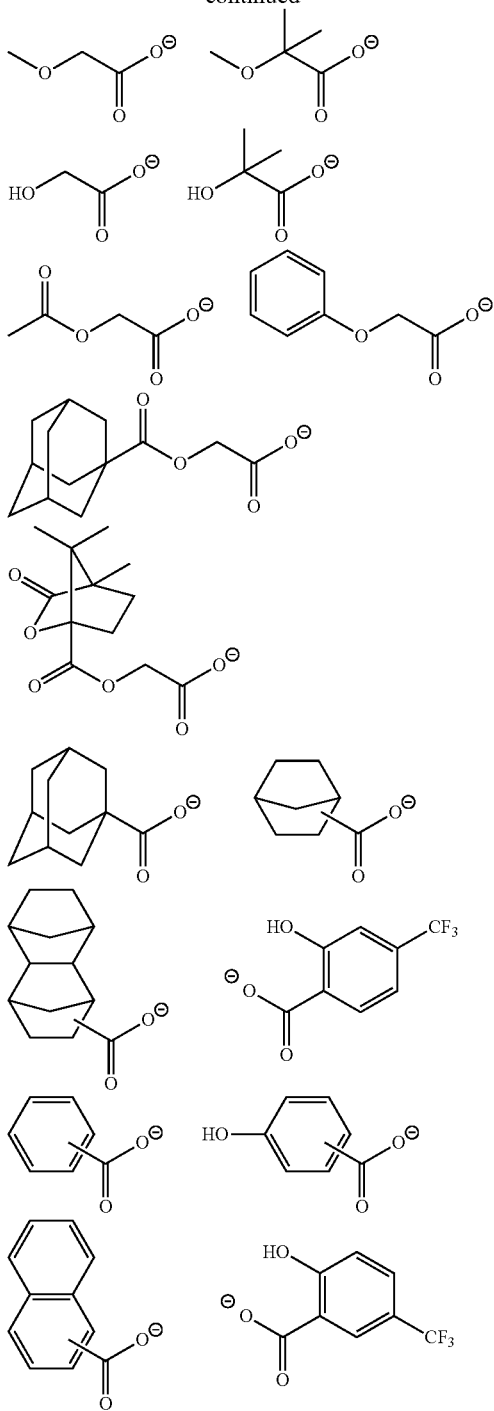

Cation Moiety

In formula (d1-1), $M^{m+}$ represents an organic cation having a valency of m (excluding the cation moiety of the compound (D0), as defined for $M'^{m+}$ described later).

The organic cation for $M^{m+}$ is not particularly limited, and examples thereof include the same cation moieties as those represented by formulae (ca-1) to (ca-4) shown below, and cation moieties represented by formulae (ca-1-1) to (ca-1-63) shown below are preferable.

As the component (d1-1), one type of compound may be used, or two or more types of compounds may be used in combination.

{Component (d1-2)}
Anion Moiety

In formula (d1-2), $Rd^2$ represents a cyclic group which may have a substituent, a chain-like alkyl group which may have a substituent or a chain-like alkenyl group which may have a substituent, and is the same groups as those defined above for $R^{101}$, provided that, the carbon atom adjacent to the sulfur atom within $Rd^2$ group has no fluorine atom bonded thereto (i.e., the carbon atom adjacent to the sulfur atom within $Rd^2$ group does not substituted with a fluorine atom). As a result, the anion of the component (d1-2) becomes an appropriately weak acid anion, thereby improving the quenching ability of the component (D).

As $Rd^2$, an aliphatic cyclic group which may have a substituent is preferable, and a group in which one or more hydrogen atoms have been removed from adamantane, norbornane, isobornane, tricyclodecane, tetracyclododecane or camphor (which may have a substituent) is more preferable.

The hydrocarbon group for $Rd^2$ may have a substituent. As the substituent, the same groups as those described above for substituting the hydrocarbon group (e.g., aromatic hydrocarbon group, aliphatic hydrocarbon group) for $Rd^1$ in the formula (d1-1) can be mentioned.

Specific examples of preferable anion moieties for the component (d1-2) are shown below.

[Chemical Formula 80]

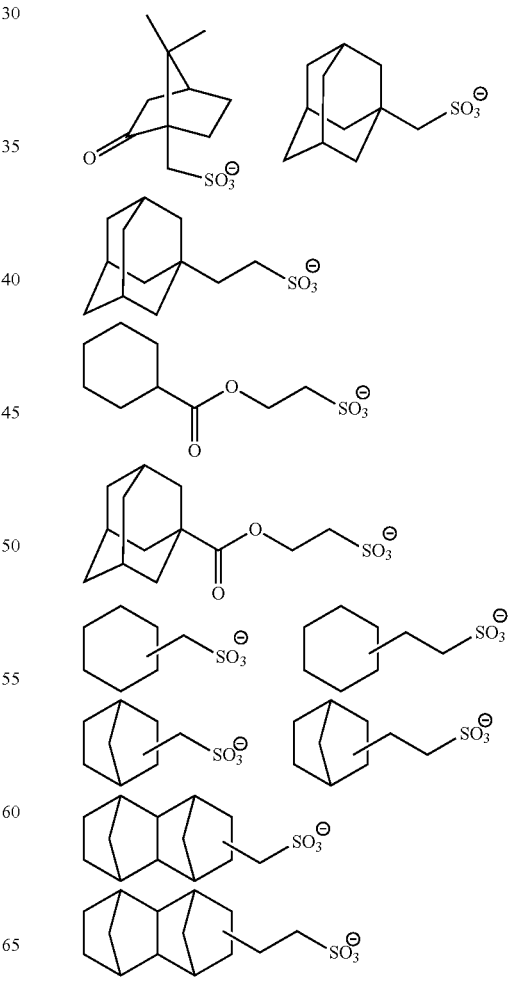

137

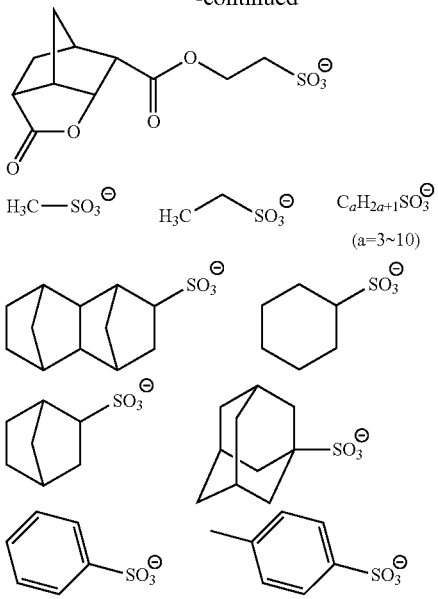

Cation Moiety

In formula (d1-2), $M^{m+}$ is an organic cation having a valency of m, and is the same as defined for $M^{m+}$ in the aforementioned formula (d1-1).

As the component (d1-2), one type of compound may be used, or two or more types of compounds may be used in combination.

{Component (d1-3)}

Anion Moiety

In formula (d1-3), $Rd^3$ represents a cyclic group which may have a substituent, a chain-like alkyl group which may have a substituent or a chain-like alkenyl group which may have a substituent, and is the same groups as those defined above for $R^{101}$, and a cyclic group containing a fluorine atom, a chain-like alkyl group or a chain-like alkenyl group is preferable. Among these, a fluorinated alkyl group is preferable, and more preferably the same fluorinated alkyl groups as those described above for $Rd^1$.

In formula (d1-3), $Rd^4$ represents a cyclic group which may have a substituent, a chain-like alkyl group which may have a substituent or a chain-like alkenyl group which may have a substituent, and is the same groups as those defined above for $R^{101}$.

Among these, an alkyl group which may have substituent, an alkoxy group which may have substituent, an alkenyl group which may have substituent or a cyclic group which may have substituent is preferable.

The alkyl group for $Rd^4$ is preferably a linear or branched alkyl group of 1 to 5 carbon atoms, and specific examples include a methyl group, an ethyl group, a propyl group, an isopropyl group, an n-butyl group, an isobutyl group, a tert-butyl group, a pentyl group, an isopentyl group, and a neopentyl group. Part of the hydrogen atoms within the alkyl group for $Rd^4$ may be substituted with a hydroxy group, a cyano group or the like.

The alkoxy group for $Rd^4$ is preferably an alkoxy group of 1 to 5 carbon atoms, and specific examples thereof include a methoxy group, an ethoxy group, an n-propoxy group, an iso-propoxy group, an n-butoxy group and a tert-butoxy group. Among these, a methoxy group and an ethoxy group are preferable.

138

As the alkenyl group for $Rd^4$, the same groups as those described above for $R^{101}$ can be mentioned, and a vinyl group, a propenyl group (an allyl group), a 1-methylpropenyl group and a 2-methylpropenyl group are preferable. These groups may have an alkyl group of 1 to 5 carbon atoms or a halogenated alkyl group of 1 to 5 carbon atoms as a substituent.

As the cyclic group for $Rd^4$, the same groups as those described above for $R^{101}$ can be mentioned. Among these, as the cyclic group, an alicyclic group (e.g., a group in which one or more hydrogen atoms have been removed from a cycloalkane such as cyclopentane, cyclohexane, adamantane, norbornane, isobornane, tricyclodecane or tetracyclododecane) or an aromatic group (e.g., a phenyl group or a naphthyl group) is preferable. When $Rd^4$ is an alicyclic group, the resist composition can be satisfactorily dissolved in an organic solvent, thereby improving the lithography properties. Alternatively, when $Rd^4$ is an aromatic group, the resist composition exhibits an excellent photoabsorption efficiency in a lithography process using EUV or the like as the exposure source, thereby resulting in the improvement of the sensitivity and the lithography properties.

In formula (d1-3), $Yd^1$ represents a single bond or a divalent linking group.

The divalent linking group for $Yd^1$ is not particularly limited, and examples thereof include a divalent hydrocarbon group (aliphatic hydrocarbon group, or aromatic hydrocarbon group) which may have a substituent and a divalent linking group containing a hetero atom. As such groups, the same divalent linking groups as those described above for $Ya^{21}$ in the formula (a2-1) can be mentioned.

As $Yd^1$, a carbonyl group, an ester bond, an amide bond, an alkylene group or a combination of these is preferable. As the alkylene group, a linear or branched alkylene group is more preferable, and a methylene group or an ethylene group is still more preferable.

Specific examples of preferable anion moieties for the component (d1-3) are shown below.

[Chemical Formula 81]

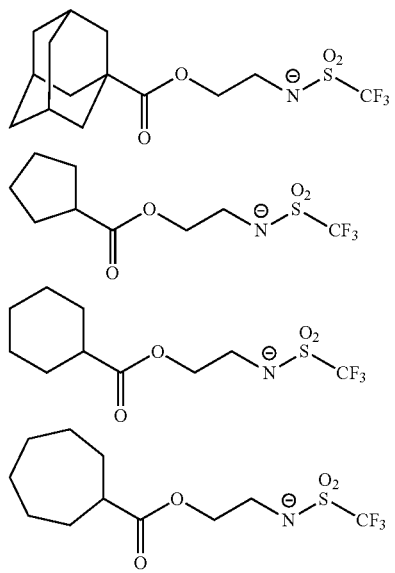

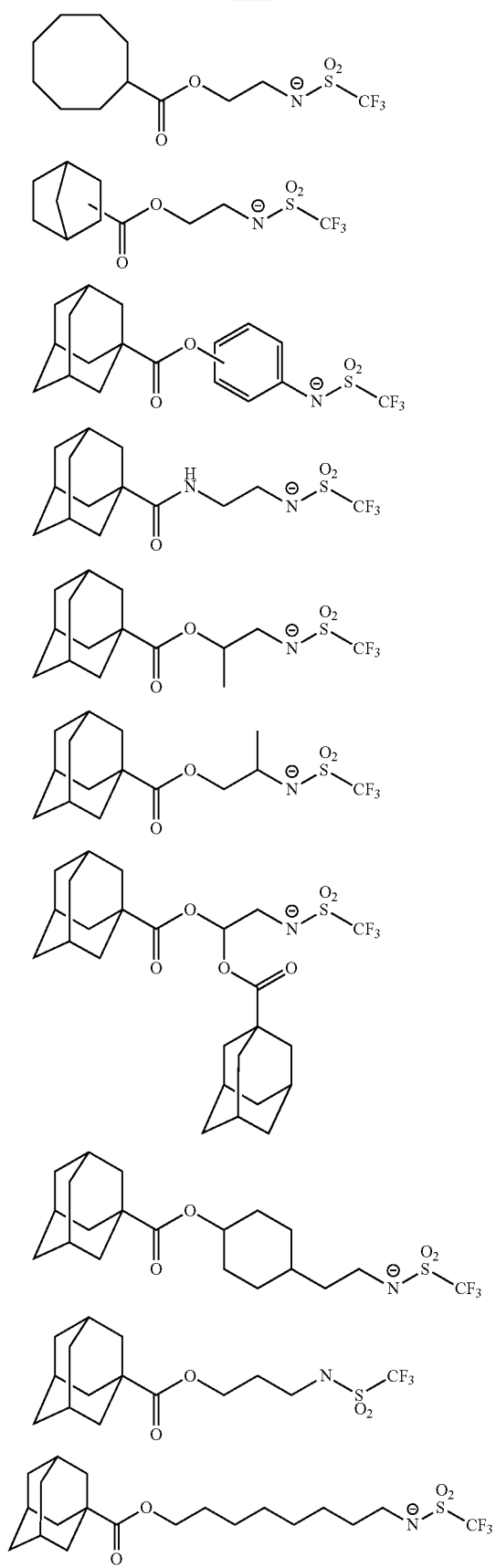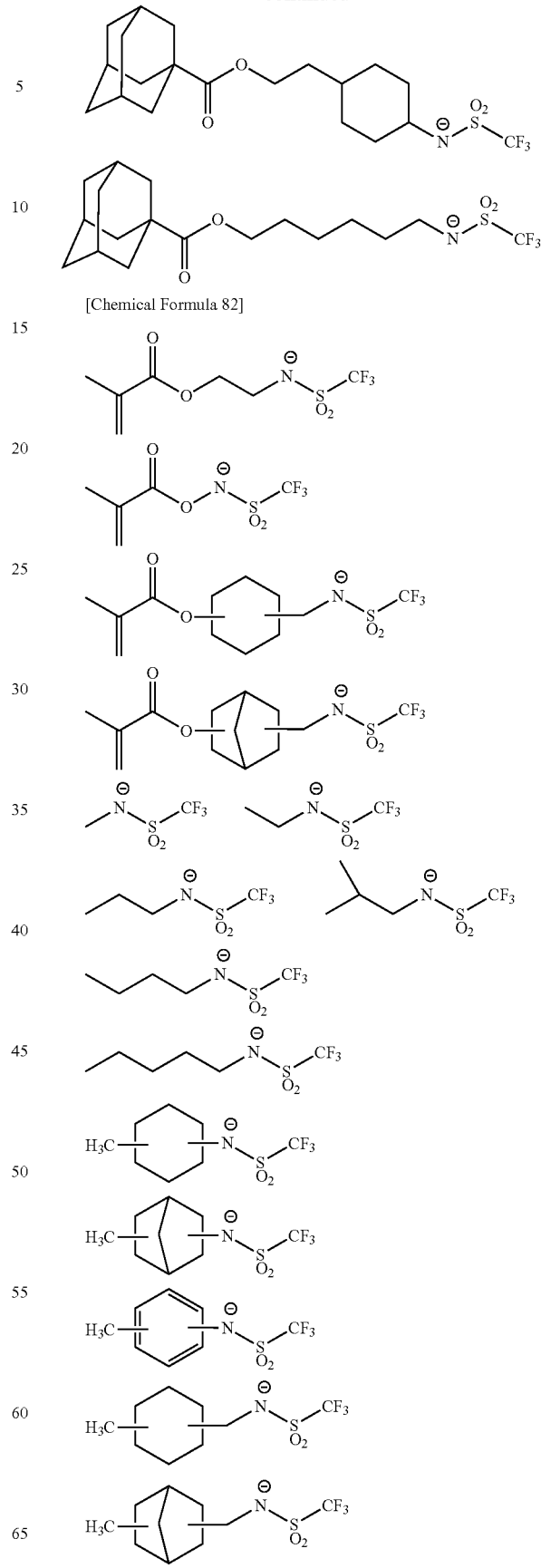

-continued

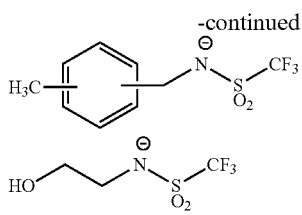

Cation Moiety

In formula (d1-3), $M^{m+}$ is an organic cation having a valency of m, and is the same as defined for $M^{m+}$ in the aforementioned formula (d1-1).

As the component (d1-3), one type of compound may be used, or two or more types of compounds may be used in combination.

As the component (D1), one type of the aforementioned components (d1-1) to (d1-3), or at least two types of the aforementioned components (d1-1) to (d1-3) can be used in combination.

The amount of the component (D1) relative to 100 parts by weight of the component (A) is preferably within a range from 0.5 to 10 parts by weight, more preferably from 0.5 to 8 parts by weight, and still more preferably from 1 to 8 parts by weight.

When the amount of the component (D1) is at least as large as the lower limit of the above-mentioned range, excellent lithography properties and excellent resist pattern shape can be obtained. On the other hand, when the amount of the component (D1) is no more than the upper limit of the above-mentioned range, sensitivity can be maintained at a satisfactory level, and through-put becomes excellent.

The production methods of the components (d1-1) to (d1-3) are not particularly limited, and the components (d1-1) to (d1-3) can be produced by conventional methods.

The amount of the component (D1) relative to 100 parts by weight of the component (A) is preferably within a range from 0.5 to 15.0 parts by weight, more preferably from 0.5 to 10.0 parts by weight, and still more preferably from 1.0 to 8.0 parts by weight. When the amount of at least as large as the lower limit of the above-mentioned range, excellent lithography properties and excellent resist pattern shape can be obtained. On the other hand, when the amount of the component (D) is no more than the upper limit of the above-mentioned range, sensitivity can be maintained at a satisfactory level, and through-put becomes excellent.

(Component (D2))

The component (D) may contain a nitrogen-containing organic compound (D2) (hereafter, referred to as component (D2)) which does not fall under the definition of component (D1).

The component (D2) is not particularly limited, as long as it functions as an acid diffusion control agent, and does not fall under the definition of the component (D1). As the component (D2), any of the conventionally known compounds may be selected for use. Among these, an aliphatic amine, particularly a secondary aliphatic amine or tertiary aliphatic amine is preferable.

An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of no more than 12 carbon atoms (i.e., alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine, and tri-n-dodecylamine; and alkyl alcohol amines such as diethanolamine, triethanolamine, diisopropanolamine, triisopropanolamine, di-n-octanolamine, and tri-n-octanolamine. Among these, trialkylamines of 5 to 10 carbon atoms are preferable, and tri-n-pentylamine and tri-n-octylamine are particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxyl)ethyl}amine, tris{2-(2-methoxyethoxymethoxyl)ethyl}amine, tris{2-(1-methoxyethoxyl)ethyl}amine, tris{2-(1-ethoxyethoxyl)ethyl}amine, tris{2-(1-ethoxypropoxy)ethyl}amine, tris[2-{2-(2-hydroxyethoxyl)ethoxy}ethyl]amine and triethanolamine triacetate, and triethanolamine triacetate is preferable.

Further, as the component (D2), an aromatic amine may be used.

Examples of aromatic amines include aniline, pyridine, 4-dimethylaminopyridine, pyrrole, indole, pyrazole, imidazole and derivatives thereof, as well as diphenylamine, triphenylamine, tribenzylamine, 2,6-diisopropylaniline and N-tert-butoxycarbonylpyrrolidine.

As the component (D2), one type of compound may be used alone, or two or more types may be used in combination.

The component (D2) is typically used in an amount within a range from 0.01 to 5.0 parts by weight, relative to 100 parts by weight of the component (A). When the amount of the component (D) is within the above-mentioned range, the shape of the resist pattern and the post exposure stability of the latent image formed by the pattern-wise exposure of the resist layer are improved.

As the component (D), one type of compound may be used, or two or more types of compounds may be used in combination.

When the resist composition of the present invention contains the component (D), the amount of the component (D) relative to 100 parts by weight of the component (A) is preferably within a range from 0.1 to 15 parts by weight, more preferably from 0.3 to 12 parts by weight, and still more preferably from 0.5 to 12 parts by weight. When the amount of the component (D) is at least as large as the lower limit of the above-mentioned range, various lithography properties (such as LWR) of the resist composition are improved. Further, a resist pattern having an excellent shape can be obtained. On the other hand, when the amount of the component (D) is no more than the upper limit of the above-mentioned range, sensitivity can be maintained at a satisfactory level, and through-put becomes excellent.

<Optional Components>

[Component (E)]

Furthermore, in the resist composition of the present invention, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof can be added.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters and phenylphosphinic acid.

As the component (E), one type may be used alone, or two or more types may be used in combination.

The component (E) is typically used in an amount within a range from 0.01 to 5.0 parts by weight, relative to 100 parts by weight of the component (A).

[Component (F)]

In the present embodiment, the resist composition may further include a fluorine additive (hereafter, referred to as "component (F)") for imparting water repellency to the resist film.

As the component (F), for example, a fluorine-containing polymeric compound described in Japanese Unexamined Patent Application, First Publication No. 2010-002870, Japanese Unexamined Patent Application, First Publication No. 2010-032994, Japanese Unexamined Patent Application, First Publication No. 2010-277043, Japanese Unexamined Patent Application, First Publication No. 2011-13569, and Japanese Unexamined Patent Application, First Publication No. 2011-128226 can be used.

Specific examples of the component (F) include polymers having a structural unit (f1) represented by general formula (f1-1) shown below. As the polymer, a polymer (homopolymer) consisting of a structural unit (f1) represented by formula (f1-1) shown below; a copolymer of the structural unit (f1) and the aforementioned structural unit (a1); and a copolymer of the structural unit (f1), a structural unit derived from acrylic acid or methacrylic acid and the aforementioned structural unit (a1) are preferable. As the structural unit (a1) to be copolymerized with the structural unit (f1), a structural unit derived from 1-ethyl-1-cyclooctyl (meth) acrylate is preferable.

[Chemical Formula 83]

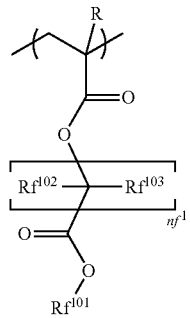

(f1-1)

In the formula, R is the same as defined above; $Rf^{102}$ and $Rf^{103}$ each independently represents a hydrogen atom, a halogen atom, an alkyl group of 1 to 5 carbon atoms, or a halogenated alkyl group of 1 to 5 carbon atoms, provided that $Rf^{102}$ and $Rf^{103}$ may be the same or different; $nf^1$ represents an integer of 1 to 5; and $Rf^{101}$ represents an organic group containing a fluorine atom.

In formula (f1-1), R bonded to the carbon atom on the α-position is the same as defined above. As R, a hydrogen atom or a methyl group is preferable.

In formula (f1-1), examples of the halogen atom for $Rf^{102}$ and $Rf^{103}$ include a fluorine atom, a chlorine atom, a bromine atom and an iodine atom, and a fluorine atom is particularly desirable. Examples of the alkyl group of 1 to 5 carbon atoms for $Rf^{102}$ and $R^{103}$ include the same alkyl group of 1 to 5 carbon atoms as those described above for R, and a methyl group or an ethyl group is preferable. Specific examples of the halogenated alkyl group of 1 to 5 carbon atoms represented by $Rf^{102}$ or $Rf^{103}$ include groups in which part or all of the hydrogen atoms of the aforementioned alkyl groups of 1 to 5 carbon atoms have been substituted with halogen atoms. Examples of the halogen atom include a fluorine atom, a chlorine atom, a bromine atom and an iodine atom, and a fluorine atom is particularly desirable. Among these, as $Rf^{102}$ and $Rf^{103}$, a hydrogen atom, a fluorine atom or an alkyl group of 1 to 5 carbon atoms is preferable, and a hydrogen atom, a fluorine atom, a methyl group or an ethyl group is more preferable.

In formula (f1-1), $nf^1$ represents an integer of 1 to 5, preferably an integer of 1 to 3, and more preferably 1 or 2.

In formula (f1-1), $Rf^{101}$ represents an organic group containing a fluorine atom, and is preferably a hydrocarbon group containing a fluorine atom.

The hydrocarbon group containing a fluorine atom may be linear, branched or cyclic, and preferably has 1 to 20 carbon atoms, more preferably 1 to 15 carbon atoms, and most preferably 1 to 10 carbon atoms.

It is preferable that the hydrocarbon group having a fluorine atom has 25% or more of the hydrogen atoms within the hydrocarbon group fluorinated, more preferably 50% or more, and most preferably 60% or more, as the hydrophobicity of the resist film during immersion exposure is enhanced.

Among these, as $Rf^{101}$, a fluorinated hydrocarbon group of 1 to 5 carbon atoms is preferable, and a trifluoromethyl group, —$CH_2$—$CF_3$, —$CH_2$—$CF_2$—$CF_3$, —$CH(CF_3)_2$, —$CH_2$—$CH_2$—$CF_3$, and —$CH_2$—$CH_2$—$CF_2$—$CF_2$—$CF_2$—$CF_3$ are most preferable.

The weight average molecular weight (Mw) (the polystyrene equivalent value determined by gel permeation chromatography) of the component (F) is preferably 1,000 to 50,000, more preferably 5,000 to 40,000, and most preferably 10,000 to 30,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) of the component (F) is preferably 1.0 to 5.0, more preferably 1.0 to 3.0, and most preferably 1.2 to 2.5.

As the component (F), one type may be used alone, or two or more types may be used in combination.

The component (F) is typically used in an amount within a range from 0.5 to 10 parts by weight, relative to 100 parts by weight of the component (A).

If desired, other miscible additives can also be added to the resist composition of the present invention. Examples of such miscible additives include additive resins for improving the performance of the resist film, dissolution inhibitors, plasticizers, stabilizers, colorants, halation prevention agents, and dyes.

[Component (S)]

The resist composition for immersion exposure according to the present invention can be prepared by dissolving the materials for the resist composition in an organic solvent (hereafter, frequently referred to as "component (S)").

The component (S) may be any organic solvent which can dissolve the respective components to give a uniform solution, and one or more kinds of any organic solvent can be appropriately selected from those which have been conventionally known as solvents for a chemically amplified resist.

Examples thereof include lactones such as γ-butyrolactone; ketones such as acetone, methyl ethyl ketone (MEK), cyclohexanone, methyl-n-pentyl ketone (2-heptanone), and methyl isopentyl ketone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene; and dimethylsulfoxide (DMSO).

These solvents can be used individually, or in combination as a mixed solvent.

Among these, PGMEA, PGME, γ-butyrolactone and EL are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL or cyclohexanone is mixed as the polar solvent, the PGMEA:EL or cyclohexanone weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the component (S) is not particularly limited, and is appropriately adjusted to a concentration which enables coating of a coating solution to a substrate In general, the organic solvent is used in an amount such that the solid content of the resist composition becomes within the range from 1 to 20% by weight, and preferably from 2 to 15% by weight.

If desired, other miscible additives can also be added to the resist composition of the present invention. Examples of such miscible additives include additive resins for improving the performance of the resist film, dissolution inhibitors, plasticizers, stabilizers, colorants, halation prevention agents, and dyes.

The resist composition of the present invention includes a component (A1) containing a structural unit (a0), and therefore, in the formation of the resist pattern of the resist film using the resist composition, lithography properties are improved. For example, LWR (line width roughness), EL (exposure latitude) and MEEF (mask error factor) are improved. Further, the decrease in film thickness (i.e., film shrinkage) after post exposure bake (PEB) or after development can be suppressed, and for example, in a solvent developing process, a negative-tone pattern can be formed with a high residual film ratio.

As described above, it is presumed that such effects can be achieved since the structural unit (a0) has $R^1$ (a lactam-containing cyclic group or a sultam-containing cyclic group) on the terminal, and an aliphatic cyclic group (with or without a substituent) between $W^2$ and $R^1$. Therefore, it is presumed that the structural unit (a0) has a steric bulkiness and high polarity.

The resist composition of the present invention may be used in an alkali developing process or in a solvent developing process. For example, when the component (A) is a component (A-1), the resist composition may be used in a method of forming a positive-tone resist pattern in an alkali developing process, or in a method of forming a negative-tone resist pattern in a solvent developing process.

In particular, the resist composition of the present invention is preferably used in a method of forming a negative-tone resist pattern in a solvent developing process. When a negative-tone resist pattern is formed in a solvent developing process, exposed portions remains as a resist pattern, the resist composition of the present invention is capable of suppressing film shrinkage at exposed portions, which is very useful.

<<Method of Forming a Resist Pattern>>

The method of forming a resist pattern according to a second aspect of the present invention includes: forming a resist film on a substrate using a resist composition of the present invention; conducting exposure of the resist film; and developing the resist film to form a resist pattern.

The method for forming a resist pattern according to the present invention can be performed, for example, as follows.

Firstly, a resist composition of the present invention is applied to a substrate using a spinner or the like, and a bake treatment (post applied bake (PAB)) is conducted at a temperature of 80 to 150° C. for 40 to 120 seconds, preferably 60 to 90 seconds, to form a resist film.

Following selective exposure of the thus formed resist film, either by exposure through a mask having a predetermined pattern formed thereon (mask pattern) using an exposure apparatus such as an ArF exposure apparatus, an electron beam lithography apparatus or an EUV exposure apparatus, or by patterning via direct irradiation with an electron beam without using a mask pattern, baking treatment (post exposure baking (PEB)) is conducted under temperature conditions of 80 to 150° C. for 40 to 120 seconds, and preferably 60 to 90 seconds.

Next, the resist film is subjected to a developing treatment.

The developing treatment is conducted using an alkali developing solution in the case of an alkali developing process, and a developing solution containing an organic solvent (organic developing solution) in the case of a solvent developing process.

After the developing treatment, it is preferable to conduct a rinse treatment. The rinse treatment is preferably conducted using pure water in the case of an alkali developing process, and a rinse solution containing an organic solvent in the case of a solvent developing process.

In the case of a solvent developing process, after the developing treatment or the rinsing, the developing solution or the rinse liquid remaining on the pattern can be removed by a treatment using a supercritical fluid.

After the developing treatment or the rinse treatment, drying is conducted. If desired, bake treatment (post bake) can be conducted following the developing. In this manner, a resist pattern can be obtained.

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) and an organic film such as a lower-layer organic film used in a multilayer resist method can be used.

Here, a "multilayer resist method" is method in which at least one layer of an organic film (lower-layer organic film) and at least one layer of a resist film (upper resist film) are provided on a substrate, and a resist pattern formed on the upper resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method is broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film (triple-layer resist method).

The wavelength to be used for exposure is not particularly limited and the exposure can be conducted using radiation such as ArF excimer laser, KrF excimer laser, $F_2$ excimer laser, extreme ultraviolet rays (EUV), vacuum ultraviolet rays (VUV), electron beam (EB), X-rays, and soft X-rays. The resist composition of the present invention is effective to KrF excimer laser, ArF excimer laser, EB and EUV.

The exposure of the resist film can be either a general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long at it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environment and versatility.

As an example of the alkali developing solution used in an alkali developing process, a 0.1 to 10% by weight aqueous solution of tetramethylammonium hydroxide (TMAH) can be given.

As the organic solvent contained in the organic developing solution used in a solvent developing process, any of the conventional organic solvents can be used which are capable of dissolving the component (A) (prior to exposure). Specific examples of the organic solvent include polar solvents such as ketone solvents, ester solvents, alcohol solvents, amide solvents and ether solvents, and hydrocarbon solvents.

If desired, the organic developing solution may have a conventional additive blended. Examples of the additive include surfactants. The surfactant is not particularly limited, and for example, an ionic or non-ionic fluorine and/or silicon surfactant can be used.

When a surfactant is added, the amount thereof based on the total amount of the organic developing solution is generally 0.001 to 5% by weight, preferably 0.005 to 2% by weight, and more preferably 0.01 to 0.5% by weight.

The developing treatment can be performed by a conventional developing method. Examples thereof include a method in which the substrate is immersed in the developing solution for a predetermined time (a dip method), a method in which the developing solution is cast up on the surface of the substrate by surface tension and maintained for a predetermined period (a puddle method), a method in which the developing solution is sprayed onto the surface of the substrate (spray method), and a method in which the developing solution is continuously ejected from a developing solution ejecting nozzle while scanning at a constant rate to apply the developing solution to the substrate while rotating the substrate at a constant rate (dynamic dispense method).

The rinse treatment using a rinse liquid (washing treatment) can be conducted by a conventional rinse method. Examples of the rinse method include a method in which the rinse liquid is continuously applied to the substrate while rotating it at a constant rate (rotational coating method), a method in which the substrate is immersed in the rinse liquid for a predetermined time (dip method), and a method in which the rinse liquid is sprayed onto the surface of the substrate (spray method).

<<Polymeric Compound>>

A third aspect of the present invention is a polymeric compound having a structural unit (a0) represented by general formula (a0-0) shown below.

[Chemical Formula 84]

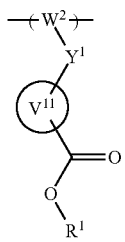

(a0-0)

In the formula, $V^{11}$ represents an aliphatic cyclic group with or without a substituent; $R^1$ represents a lactam-containing cyclic group or a sultam-containing cyclic group; $Y^1$ represents an oxygen atom (—O—), an ester bond (—C(=O)—O—) or a single bond; and $W^2$ represents a group formed by a polymerization reaction of a polymerizable group-containing group.

In the formula, $V^{11}$, $R^1$, $Y^1$ and $W^2$ are the same as defined above.

The polymeric compound according to the third aspect of the present invention preferably has a structural unit (a0) represented by general formula (a0-1-1) shown below.

[Chemical Formula 85]

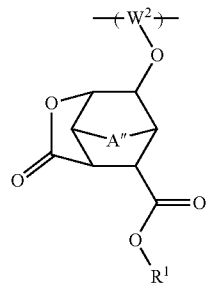

(a0-1-1)

In the formula, A" represents an oxygen atom, a sulfur atom or an alkylene group of 1 to 5 carbon atoms with or without an oxygen atom or a sulfur atom; $R^1$ represents a lactam-containing cyclic group or a sultam-containing cyclic group; and $W^2$ represents a group which is formed by polymerization reaction of a group containing a polymerizable group.

In the formula, $R^1$, $W^2$ and A" are the same as defined above.

It is preferable that the polymeric compound according to the third aspect of the present invention further includes a structural unit (a1) containing an acid decomposable group that exhibits increased polarity by the action of acid. The explanation of the structural unit (a1) is the same as defined above.

A fourth aspect of the present invention is a compound represented by general formula (I-0) shown below.

[Chemical Formula 86]

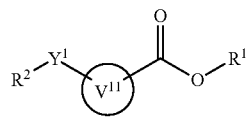

(I-0)

In the formula, $V^{11}$ represents an aliphatic cyclic group with or without a substituent; $R^1$ represents a lactam-containing cyclic group or a sultam-containing cyclic group; $Y^1$ represents an oxygen atom (—O—), an ester bond (—C(=O)— O—) or a single bond; and $R^2$ represents a polymerizable group-containing group.

In formula (I-0), $V^{11}$, $R^1$ and $Y^1$ are the same as defined above. Further, the "group containing a polymerizable group" for $R^2$ is the same as defined for the "group containing a polymerizable group" for $W^2$.

A fifth aspect of the present invention is a compound represented by general formula (I) shown below.

[Chemical Formula 87]

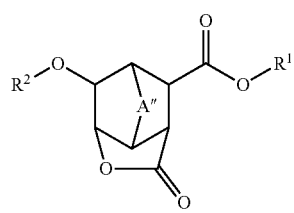

(I)

In the formula, A″ represents an oxygen atom, a sulfur atom or an alkylene group of 1 to 5 carbon atoms with or without an oxygen atom or a sulfur atom; $R^1$ represents a lactam-containing cyclic group or a sultam-containing cyclic group; and $R^2$ represents a polymerizable group-containing group.

In formula (I), A″ and $R^1$ are the same as defined above. Further, the "group containing a polymerizable group" for $R^2$ is the same as defined for the "group containing a polymerizable group" for $W^2$.

<Production Method of Compound (I)>

The method for producing the compound (I) is not particularly limited, and the compound (I) can be produced by a conventional method.

For example, compound (I) can be produced by a producing method containing: a first step in which a compound (01) represented by general formula (01) shown below and a compound (02) represented by general formula (02) shown below are dissolved in solvent and react in the presence of base to obtain a compound (03) represented by general formula (03) shown below;

a second step in which the obtained compound (03) is subjected to an oxidation-cyclization reaction to obtain compound (II) represented by general formula (II) shown below; and a third step in which the $R^2$ group (i.e., a group containing a polymerizable group) is introduced into the hydroxy group of the obtained compound (II).

[Chemical Formula 88]

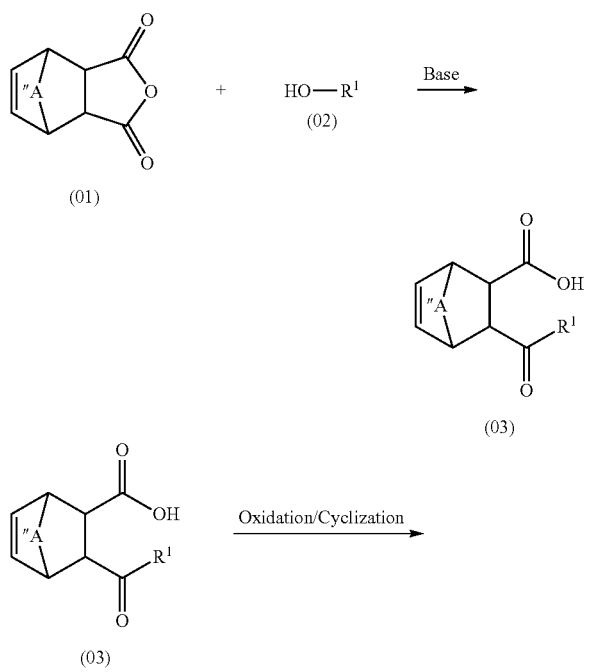

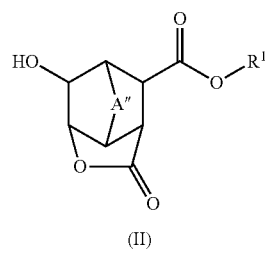

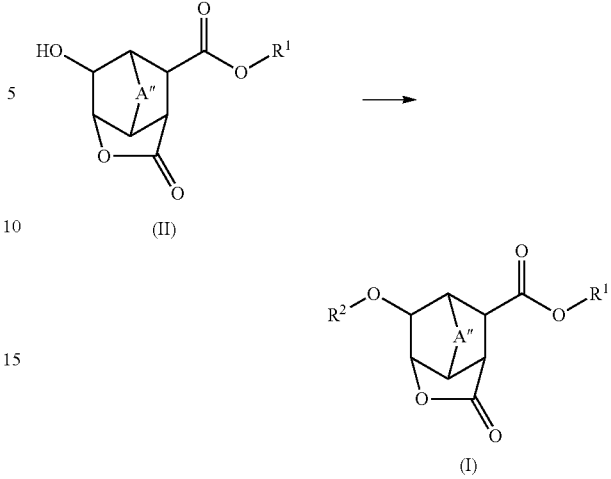

As the compounds (01) and (02), commercially available compounds may be used, or the compounds may be synthesized by a conventional method.

The solvent used in the first step may be any solvent which can dissolve the compounds (01) and (02) and which cannot react with these compounds, and examples thereof include dichloromethane, dichloroethane, chloroform, tetrahydrofuran, N, N-dimethylformamide, acetonitrile and propionitrile.

Examples of the base include inorganic bases such as sodium hydride, $K_2CO_3$ and $Cs_2CO_3$, and organic bases such as triethylamine, N,N-dimethylaminopyridine and pyridine.

The oxydation-cyclization reaction in the second step can be conducted by a conventional method in which an oxidizing reagent such as performic acid, peracetic acid or m-chlorobenzoic acid is used.

In the third step, $R^2$ can be introduced by a conventional method by which a group containing a polymerizable group is introduced into a hydroxy group of an alcohol. The third step may be one step or multi steps.

For example, when a group containing a carbonyl group (e.g., (meth)acryloyloxy group) is introduced as an $R^2$ group into the terminal of the oxygen-side of the hydroxy group of the compound (II), by reacting the compound (II) and $R^2$—X (wherein X represents a halogen atom such as chlorine atom or a hydroxy group), the objective compound can be obtained.

After the reaction, the compound within the reaction mixture may be separated and purified. The separation and purification can be conducted by a conventional method. For example, any one of concentration, solvent extraction, distillation, crystallization, recrystallization and chromatography can be used alone, or two or more of these methods may be used in combination.

The structure of the compound obtained in the manner described above can be confirmed by a general organic analysis method such as $^1H$-nuclear magnetic resonance (NMR) spectrometry, $^{13}C$-NMR spectrometry, $^{19}F$-NMR spectrometry, infrared absorption (IR) spectrometry, mass spectrometry (MS), elementary analysis and X-ray diffraction analysis.

A sixth aspect of the present invention is a compound represented by general formula (II) shown below.

153

[Chemical Formula 89]

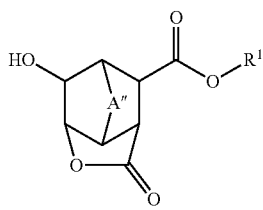

(II)

In the formula, A" represents an oxygen atom, a sulfur atom or an alkylene group of 1 to 5 carbon atoms with or without an oxygen atom or a sulfur atom; and $R^1$ represents a lactam-containing cyclic group or a sultam-containing cyclic group.

In formula (II), A" and $R^1$ are the same as defined above.

The compound (II) is useful as a raw material (intermediate) for the compound (I). As described above, by introducing the $R^2$ group (i.e., a group containing a polymerizable group) into the hydroxy group of compound (II), the compound (I) can be obtained.

A seventh aspect of the present invention is a compound represented by general formula (III) shown below.

[Chemical Formula 90]

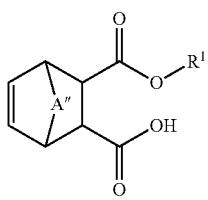

(III)

In the formula, A" represents an oxygen atom, a sulfur atom or an alkylene group of 1 to 5 carbon atoms with or without an oxygen atom or a sulfur atom; and $R^1$ represents a lactam-containing cyclic group or a sultam-containing cyclic group.

In formula (III), A" and $R^1$ are the same as defined above.

EXAMPLES

As follows is a description of examples of the present invention, although the scope of the present invention is by no way limited by these examples.

In the NMR analysis, the internal standard for $^1$H-NMR and $^{13}$C-NMR was tetramethylsilane (TMS).

Synthesis Example 1: Synthesis of Intermediate A-1

30.6 g of alcohol 1 and 26.9 g of N,N-dimethylaminopyridine were dissolved in 306 g of dichloromethane and cooled with ice. Then, to the resulting solution was dropwise added a dichloromethane solution of himic anhydride (32.4 g). Thereafter, temperature of the resultant was elevated to 25° C., and a reaction was conducted for 12 hours. Then, 306 g of an ice-cooled diluted hydrochloric acid was added to stop the reaction. Subsequently, washing was conducted with pure water 3 times, and 3,064 g of hexane was added, thereby obtaining 47.6 g of an intermediate A-1.

154

The obtained compound was analyzed by NMR, and the structure thereof was identified by the following results.

$^1$H-NMR (400 MHz, DMSO-d6): δ(ppm)=12.10 (1H, COOH), 8.81 (1H, NH), 6.15-6.29 (1H, C=CH), 5.96-6.12 (1H, C=CH), 4.37-4.47 (1H, CH), 3.35-3.47 (1H, CH), 3.18-3.46 (2H, CH), 2.89-3.12 (3H, CH), 2.04-2.28 (2H, CH), 1.79-1.91 (2H, CH), 1.16-1.51 (4H, CH)

[Chemical Formula 91]

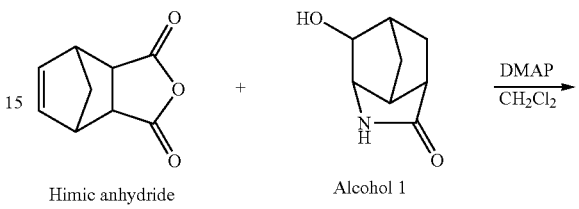

Himic anhydride     Alcohol 1

Intermediate A-1

Synthesis Example 2: Synthesis of Intermediate B-1

30.0 g of intermediate A-1 and 75.0 g of an 88% formic acid were added and heated to 45° C.

To the resulting solution was dropwise added 11.9 g of a 35% hydrogen peroxide over 1 hour. After conducting a reaction at 45° C. for 12 hours, 4.9 g of an ice-cooled sodium hydrogen sulfite was added to quench excess peroxide. Then, 30.0 g of pure water and 15.0 g of sodium chloride was added, followed by conducting extraction with 150 g of dichloromethane 5 times. The dichloromethane phase was mixed, and washed with an aqueous solution of sodium hydrogen carbonate, followed by washing with pure water. Then, the solvent was distilled off under reduced pressure, thereby obtaining 12.6 g of intermediate B-1.

The obtained compound was analyzed by NMR, and the structure thereof was identified by the following results.

$^1$H-NMR (400 MHz, DMSO-d6): δ(ppm)=8.81 (1H, NH), 5.20-5.32 (1H, CH), 4.76 (1H$_2$OH), 4.37-4.47 (1H, CH), 3.99-4.10 (1H, CH), 3.33-3.47 (1H, CH), 3.11-3.27 (2H, CH), 2.89-3.06 (1H, CH), 2.62-2.84 (1H, CH), 2.40-2.49 (1H, CH), 2.04-2.28 (2H, CH), 1.79-2.01 (3H, CH), 1.16-1.60 (3H, CH)

[Chemical Formula 92]

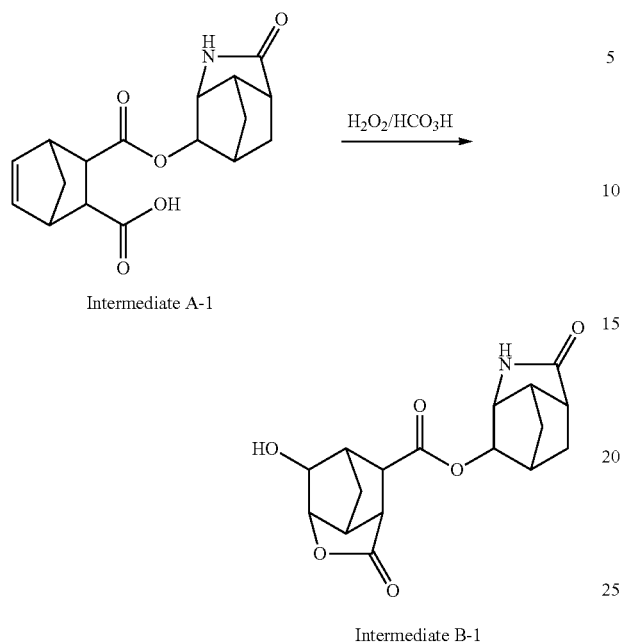

Intermediate A-1

Intermediate B-1

Synthesis Example 3: Synthesis of Compound L-1

10.0 g of intermediate B-1 and 100 g of dichloromethane were added and cooled with ice. To the resultant was dropwise added 3.9 g of triethylamine, and a dichloromethane solution of methacrylic acid chloride (3.4 g) was gradually added in a dropwise manner. A reaction was conducted continuously for 3 hours, and pure water was added to the reaction solution to stop the reaction. Then, liquid separation was conducted, and the dichloromethane phase was washed with diluted hydrochloric acid, followed by washing with pure water 3 times. The resulting solution was dropwise added to 1,000 g of diisopropylether, thereby obtaining 9.0 g of compound L-1.

The obtained compound was analyzed by NMR, and the structure thereof was identified by the following results.

1H-NMR (400 MHz, DMSO-d6): δ(ppm)=8.81 (1H, NH), 6.65-6.76 (1H, C=CH), 6.01-6.11 (1H, C=CH), 5.38-5.50 (1H, CH), 5.14-5.28 (1H, CH), 4.37-4.47 (1H, CH), 3.23-3.47 (3H, CH), 2.80-3.06 (2H, CH), 2.60-2.74 (1H, CH), 2.04-2.28 (2H, CH), 1.56-1.96 (7H, CH), 1.16-1.51 (2H, CH)

[Chemical Formula 93]

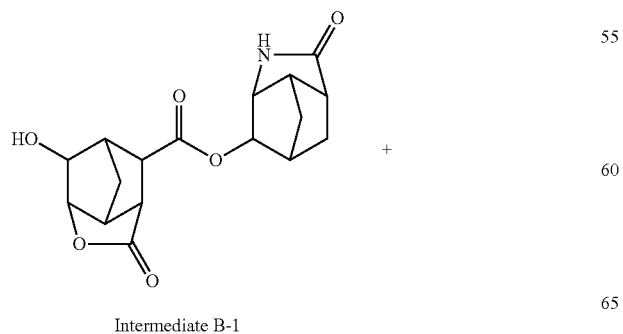

Intermediate B-1

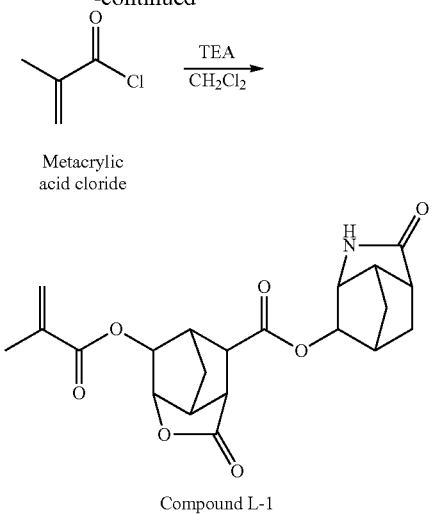

Compound L-1

Synthesis Example 4: Synthesis of Compound L-2

The same procedure as in Synthesis Example 3 was conducted, except that 4.6 g of methacrylic acid chloride was changed to an equimolar amount of a corresponding acid chloride, thereby obtaining 12 g of compound L-2.

The obtained compound was analyzed by NMR, and the structure thereof was identified by the following results.

$^1$H-NMR (400 MHz, DMSO-d6): δ(ppm)=8.81 (1H, NH), 6.08-6.17 (1H, C=CH), 5.72-5.86 (1H, C=CH), 4.77 (2H, CH), 5.38-5.50 (1H, CH), 5.14-5.28 (1H, CH), 4.37-4.47 (1H, CH), 3.23-3.47 (3H, CH), 2.80-3.06 (2H, CH), 2.60-2.74 (1H, CH), 2.04-2.28 (2H, CH), 1.56-1.96 (7H, CH), 1.16-1.51 (2H, CH)

[Chemical Formula 94]

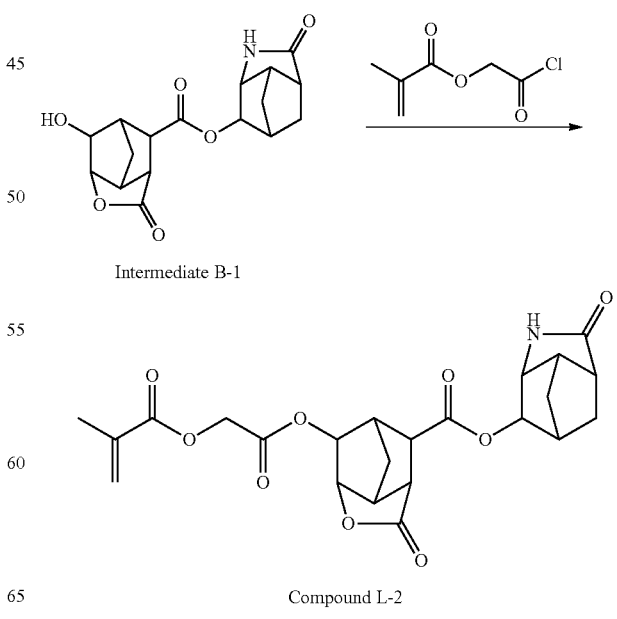

Intermediate B-1

Compound L-2

Synthesis Example 5: Synthesis of Intermediate A-3

The same procedure as in Synthesis Example 1 was conducted, except that alcohol 1 was changed to a corresponding alcohol, thereby obtaining 47.6 g of intermediate A-3.

The obtained compound was analyzed by NMR, and the structure thereof was identified by the following results.

$^1$H-NMR (400 MHz, DMSO-d6): δ(ppm)=12.10 (1H, COOH), 7.30 (1H, NH), 6.15-6.29 (1H, C=CH), 5.96-6.12 (1H, C=CH), 4.41-4.53 (1H, CH), 3.18-3.59 (5H, CH), 2.95-3.12 (2H, CH), 2.34-2.47 (1H, CH), 1.99-2.17 (1H, CH), 1.58-1.94 (3H, CH), 1.20-1.41 (2H, CH)

[Chemical Formula 95]

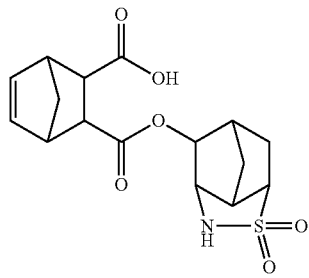

Intermediate A-3

Synthesis Example 6: Synthesis of Intermediate B-3

The same procedure as in Synthesis Example 2 was conducted, except that intermediate A-3 was used, thereby obtaining 12.6 g of intermediate B-3.

The obtained compound was analyzed by NMR, and the structure thereof was identified by the following results.

$^1$H-NMR (400 MHz, DMSO-d6): δ(ppm)=7.30 (1H, CH), 5.20-5.32 (1H, CH), 4.76 (1H, CH), 4.41-4.53 (1H, CH), 3.99-4.10 (1H, CH), 3.26-3.59 (2H, CH), 3.11-3.24 (3H, CH), 2.62-2.84 (1H, CH), 2.34-2.49 (2H, CH), 1.49-2.17 (6H, CH)

[Chemical Formula 96]

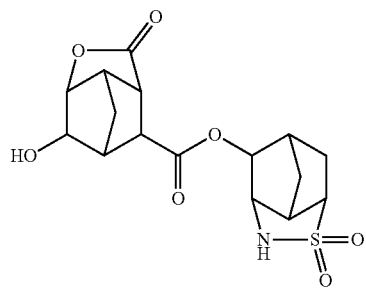

Intermediate B-3

Synthesis Example 7: Synthesis of Intermediate A-4

The same procedure as in Synthesis Example 1 was conducted, except that alcohol 1 was changed to a corresponding alcohol, thereby obtaining 47.6 g of intermediate A-4.

The obtained compound was analyzed by NMR, and the structure thereof was identified by the following results.

$^1$H-NMR (400 MHz, DMSO-d6): δ(ppm)=12.10 (1H, COOH), 8.81 (1H, NH), 6.15-6.29 (1H, C=CH), 5.96-6.12 (1H, C=CH), 4.28-4.67 (3H, CH), 3.18-3.51 (3H, CH), 2.95-3.12 (2H, CH), 2.55-2.70 (1H, CH), 1.76-2.10 (2H, CH), 1.20-1.41 (2H, CH)

[Chemical Formula 97]

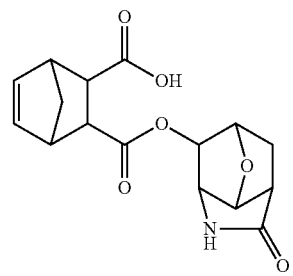

Intermediate A-4

Synthesis Example 8: Synthesis of Intermediate B-4

The same procedure as in Synthesis Example 2 was conducted, except that intermediate B-4 was used, thereby obtaining 12.6 g of intermediate B-4.

The obtained compound was analyzed by NMR, and the structure thereof was identified by the following results.

$^1$H-NMR (400 MHz, DMSO-d6): δ(ppm)=8.81 (1H, NH), 5.20-5.38 (1H, CH), 4.76 (1H, OH), 4.54-4.64 (1H, CH), 4.28-4.42 (1H, CH), 3.21-3.53 (4H, CH), 2.62-2.84 (1H, CH), 2.40-2.64 (1H, CH), 2.23-2.35 (1H, CH), 1.79-1.98 (4H, CH), 1.56-1.70 (1H, CH)

[Chemical Formula 98]

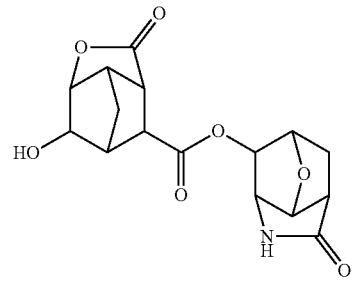

Intermediate B-4

Synthesis Example 9: Synthesis of Compound L-3

The same procedure as in Synthesis Example 3 was conducted, except that intermediate B-3 was used, thereby obtaining 12 g of compound L-3.

The obtained compound was analyzed by NMR, and the structure thereof was identified by the following results.

1H-NMR (400 MHz, DMSO-d6): δ(ppm)=7.30 (1H, NH), 6.01-6.11 (1H, C=CH), 5.56-5.78 (1H, C=CH), 5.38-5.50 (1H, CH), 5.14-5.28 (1H, CH), 4.41-4.53 (1H, CH), 3.25-3.59 (4H, CH), 3.11-3.24 (1H, CH), 2.80-2.92 (1H, CH), 2.60-2.74 (1H, CH), 2.34-2.47 (1H, CH), 1.56-2.17 (9H, CH)

[Chemical Formula 99]

Compound L-3

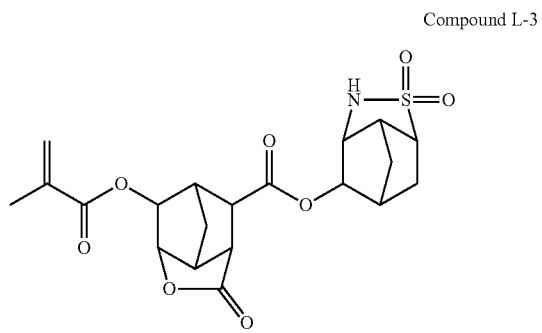

Synthesis Example 10: Synthesis of Compound L-4

The same procedure as in Synthesis Example 3 was conducted, except that intermediate B-4 was used, thereby obtaining 12 g of compound L-4.

The obtained compound was analyzed by NMR, and the structure thereof was identified by the following results.

$^1$H-NMR (400 MHz, DMSO-d6): δ(ppm)=8.81 (1H, NH), 6.01-6.11 (1H, C=CH), 5.56-5.78 (1H, C=CH), 5.38-5.50 (1H, CH), 5.14-5.28 (1H, CH), 4.28-4.42 (1H, CH), 4.54-4.64 (1H, CH), 3.18-3.53 (4H, CH), 2.80-2.92 (1H, CH), 2.60-2.74 (1H, CH), 2.23-2.35 (1H, CH), 1.79-1.98 (6H, CH), 1.56-1.70 (1H, CH)

[Chemical Formula 100]

Compound L-4

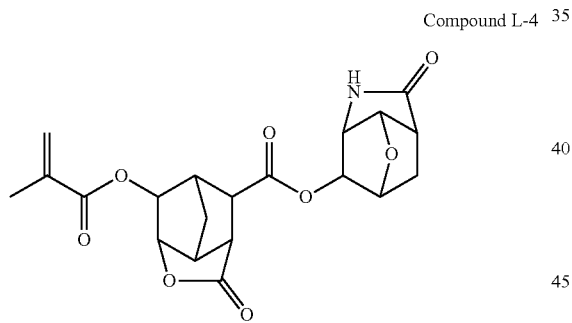

Synthesis Example 11: Synthesis of Polymer 1

To a flask equipped with a thermometer, a reflux tube, a stirrer and an N$_2$ feeding pipe was added 7.35 g of gamma-butyrolactone (GBL) in a nitrogen atmosphere, followed by elevating the internal temperature to 85° C. while stirring.

7.00 g (16.8 mmol) of monomer L-1 and 4.02 g (20.5 mmol) of monomer P-1 were dissolved in 25.72 g of gamma-butyrolactone (GBL). Then, 0.52 g of a polymerization initiator V-601 was added and dissolved.

The resulting mixed solution was dropwise added to the flask at a constant rate over 4 hours, followed by heating for 1 hour while stirring. Then, the reaction mixture was cooled to room temperature.

The obtained reaction polymer solution was dropwise added to an excess amount of methanol/water mixed solution to deposit a polymer. Thereafter, the precipitated white powder was separated by filtration, followed by washing with methanol/water mixed solution and drying under reduced pressure, thereby obtaining 7.7 g of polymer 1 as an objective compound.

With respect to the obtained polymeric compound, the weight average molecular weight (Mw) and the dispersity (Mw/Mn) were determined by the polystyrene equivalent value as measured by gel permeation chromatography (GPC). As a result, it was found that the weight average molecular weight was 7,700, and the dispersity was 1.76.

The composition of the copolymer (ratio (molar ratio) of the respective structural units within the structural formula) as determined by $^{13}$C-NMR was L-1/P-1=46/54.

[Chemical Formula 101]

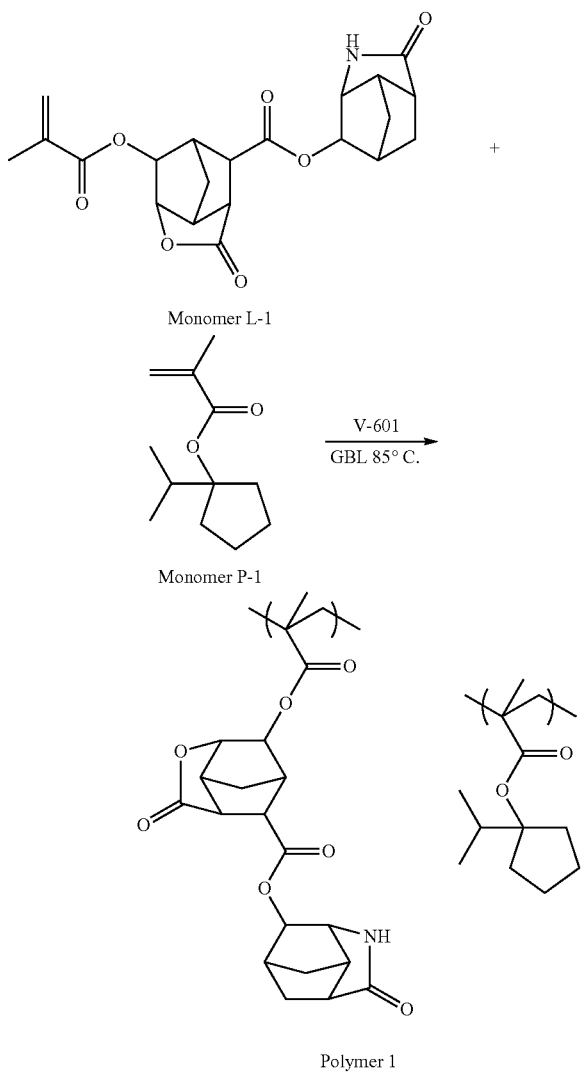

Synthesis Examples 12 to 20: Synthesis of Polymers 2 to 10, F1 and F2

The same procedure as in Synthesis Example 11 was conducted, except that the kind of monomer and the amount of monomer were changed, thereby obtaining polymers 2 to 20. With respect to each of the obtained polymeric compounds, Mw, PDI and compositional ratio (ratio (molar ratio) of the respective structural units within the structural formula) were measured in the same manner as described above.

The structural formulae of the monomers used for synthesizing polymers 2 to 20, F1 and F2, and the measurement results of Mw, PDI and compositional ratio are shown below. With respect to Mw, "K" means ×10³. For example, 7.5K means that Mw is 7,500.

[Chemical Formula 102]

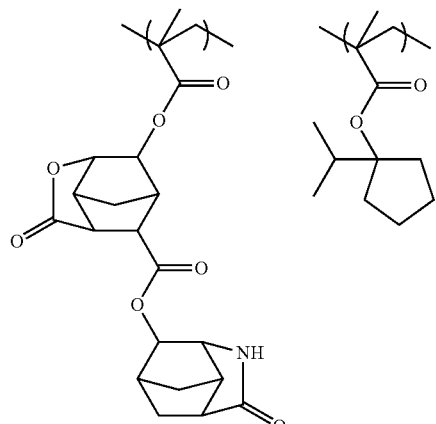

Polymer 1
46/54
Mw=7.7K, PDI=1.76

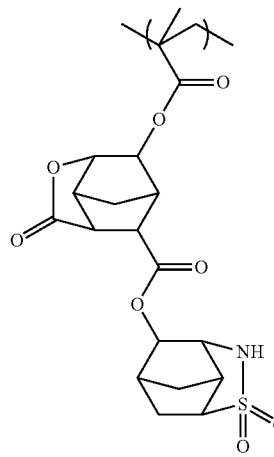

Polymer 2
49/51
Mw=6.7K, PDI=1.71

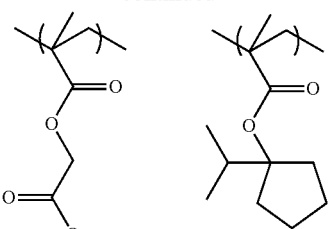

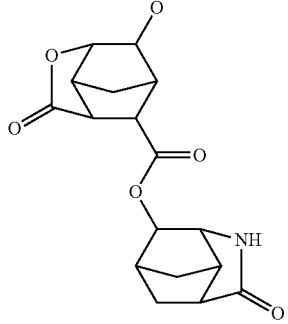

Polymer 3
53/47
Mw=7.8K, PDI=1.65

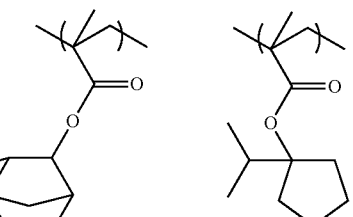

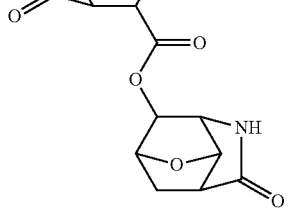

Polymer 4
50/50
Mw=7.1K, PDI=1.70

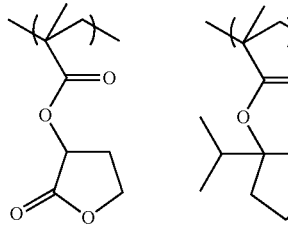

Polymer 5
48/52
Mw=7.2K, PDI=1.59

-continued
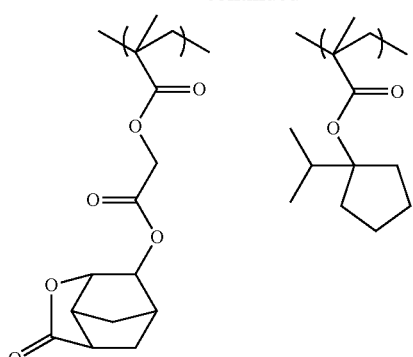
Polymer 6
47/53
Mw=7.0K, PDI=1.68
[Chemical Formula 103]
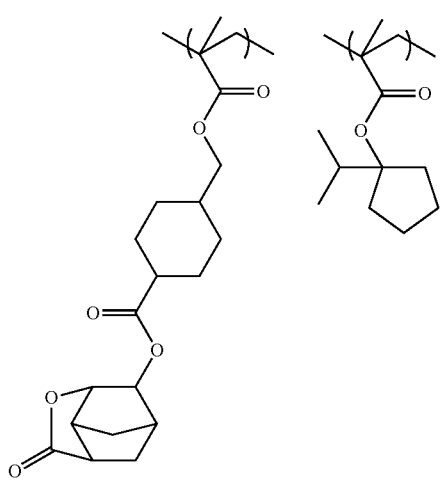
Polymer 7
49/51
Mw=7.1K, PDI=1.75
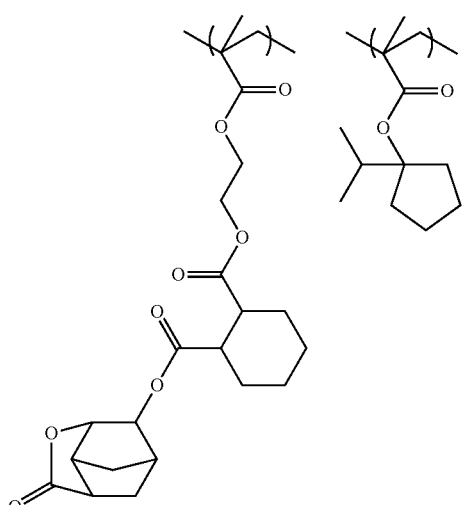
Polymer 8
52/48
Mw=7.5K, PDI=1.77
-continued
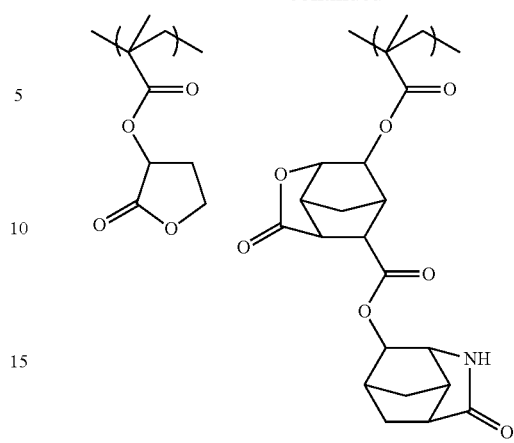
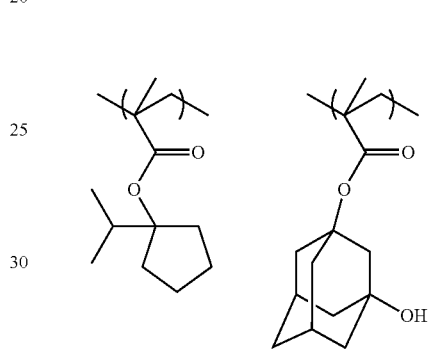
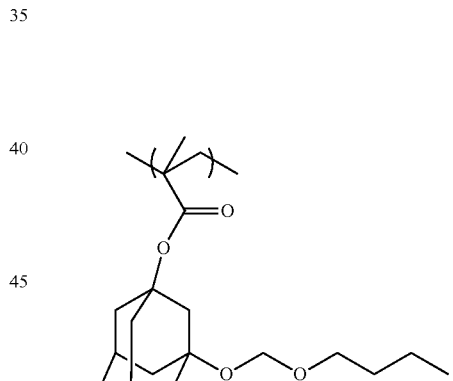
Polymer 9
15/23/43/10/9
Mw=7.5K, PDI=1.67
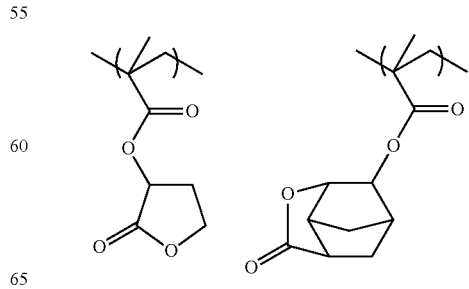

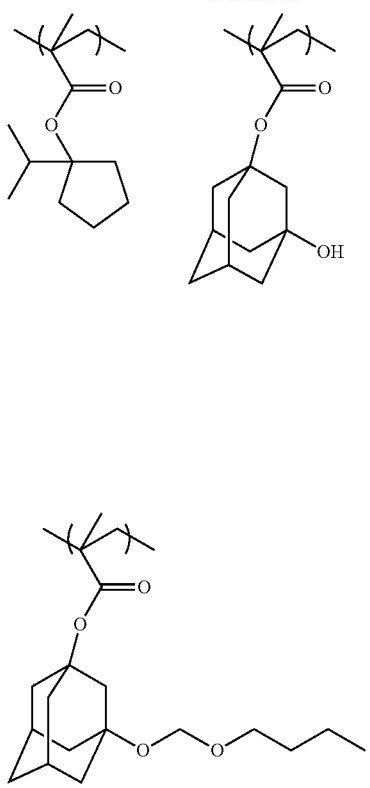

Polymer 10
16/21/41/12/10
Mw=7.6K, PDI=1.68

[Chemical Formula 104]

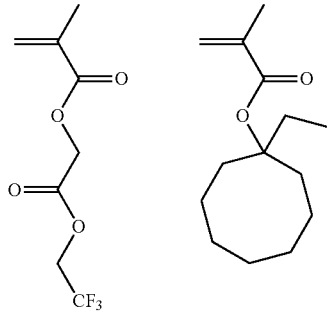

Additive F-1
77/23
Mw=23.1K, PDI=1.78

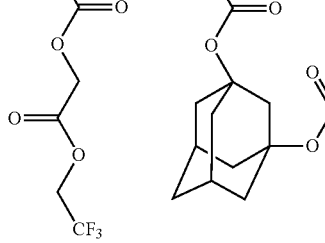

Additive F-2
52/48
Mw=17.5K, PDI=1.61

Comparative Example 1, Examples 1 to 4

The components shown in Table 1 were mixed together and dissolved to obtain resist compositions.

TABLE 1

| Sample | Component (A) | Component (B) | Component (D) | Component (F) | Additive | Solvent |
|---|---|---|---|---|---|---|
| Comp. Ex. 1 | (A)-5 [100] | (B)-1 [10] | (D)-1 [4.2] | (F)-1 [3.3] | GBL [10] | PH |
| Ex. 1 | (A)-1 [100] | (B)-1 [10] | (D)-1 [4.2] | (F)-1 [3.3] | GBL [10] | PH |
| Ex. 2 | (A)-2 [100] | (B)-1 [10] | (D)-1 [4.2] | (F)-1 [3.3] | GBL [10] | PH |
| Ex. 3 | (A)-3 [100] | (B)-1 [10] | (D)-1 [4.2] | (F)-1 [3.3] | GBL [10] | PH |
| Ex. 4 | (A)-4 [100] | (B)-1 [10] | (D)-1 [4.2] | (F)-1 [3.3] | GBL [10] | PH |

In Table 1, the values in brackets [ ] indicate the amount (in terms of parts by weight) of the component added.

Further, the reference characters indicate the following.

(A)-1 to (A)-5: the aforementioned polymers 1 to 5

(B)-1: a compound represented by structural formula (B)-1 shown below (D)-1: a compound represented by structural formula (D)-1 shown below (F)-1: additive F-1 shown below (S)-1: gamma-butyrolactone PH: a mixed solvent of PGMEA/PGME/cyclohexanone = 45/30/25 (weight ratio)

[Chemical Formula 105]

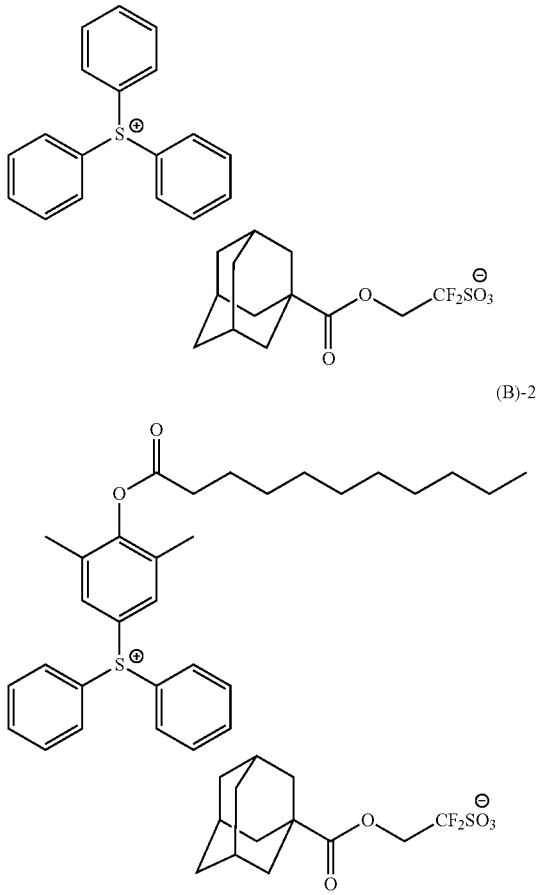

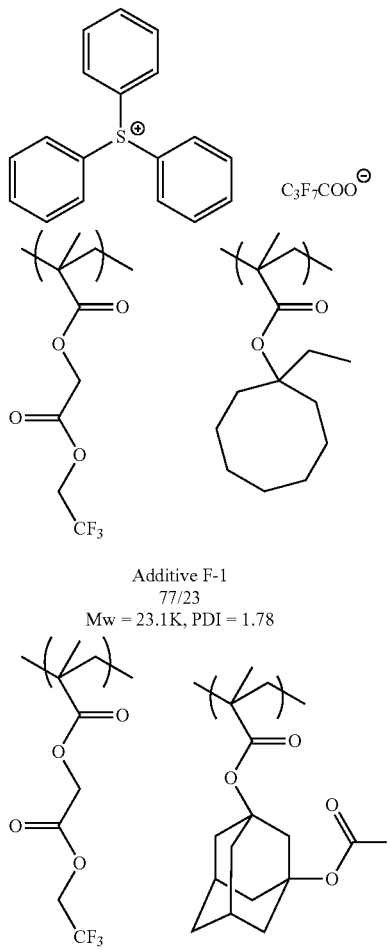

Additive F-1
77/23
Mw = 23.1K, PDI = 1.78

Additive F-2
52/48
Mw = 17.5K, PDI = 1.61

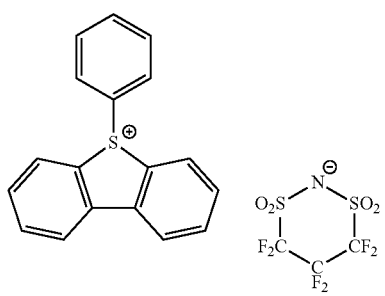

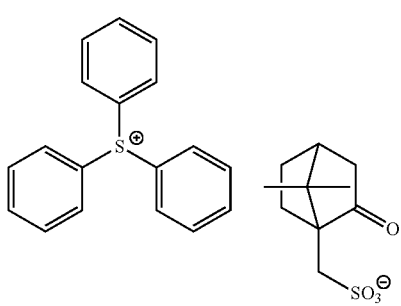

Using the obtained resist compositions, the following evaluations were conducted.

[Formation of Resist Pattern]

An organic anti-reflection film composition (product name: ARC29, manufactured by Brewer Science Ltd.) was applied to a 12-inch silicon wafer using a spinner, and the composition was then baked on a hot plate at 205° C. for 60 seconds, thereby forming an organic anti-reflection film having a film thickness of 89 nm.

Then, each of the resist compositions obtained above was applied to the anti-reflection film using a spinner, and was then prebaked (PAB) on a hotplate at a temperature indicated in Table 2 for 60 seconds and dried, thereby forming a resist film having a film thickness of 80 nm.

Subsequently, the resist film was selectively irradiated with an ArF excimer laser (193 nm) through a photomask (6% half tone), using an immersion lithography ArF exposure apparatus NSR-5609B (manufactured by Nikon Corporation; NA (numerical aperture)=1.07; Dipole 0.97/0.78 w/ Polano; immersion medium: water). Then, a PEB treatment was conducted at a temperature indicated in Table 2 for 60 seconds.

Thereafter, an alkali development was conducted for 10 seconds at 23° C. in a 2.38 wt % aqueous TMAH solution (product name: NMD-3; manufactured by Tokyo Ohka Kogyo Co., Ltd.), followed by water rinsing for 30 seconds using pure water, and drying by shaking.

As a result, in each of the examples, a line and space pattern (LS pattern) having a line width of 50 nm and a pitch of 100 nm was formed.

[Evaluation of Exposure Latitude (EL)]

The exposure dose with which an LS pattern having a dimension of the target dimension ±5% (i.e., 47.5 nm to 52.5 nm) was determined, and EL (unit: %) was determined by the following formula. The results are indicated "5% EL" in Table 2. The larger the value of the "EL", the smaller the change in the pattern size by the variation of the exposure dose.

$$EL\ (\%) = (|E1-E2|/Eop) \times 100$$

In the formula, E1 represents the exposure dose (mJ/cm$^2$) for forming an LS pattern having a line width of 47.5 nm; E2 represents the exposure dose (mJ/cm$^2$) for forming an LS pattern having a line width of 52.5 nm; and Eop represents the optimum exposure dose with which an LS pattern having a line width of 50 nm and a pitch of 100 nm is formed. Eop was determined by a conventional method.

[Evaluation of Line Width Roughness (LWR)]

With respect to each of the above LS patterns, the line width at 400 points in the lengthwise direction of the line were measured using a measuring scanning electron microscope (SEM) (product name: S-9380, manufactured by Hitachi High-Technologies Corporation; acceleration voltage: 300V). From the results, the value of 3 times the standard deviation s (i.e., 3s) was determined, and the average of the 3s values at 400 points was calculated as a yardstick of LWR. The results are shown in Table 2. The smaller this 3s value is, the lower the level of roughness of the line width, indicating that a LS pattern with a uniform width was obtained.

[Evaluation of Mask Error Factor (MEEF)]

In accordance with the same procedure as in the formation of the LS pattern, an LS pattern having a pitch of 100 nm was formed with the same exposure dose and using a mask pattern in which the target size of the line pattern was 45 to 54 nm (10 target sizes at intervals of 1 nm). The value of the mask error factor was determined as the gradient of a graph obtained by plotting the target size (nm) on the horizontal axis, and the actual size (nm) of the line pattern formed on the resist film using each mask pattern on the vertical axis. The results are shown in Table 2. A MEEF value (gradient of the plotted line) closer to 1 indicates that a resist pattern faithful to the mask pattern was formed.

TABLE 2

| Sample | PAB/PEB | 5% EL | LWR (nm) | MEEF |
| --- | --- | --- | --- | --- |
| Comp. Ex. 1 | 100/85 | 6.9% | 6.00 | 3.18 |
| Ex. 1 | 100/90 | 7.7% | 5.35 | 2.47 |
| Ex. 2 | 100/90 | 8.0% | 5.44 | 2.31 |
| Ex. 3 | 100/90 | 8.2% | 5.18 | 2.26 |
| Ex. 4 | 100/90 | 7.5% | 5.50 | 2.38 |

As seen from the results, the resist compositions of Examples 1 to 4 exhibited improved 5% EL, LWR and MEEF, as compared to Comparative Example 1.

Comparative Examples 2 to 6, Examples 5 to 9

The components shown in Table 3 were mixed together and dissolved to obtain resist compositions.

TABLE 3

| Sample | Component (A) | Component (B-1) | Component (B-2) | Component (D) | Component (F) | Additive | Solvent |
| --- | --- | --- | --- | --- | --- | --- | --- |
| Comparative Example 2 | (A)-5 [100] | (B)-2 [6] | (B)-3 [1] | (D)-2 [3.5] | (F)-2 [4.0] | GBL [100] | SP |
| Comparative Example 3 | (A)-6 [100] | (B)-2 [6] | (B)-3 [1] | (D)-2 [3.5] | (F)-2 [4.0] | GBL [100] | SP |
| Comparative Example 4 | (A)-7 [100] | (B)-2 [6] | (B)-3 [1] | (D)-2 [3.5] | (F)-2 [4.0] | GBL [100] | SP |
| Comparative Example 5 | (A)-8 [100] | (B)-2 [6] | (B)-3 [1] | (D)-2 [3.5] | (F)-2 [4.0] | GBL [100] | SP |
| Example 5 | (A)-1 [100] | (B)-2 [6] | (B)-3 [1] | (D)-2 [3.5] | (F)-2 [4.0] | GBL [100] | SP |
| Example 6 | (A)-2 [100] | (B)-2 [6] | (B)-3 [1] | (D)-2 [3.5] | (F)-2 [4.0] | GBL [100] | SP |
| Example 7 | (A)-3 [100] | (B)-2 [6] | (B)-3 [1] | (D)-2 [3.5] | (F)-2 [4.0] | GBL [100] | SP |
| Example 8 | (A)-4 [100] | (B)-2 [6] | (B)-3 [1] | (D)-2 [3.5] | (F)-2 [4.0] | GBL [100] | SP |
| Comparative Example 6 | (A)-10 [100] | (B)-1 [10] | — | (D)-2 [3.5] | (F)-2 [4.0] | GBL [100] | SP |
| Example 9 | (A)-9 [100] | (B)-1 [10] | — | (D)-2 [3.5] | (F)-2 [4.0] | GBL [100] | SP |

In Table 3, the values in brackets [ ] indicate the amount (in terms of parts by weight) of the component added.
Further, the reference characters indicate the following.
(A)-1 to (A)-10: Polymers 1 to 10
(B)-1: a compound represented by the aforementioned formula (B)-1
(B)-2 and (B)-3: compounds represented by the aforementioned formula (B)-2 and (B)-3
(D)-1: a compound represented by the aforementioned formula (D)-1
(D)-2: a compound represented by the aforementioned formula (D)-2
(F)-2: Polymer F-2
(S)-1: gamma-butyrolactone
SP: a mixed solvent of PGMEA/cyclohexanone = 90/10 (weight ratio)

Using the obtained resist compositions, the following evaluations and measurements were conducted.

[Formation of Resist Pattern]

An organic anti-reflection film composition (product name: ARC29, manufactured by Brewer Science Ltd.) was applied to a 12-inch silicon wafer using a spinner, and the composition was then baked on a hot plate at 205° C. for 60 seconds, thereby forming an organic anti-reflection film having a film thickness of 89 nm.

Then, each of the resist compositions obtained above was applied to the anti-reflection film using a spinner, and was then prebaked (PAB) on a hotplate at a temperature indicated in Table 4 for 60 seconds and dried, thereby forming a resist film having a film thickness of 100 nm.

Subsequently, the resist film was selectively irradiated with an ArF excimer laser (193 nm) through a photomask (6% half tone), using an immersion lithography ArF exposure apparatus NSR-5609B (manufactured by Nikon Corporation; NA (numerical aperture)=1.07; Annular 0.97/0.78 w/ Polano; immersion medium: water). Then, a PEB treatment was conducted at a temperature indicated in Table 4 for 60 seconds.

Next, a solvent development was conducted at 23° C. for 13 seconds using methyl amyl ketone (MAK), followed by drying by shaking.

As a result, in each of the examples, a contact hole pattern in which holes having a diameter of 55 nm were equally spaced (pitch: 110 nm) was formed (hereafter, this contact hole pattern is referred to as "CH pattern").

[Evaluation of EL]

The exposure dose with which a CH pattern having a dimension of the target dimension ±5% (i.e., 53 nm to 58 nm) was determined, and EL (unit: %) was determined by the following formula. The results are indicated "5% EL" in Table 4.

$$EL\ (\%) = (|E1-E2|/Eop) \times 100$$

In the formula, E1 represents the exposure dose (mJ/cm$^2$) for forming a CH pattern having a hole diameter of 53 nm; E2 represents the exposure dose (mJ/cm$^2$) for forming a CH pattern having a hole diameter of 58 nm; and Eop represents the optimum exposure dose with which a CH pattern having a hole diameter of 55 nm is formed. Eop was determined by a conventional method.

[Evaluation of Circularity]

With respect to each CH pattern obtained above, 25 holes in the CH pattern were observed from the upper side thereof using a measuring scanning electron microscope (SEM) (product name: S-9380, manufactured by Hitachi High-Technologies Corporation; acceleration voltage: 300V), and the distance from the center of each hole to the outer periphery of the hole was measured in 24 directions. From the results, the value of 3 times the standard deviation σ (i.e., 3σ) was determined. The results are shown in Table 4. The smaller this 3σ value is, the higher the level of circularity of the holes.

[Evaluation of In-Plane Uniformity (CDU) of Pattern Size]

With respect to each CH pattern obtained above, 100 holes in the CH pattern were observed from the upper side thereof using a measuring scanning electron microscope (SEM) (product name: S-9380, manufactured by Hitachi High-Technologies Corporation; acceleration voltage: 300V), and the hole diameter (nm) of each hole was measured. From the results, the value of 3 times the standard deviation σ (i.e., 3σ) was determined. The results are indicated "CDU" in Table 4. The smaller the thus determined 3σ value is, the higher the level of the dimension uniformity (CD uniformity) of the plurality of holes formed in the resist film.

[Measurement of Film Retention Ratio]

From the film thickness (film thickness of exposed portion after solvent development) of the CH pattern formed in the above <Formation of resist pattern> using each resist composition, the film retention ratio (unit: %) was determined by the following formula.

The results are shown in Table 4.

$$\text{Film retention ratio } (\%) = (FT2/FT1) \times 100$$

In the above formula, FT1 represents the film thickness of the resist film prior to exposure (nm), and FT2 represents the film thickness of the CH pattern (nm).

The film thickness was measured by Nanospec 6100A (manufactured by Nanometrics).

TABLE 4

| Sample | PAB/PEB | 5% EL | Circularity | CDU | Film retention ratio (%) |
|---|---|---|---|---|---|
| Comparative Example 2 | 100/85 | 3.5% | 3.20 | 10.50 | 58 |
| Comparative Example 3 | 100/90 | 4.6% | 3.05 | 9.90 | 64 |
| Comparative Example 4 | 100/90 | 4.1% | 3.15 | 9.74 | 63 |
| Comparative Example 5 | 100/90 | 4.5% | 3.45 | 10.73 | 64 |
| Example 5 | 100/90 | 6.0% | 2.48 | 8.33 | 75 |
| Example 6 | 100/90 | 5.8% | 2.61 | 8.56 | 75 |
| Example 7 | 100/90 | 6.2% | 2.23 | 8.76 | 78 |
| Example 8 | 100/90 | 5.4% | 2.58 | 8.31 | 76 |
| Comparative Example 6 | 120/85 | 4.7% | 3.01 | 10.07 | 63 |
| Example 9 | 120/85 | 5.8% | 2.69 | 9.20 | 70 |

As seen from the results, the resist compositions of Examples 5 to 9 exhibited various improved lithography properties such as 5% EL, circularity and CDU, as compared to Comparative Examples 2 to 6. Further, the film retention ratio was high at exposed portions, and film shrinkage was suppressed.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A resist composition which generates acid upon exposure and exhibits changed solubility in a developing solution under action of acid, wherein
the resist composition comprises a base component (A) which exhibits changed solubility in a developing solution under action of acid, and an acid generator component (B),
and the base component (A) comprises a polymeric compound (A1) comprising a structural unit (a0) represented by general formula (a0-1-1) shown below and a structural unit (a1) containing an acid decomposable group that exhibits increased polarity by the action of acid, wherein the amount of the polymeric compound (A1) based on the total weight of the component (A) is 50% by weight or more:

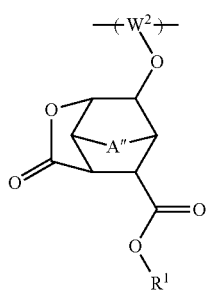

(a0-1-1)

wherein A" represents an oxygen atom, a sulfur atom or an alkylene group of 1 to 5 carbon atoms with or without an oxygen atom or a sulfur atom; $R^1$ represents a lactam-containing cyclic group or a sultam-containing cyclic group selected from the group consisting of a group represented by general formulae (a0-r0-1) to (a0-r0-4); and $W^2$ represents a group which is formed by a polymerization reaction of a group containing a polymerizable group:

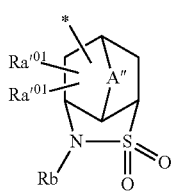

(a0-r0-1)

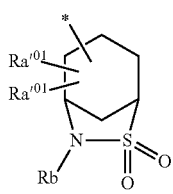

(a0-r0-2)

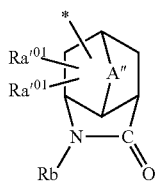

(a0-r0-3)

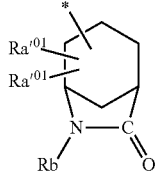

(a0-r0-4)

wherein each $Ra'^{01}$ independently represents a hydrogen atom, an alkyl group, an alkoxy group, a halogen atom, a halogenated alkyl group, —COOR", —OC(=O)R", a hydroxyalkyl group or a cyano group; R" represents a hydrogen atom or an alkyl group; A" represents an oxygen atom, a sulfur atom, or an alkylene group of 1 to 5 carbon atoms with or without an oxygen atom or a sulfur atom; Rb represents a hydrogen atom or a hydrocarbon group; and * represents a valence bond.

2. A method of forming a resist pattern, comprising:
forming a resist film using the resist composition of claim 1;
exposing the resist film; and
developing the resist film to form a resist pattern.

3. A polymeric compound comprising a structural unit (a0) represented by general formula (a0-1-1) shown below and a structural unit (a1) containing an acid decomposable group that exhibits increased polarity by the action of acid:

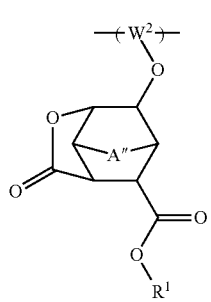

(a0-1-1)

wherein A" represents an oxygen atom, a sulfur atom or an alkylene group of 1 to 5 carbon atoms with or without an oxygen atom or a sulfur atom; $R^1$ represents a sultam-containing cyclic group selected from the group consisting of a group represented by general formulae (a0-r0-1) or (a0-r0-2); and $W^2$ represents a group which is formed by a polymerization reaction of a group containing a polymerizable group:

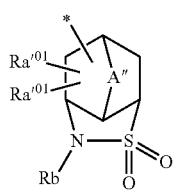

(a0-r0-1)

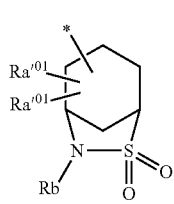

(a0-r0-2)

wherein each $Ra'^{01}$ independently represents a hydrogen atom, an alkyl group, an alkoxy group, a halogen atom, a halogenated alkyl group, —COOR", —OC(=O)R", a hydroxyalkyl group or a cyano group; R" represents a hydrogen atom or an alkyl group; A" represents an oxygen atom, a sulfur atom, or an alkylene group of 1 to 5 carbon atoms with or without an oxygen atom or a sulfur atom; Rb represents a hydrogen atom or a hydrocarbon group; and * represents a valence bond.

4. A compound represented by general formula (I) shown below:

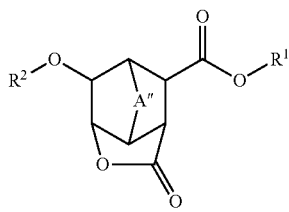

(I)

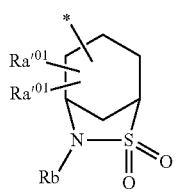

(a0-r0-2)

wherein A″ represents an oxygen atom, a sulfur atom or an alkylene group of 1 to 5 carbon atoms with or without an oxygen atom or a sulfur atom; $R^1$ represents a sultam-containing cyclic group selected from the group consisting of a group represented by general formulae (a0-r0-1) or (a0-r0-2); and $R^2$ represents a polymerizable group-containing group:

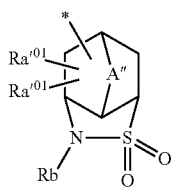

(a0-r0-1)

wherein each $Ra'^{01}$ independently represents a hydrogen atom, an alkyl group, an alkoxy group, a halogen atom, a halogenated alkyl group, —COOR″, —OC(=O)R″, a hydroxyalkyl group or a cyano group; R″ represents a hydrogen atom or an alkyl group; A″ represents an oxygen atom, a sulfur atom, or an alkylene group of 1 to 5 carbon atoms with or without an oxygen atom or a sulfur atom; Rb represents a hydrogen atom or a hydrocarbon group; and * represents a valence bond.

* * * * *